US011420531B2

(12) United States Patent
Väin et al.

(10) Patent No.: US 11,420,531 B2
(45) Date of Patent: Aug. 23, 2022

(54) DEVICE, METHOD AND SYSTEM FOR SWAPPING AND/OR CHARGING A BATTERY OF A MOBILE ROBOT

(71) Applicant: STARSHIP TECHNOLOGIES OÜ, Tallinn (EE)

(72) Inventors: Lauri Väin, Tallinn (EE); Viljar Valdek, Tallinn (EE); Märt Liivik, Tallinn (EE); Henri Lend, Tallinn (EE); Sergii Kharagorgiiev, Tallinn (EE); Markus Järve, Tallinn (EE); Henrik Herranen, Tallinn (EE); Ahti Heinla, Tallinn (EE); Veigo Evard, Tallinn (EE); Tommy Biene, Tallinn (EE)

(73) Assignee: STARSHIP TECHNOLOGIES OÜ, Tallinn (EE)

( * ) Notice: Subject to any disclaimer, the term of this patent is extended or adjusted under 35 U.S.C. 154(b) by 191 days.

(21) Appl. No.: 16/689,991

(22) Filed: Nov. 20, 2019

(65) Prior Publication Data

US 2020/0091744 A1   Mar. 19, 2020

Related U.S. Application Data

(63) Continuation of application No. PCT/EP2018/063606, filed on May 24, 2018.

(30) Foreign Application Priority Data

May 26, 2017   (EP) .................................... 17173098

(51) Int. Cl.
*B60L 53/80*   (2019.01)
*G01R 31/364*   (2019.01)
(Continued)

(52) U.S. Cl.
CPC ............ *B60L 53/80* (2019.02); *G05D 1/0225* (2013.01); *H02J 7/0044* (2013.01); *G01R 31/364* (2019.01)

(58) Field of Classification Search
CPC ......... H02J 7/0045; H02J 7/0042; B25J 19/00
See application file for complete search history.

(56) References Cited

U.S. PATENT DOCUMENTS 4,549,841 A   10/1985   Ishige
5,545,967 A   8/1996   Osborne et al.
(Continued)

FOREIGN PATENT DOCUMENTS

DE   10 2016 007 467   6/2016
DE   10 2015 209 127   11/2016
(Continued)

OTHER PUBLICATIONS

Coxworth, Ben, "HorseFly delivery drone would use a van as its base-on-the-go", Jun. 6, 2014.
(Continued)

*Primary Examiner* — Richard V Muralidar
(74) *Attorney, Agent, or Firm* — Siritzky Law, PLLC

(57)   ABSTRACT

A battery station, for use by at least one mobile robot, includes a battery charging unit configured to perform at least one of: holding at least one battery, and charging at least one battery. A battery load/unload position is configured to facilitate loading and unloading of a battery to and from a mobile robot. A battery handling mechanism is configured to operate on a reaching range, comprising at least one of the following: (i) the battery of the mobile robot positioned in the battery load/unload position, and (ii) the battery charging unit. A localization element is configured to at least one of detect and locate at least one of: at least one battery of the mobile robot, wherein the mobile robot is (Continued)

positioned in the battery load/unload position, and/or at least one battery positioned in the battery charging unit.

26 Claims, 12 Drawing Sheets

(51) Int. Cl.
*G05D 1/02* (2020.01)
*H02J 7/00* (2006.01)

(56) References Cited

U.S. PATENT DOCUMENTS

| | | |
|---|---|---|
| 5,664,928 A | 9/1997 | Stauber |
| 5,942,869 A | 8/1999 | Katou et al. |
| 5,998,963 A | 12/1999 | Aarseth |
| 6,307,484 B1 | 10/2001 | Sasaki et al. |
| 6,467,293 B1 | 10/2002 | Goosman |
| 6,602,037 B2 | 8/2003 | Winkler |
| 7,073,634 B2 | 7/2006 | Mitchell et al. |
| 7,202,776 B2 | 4/2007 | Breed |
| 7,320,289 B1 | 1/2008 | Clarke |
| 7,894,939 B2 | 2/2011 | Zini et al. |
| 7,931,431 B2 | 4/2011 | Benedict et al. |
| 8,010,230 B2 | 8/2011 | Zini |
| 8,104,601 B2 | 1/2012 | Hayduchok |
| 8,204,624 B2 | 6/2012 | Zini |
| 8,267,307 B1 | 9/2012 | Leon et al. |
| 8,485,285 B2 | 7/2013 | Ferrigni |
| 8,874,360 B2 | 10/2014 | Klinger |
| 8,948,914 B2 | 2/2015 | Aldo et al. |
| 9,020,632 B2 | 4/2015 | Naylor |
| 9,031,692 B2 | 5/2015 | Dinju |
| 9,073,637 B2 | 7/2015 | Ohtomo et al. |
| 9,244,147 B1 | 1/2016 | Soundararajan et al. |
| 9,256,852 B1 | 2/2016 | Myllymaki |
| 9,266,675 B2 | 2/2016 | Yamashita |
| 9,305,280 B1 | 4/2016 | Berg et al. |
| 9,373,149 B2 | 6/2016 | Abhyanker |
| 9,557,740 B2 | 1/2017 | Crawley |
| 9,561,941 B1 | 2/2017 | Watts |
| 9,694,976 B1 | 7/2017 | Wurman et al. |
| 9,844,879 B1 | 10/2017 | Cousins et al. |
| 10,300,804 B2 * | 5/2019 | Salasoo ............... B60L 53/80 |
| 2003/0165373 A1 | 9/2003 | Felder et al. |
| 2004/0211834 A1 | 10/2004 | Fleckenstein |
| 2005/0207876 A1 | 9/2005 | Springwater |
| 2006/0214634 A1 | 9/2006 | Baba |
| 2006/0237239 A1 | 10/2006 | Bruner et al. |
| 2007/0113921 A1 | 5/2007 | Capizzo |
| 2008/0040031 A1 | 2/2008 | Tu |
| 2011/0079166 A1 | 4/2011 | Popa-Simil |
| 2012/0090110 A1 | 4/2012 | Van Den Berg et al. |
| 2013/0030697 A1 | 1/2013 | Bartels |
| 2013/0110281 A1 | 5/2013 | Jones et al. |
| 2013/0332021 A1 | 10/2013 | Goren |
| 2014/0032034 A1 | 1/2014 | Raptopoulos |
| 2014/0081445 A1 | 3/2014 | Villamar |
| 2014/0136414 A1 | 5/2014 | Abhyanker |
| 2014/0207701 A1 | 7/2014 | Kadaba |
| 2014/0254896 A1 | 9/2014 | Zhou et al. |
| 2014/0365258 A1 | 12/2014 | Vestal et al. |
| 2015/0006005 A1 | 1/2015 | Yu et al. |
| 2015/0045945 A1 | 2/2015 | Zini et al. |
| 2015/0100152 A1 | 4/2015 | Trevino et al. |
| 2015/0110344 A1 | 4/2015 | Okumura |
| 2015/0183528 A1 | 7/2015 | Walsh |
| 2015/0183581 A1 | 7/2015 | Worsley |
| 2015/0379468 A1 | 10/2015 | Harvey |
| 2016/0107750 A1 | 4/2016 | Yates |
| 2016/0144734 A1 | 5/2016 | Wang et al. |
| 2016/0185466 A1 | 6/2016 | Dreano |
| 2016/0200438 A1 | 7/2016 | Bokeno et al. |
| 2016/0207710 A1 | 7/2016 | Conrad et al. |
| 2016/0325928 A1 | 11/2016 | Lepek |
| 2016/0355337 A1 | 12/2016 | Lert et al. |
| 2016/0368464 A1 | 12/2016 | Hassounah |
| 2017/0017237 A1 | 1/2017 | Tokuyama et al. |
| 2017/0050747 A1 | 2/2017 | Wessler |
| 2017/0096075 A1 | 4/2017 | Henry et al. |
| 2017/0100837 A1 | 4/2017 | Zevenbergen et al. |
| 2017/0124512 A1 | 5/2017 | Harvey |
| 2017/0185853 A1 | 6/2017 | Yokota et al. |
| 2017/0220981 A1 | 8/2017 | Shucker et al. |
| 2017/0267452 A1 | 9/2017 | Goren et al. |
| 2018/0020896 A1 | 1/2018 | High et al. |
| 2018/0141453 A1 * | 5/2018 | High ............... G05D 1/0684 |
| 2018/0349834 A1 | 6/2018 | Heinla |

FOREIGN PATENT DOCUMENTS

| | | | |
|---|---|---|---|
| EP | 1 632 386 | * | 3/2006 |
| EP | 2 818 958 | | 12/2014 |
| WO | WO2002042117 | | 5/2002 |
| WO | WO 2011/035839 A2 | | 3/2011 |

OTHER PUBLICATIONS

Move over Amazon! Packages could one day be delivered by unicycle drones that swarm together to transport heavy parcels, dated Aug. 21, 2015, by Richard Gray [http://www.dailymail.co.uk/sciencetech/article-3205933/Move-Amazon-Packages-one-day-delivered-unicycle-drones-swarm-transport-heavy-parcels.html].

Bill McNeil, the Top Five Things You Need to Know about Drones and GIS, Geospatial Newsletters, Directions Magazine, Aug. 25, 2014.

Baker: "Automated Street Crossing for Assistive Robots," Proc. 2005 IEEE, Jun. 28-Jul. 1, 2005.

Jeniece Pettitt: "Forget delivery drones, meet your new delivery robot", Nov. 2, 2015, Retrieved from the Internet: URL: https://www.cnbc.com/2015/11/02/forget-delivery-drones-meet-your-new-delivery-robot.html.

Anonymous: "Lieferroboter Starship: "Klauen würde ich ihn nicht"—Auto—Tagesspiegel" ("I wouldn't steal him") Nov. 29, 2015, Retrieved from the Internet: URL: http://www.tagesspiegel.de/mobil/lieferroboter-starship-klauen-wuerde-ich-ihn-nicht/12647114.html, English translation.

WIPO, Nov. 26, 2019, (IB/373) International Preliminary Report on Patentability Chapter I, PCT/EP2018/063606 (10p.).

WIPO, Nov. 29, 2018, (ISA/210) International Search Report, PCT/EP2018/063606 (4p.).

WIPO, Nov. 29, 2018, (ISA/237) Written Opinion of the International Searching Authority, PCT/EP2018/063606 (9p.).

* cited by examiner

DEVICE, METHOD AND SYSTEM FOR SWAPPING AND/OR CHARGING A BATTERY OF A MOBILE ROBOT

RELATED APPLICATIONS

This application is a continuation of PCT/EP2018/063606, filed May 24, 2018 which claims priority from European application no. 17173098.9, filed May 26, 2017, the entire contents of both of which are hereby fully incorporated herein by reference for all purposes.

FIELD

The invention relates to the field of swapping and charging a battery of a mobile robot. More particularly, the present invention relates to a device, method and a system that swaps and charges a battery of a mobile robot.

INTRODUCTION

As technology improves mobile robots are becoming part of people's everyday life. More and more tasks are being automated and accomplished by mobile robots. Further the need for a safer environment is driving the automotive industry into increasing the production of electric vehicles. Thus, the number of mobile robots and electric vehicles is increasing more and more. In order to operate, usually, these mobile robots and electric vehicles require electric energy, in other words a battery. However, after a specific operation time the battery discharges. In most cases the operator of such mobile robots and electric vehicles will remove the battery himself and put it for charging in a power station. In another case, the operator may swap the discharged battery with an already charged battery. In such cases the operator has to lift the batteries himself. Usually such batteries are heavy and may cause damages to the physical health of the operator. Furthermore, if the operator does not have a charged battery he will have to wait until the battery charges which interrupts the operation of the mobile robot or electric vehicle.

U.S. Pat. No. 5,545,967 describes a system for automatic loading, unloading and charging of rechargeable batteries used in battery powered vehicles. The system comprises a storage rack for temporary storing batteries. It further comprises one battery recharging station. A battery transport apparatus swaps the discharged battery of the vehicle with a charged one. The system further comprises a water check station that checks the water level of the batteries.

U.S. Pat. No. 5,998,963 describes a service center for replacing and recharging an electric battery from electric vehicles. The system comprises a recharging unit for charging the batteries removed from an electric vehicle. An electric vehicle is driven into a bay where a removing-installation means removes the discharged battery from the vehicle. A transporting means transport the battery from the removal installation means to the recharging unit. The said transporting means can also transport a battery from a recharging unit to the removal-installation means. The removal-installation means can install the battery in the vehicle.

The present invention concerns a device wherein the elements required for battery swapping of a mobile robot are integrated in one device. Further a system and a method comprising detecting, locating, swapping and/or charging a battery of a mobile robot is described.

SUMMARY

In a first embodiment, the invention discloses a battery station, preferably for use by at least one mobile robot. The battery station comprises a battery charging unit configured to perform at least one of holding at least one battery and charging at least one battery. That is, the battery charging unit can be adapted to hold at least one battery by keeping the battery fixed to it. The battery charging unit can also be adapted to charge at least one battery. The battery charging unit can be advantageous, as it can allow the battery station to store at least one battery, preferably a plurality of batteries, such as 2 to 10 batteries. The battery charging unit can also be advantageous, as it can allow the battery station to charge at least one battery, preferably a plurality of batteries, such as 2 to 10 batteries. The charging unit can be particularly advantageous for the battery station and preferably for the mobile robot if it is holding at least one charged battery or has already charged at least one battery. Thus, the battery station can provide charged batteries preferably to the mobile robot without the need for the robot to wait for its batteries to charge.

The battery station can further comprise a battery load/unload position configured to facilitate loading and unloading of a battery to and from a mobile robot. That is, the battery load/unload position can be configured such that, when the mobile robot is positioned in the battery load/unload position, the at least one of the batteries of the mobile robot is aligned with the battery station, within a misalignment range of 0.1-2 cm, such as around 1 cm. The battery load/unload position can be advantageous, as it can simplify at least one of load and unload of the battery from the mobile robot by the battery station.

The battery station can further comprise a battery handling mechanism configured to operate on a reaching range, said reaching range comprising at least one of battery of the mobile robot positioned in the battery load/unload position and the battery charging unit. That is, the battery handling mechanism can operate on its reaching range. Such a reaching range can comprise the at least one of the batteries of the mobile robot, when the mobile robot is positioned in the battery load/unload position. The reaching range can also comprise the at least one of the battery charging units of the battery station. Such a reaching range can be advantageous as it can allow the battery handling mechanism, thus the battery station, to reach at least one of the batteries of the mobile robot positioned in the battery load unload position. The reaching range can also allow the battery handling mechanism to reach the battery charging units, thus the batteries that can be in the battery charging units.

The battery charging unit can further comprise a localization element configured to at least one of detect and locate at least one of the batteries of a mobile robot, wherein the mobile robot is positioned in the battery load/unload position and a battery positioned in a battery charging unit. The localization element can thus detect if the mobile robot comprising the battery is positioned in the battery load unload position. The localization element can also detect the presence of a battery of the mobile robot, when the mobile robot is positioned in the battery load/unload position. Further the localization element can detect if a battery is positioned in a battery charging unit. That is, the localization element can detect the presence of a battery in a battery charging unit. Thus, the localization element can be advantageous as it can allow the battery station to know when a mobile robot is positioned in the battery load/unload position. It can also be advantageous as it can allow the battery station to know when to initiate the operation on the battery of a mobile robot, or on a battery in the battery charging unit. The localization element can further locate the battery of the mobile robot, when the mobile robot is positioned in the battery load/unload position. That is, the localization element can find the position of the battery of the mobile robot by directly locating the battery attached in the mobile robot. The localization element can also locate the mobile robot and, based on the knowledge of the position of the battery in the mobile robot, the position of the battery can be derived. The localization element can also locate a battery positioned in at least one of the charging units of the battery station. That is, the localization element can find the position of a battery positioned in a battery charging unit by directly locating the battery. The localization element can also locate the battery charging unit and, based on the knowledge of the position of the battery in the charging unit, the position of the battery can be derived. By finding the position of the battery, the battery station can infer the misalignment of the battery with the battery station. Such misalignment can comprise the offsets and rotations from the ideal position of the battery relatively to the battery handling mechanism. Based on the level of misalignment, the battery station can decide if the operation on the battery by the battery handling mechanism is possible. In other words, past a certain threshold of misalignment, the battery station may not be able to change the battery without risk of dropping it or damaging any of the components, and in such a case, it may be advantageous to abort the battery changing operation. The localization element can be advantageous for the battery station, particularly if the battery handling mechanism can adjust its position relatively to the position of the battery, thus improving the alignment of the battery of the mobile robot with the battery station, particularly with the battery handling mechanism. The localization element can also be advantageous for the battery station, particularly for the battery handling mechanism, as it can improve the alignment of the battery positioned in the battery charging unit with the battery station, particularly with the battery handling mechanism.

In some embodiments, the battery station can be configured to facilitate the positioning of the mobile robot in the battery load/unload position. That is, the battery station can facilitate the alignment of the mobile robot, particularly of the at least one battery of the mobile robot, with the battery station, within a misalignment in the range of 0.1-2 cm, such as around 1 cm. Such a feature of the battery station can be advantageous, as it can improve the alignment of the mobile robot, particularly of the battery of the mobile robot, with the battery station, particularly with the battery handling mechanism. Thus, the misalignment range can be smaller than in the case when the battery station does not comprise such a feature.

In some embodiments, the battery station can further comprise at least one guiding element configured to facilitate the positioning of the mobile robot in the battery load/unload position. The guiding element is advantageous for the battery station and preferably for the mobile robot, as it can indicate to the mobile robot the battery load/unload position. In some embodiments, the guiding element can comprise at least one marker, preferably a plurality of optical markers. Such markers can be configured to increase the visibility of the guiding element, which can lead to the guiding element being easier to sense by the mobile robot. In some embodiments, the guiding element can be configured as a straight line. In some preferred embodiments, the guiding element can comprise a plurality of straight lines, such as 2 to 10 straight lines. Such straight lines can be configured to indicate the battery load/unload position. The straight lines can be advantageous as they can indicate to the mobile robot the path they have to make to approach the battery load/unload position when the mobile robot can sense them. The straight lines can comprise a pattern with a plurality of colors and lines or strips of different width.

In some embodiments, the straight lines can be configured as an identifier for the battery station or for a specific group of battery stations. That is, the battery station or a specific group of battery stations can comprise a specific width of any of the plurality of straight lines. The battery station, or a specific group of battery stations can also comprise a specific length of any of the plurality of straight lines. The battery station or a specific group of battery stations can also comprise a specific distance between any of the plurality of straight lines. The battery station or a specific group of battery stations can comprise a specific color of any of the plurality of straight lines. The battery station or a specific group of battery stations can also comprise a specific number of straight lines. Such a feature of the straight lines can be advantageous for the battery station and preferably for the mobile robot, as it can uniquely identify a battery station, or a specific group of battery station. Thus, the mobile robot can know which of the battery stations or which group of the battery station it is using. The straight lines configured as a battery station identifier can also be advantageous, as they avoid the need of implementing a separate identifier on the battery station by integrating it into the plurality of the straight lines.

In some embodiments, the localization element can comprise at least one inductive sensor, preferably a plurality of inductive sensors, such as 2 to 6 inductive sensors. The inductive sensors can be configured to at least one of detect and locate a battery with a possible error of at most 2 mm. The use of inductive sensors can be advantageous as the inductive sensing is less affected by foreign matter between the inductive sensors and the battery, such as water or dirt. This can be particularly advantageous as the mobile robot can operate on different environments and can be polluted by different foreign matter. Furthermore, the inductive sensors are easy to manufacture and energy efficient. They can also be relatively small and thin, allowing for optimization of used space.

In some embodiments, the localization element can comprise at least one capacitive sensor, preferably a plurality of capacitive sensors, such as 2 to 6 capacitive sensors. The capacitive sensors can be configured to at least one of detect and locate a battery. A combination of both inductive and capacitive sensors can also be used.

In some embodiments, the localization element can comprise at least one mechanical localization element configured to guide the movement of the battery handling mechanism toward the battery to be located. That is, the mechanical localization element can stop the battery handling mechanism in a position where it is aligned with the battery to be located. The mechanical localization element can also stop the battery handling mechanism when the battery is located.

In some embodiments, the localization element can be a combination of at least two of inductive sensors, capacitive sensors and mechanical localization elements. Such a combination can be advantageous, as the localization element can comprise the advantages of each of the implementation methods it comprises.

In some embodiments, the localization element can be configured to at least one of emit, receive and process electromagnetic waves. That is, the localization element can be configured to emit electromagnetic waves toward a target, said target preferably being the battery to be detected and located. Said target can also be the mobile robot positioned in the battery load/unload position, or part of the mobile robot surrounding the battery attached to the mobile robot. The target can also be the charging unit of the battery station, or part of the charging unit of the battery station surrounding the battery to be detected and located. The localization element can also be configured to receive electromagnetic waves, preferably electromagnetic waves comprising the reflection of the emitted electromagnetic waves by the target. The localization element can also be configured to process electromagnetic waves, preferably the said reflected electromagnetic waves, to detect and locate the target, said target preferably being the battery to be located. In such embodiments, the localization element can also be configured to emit electromagnetic waves, preferably oscillating electromagnetic waves, towards the said target and can detect changes in the emitted electromagnetic field caused by the presence of the said target. Such changes can be processed by a processing unit and the position of the target can be calculated. The processing can be done by the localization element comprising a processing unit. The processing can also be done by a separate processing unit of the battery station comprising the localization element.

In some embodiments, the localization element can be configured to distinguish between different materials. For example, the localization element can distinguish between materials that have different dielectric constants. The localization element can preferably distinguish between conductive and non-conductive materials, more preferably distinguish between the presence of the battery from the presence of another material within a sensing range of the localization element. The sensing range can comprise the range where the localization element can be configured to operate within a certain degree of sensitivity. This can be particularly advantageous in embodiments where the battery comprises non-conductive material and the surrounding objects comprise conductive materials or the battery comprises conductive material. In such embodiments, the material of the battery can be distinguished from the material of the surrounding objects. The localization element can also be configured to locate the battery based on the distance between the battery and the localization element. That is, the distance between the battery and the localization element can be different than the distance between the surroundings of the battery and the localization element. The localization element can detect the difference between said distances and thus locate the battery. Several distances reflective of several points on the battery can also be detected. Additionally or alternatively one or more points on the battery and/or on the localization element can serve as reference points for unambiguously determining the distance. For example, the center of the localization element and the closest and furthest points of the battery can serve as reference points. The battery can be localized, within a possible error of 8 mm, preferably within a possible error of 5 mm, more preferably within a possible error of 2 mm.

In some embodiments, the localization element can be positioned in the body of the battery station. This can be advantageous as the localization element can have a smaller separation distance with the battery to be located and can have a better field of view of the battery to be located thus producing better localization and detection results. In some embodiments, the localization element can be positioned in the battery handling mechanism. This can be advantageous, as the separation distance with the battery to be located can be adjusted, as the battery handling mechanism can move. The positioning of the localization element in the battery handling mechanism can also be advantageous as the surface where the battery is mounted can be more easily scanned by the sensors, as the battery handling element can change its position.

In some embodiments, the localization element can be configured to locate the battery with a precision of at least 8 mm, preferably at least 5 mm, more preferably at least 2 mm. This can be advantageous for the battery station, particularly for the battery handling mechanism, as the misalignment between the battery and the battery station, particularly battery handling mechanism, can be reduced to at least 8 mm, preferably at least 5 mm, more preferably at least 2 mm. In such embodiments, the localization element can be configured to locate the mobile robot with a precision of at least 8 mm, preferably at least 5 mm, more preferably at least 2 mm. That is, the localization element can be configured to locate a certain point, such as the center of the battery or another point on the robot with a radius of at least 8 mm, preferably at least 5 mm, more preferably at least 2 mm. The position of the battery within the mobile robot can be known by the localization element. Thus, by locating the mobile robot and knowing the position of the battery in the mobile robot, the position of the battery can be derived.

In some embodiments, the localization element can increase the tolerable misalignment between the battery and the battery handling mechanism. Said tolerable misalignment can be the maximum incorrect positioning of the battery relative to the battery station, such that the battery station can be able to load and unload the battery. The tolerable misalignment can also be the maximum incorrect positioning of the battery station relative to the battery, such that the battery station can be able to load and unload the battery. In such embodiments, the position of the battery can be used to allow the battery handling mechanism to adjust its position with respect to the position of the battery and thus increase the precision of the alignment between the battery handling mechanism and the battery. Such an adjustment can make the battery station more tolerable to misalignments between the battery handling mechanism and the battery. Thus, the localization element can be advantageous, as it facilitates the alignment of the battery handling mechanism with the battery.

In some embodiments, the battery station can be configured to perform at least one of store at least one battery, preferably a plurality of batteries such as 2 to 10 batteries and charge at least one battery, preferably a plurality of batteries, such as 2 to 10 batteries. That is the battery station can be configured as a battery storage device, in that it stores at least one battery. The battery station can also be configured as a battery charger device, in that it charges at least one battery simultaneously or not. This can be advantageous for the battery station and preferably for the mobile robot as the mobile robot does not have to wait for the charging of its battery but it can use one of the batteries stored or charged in the battery station.

In some embodiments, the battery station can further comprise a station battery holder. The station battery holder can be configured to hold a battery. In some embodiments, the station battery holder can further comprise a fixing element. The fixing element can be configured to support a battery attached to the at least one station battery holders. In some embodiments, the fixing element can comprise at least one elongated part protruding from the body of the station battery holder, such as at least one latch, preferably a plurality of latches. The latches can be fixed on the body of the battery thus keeping the battery fixed to the station battery holder. The station battery holder can thus allow the battery station to store at least one battery, preferably a plurality of batteries. The latches can be advantageous, as they occupy a small area and can allow the battery station to store at least one battery, preferably a plurality of batteries, fixed to it.

In some embodiments, the battery station can be configured to grab a battery from a mobile robot positioned in the battery load/unload position. The battery station can also be configured to grab a battery from a charging unit. The battery station can be configured to transport a battery from a mobile robot to a battery charging unit. The battery station can also be configured to transport a battery from a charging unit to a mobile robot, said mobile robot positioned in the battery load/unload position. The battery station can also be configured to transport a battery from a charging unit to another charging unit. That is, the battery station can at least one of grab and transport a battery between any of at least one battery charging units and a mobile robot positioned in the battery charging unit. These features of the battery station can be advantageous as it can allow the battery station to swap a battery between the mobile robot and the battery station or between charging units of the battery station. This can be particularly advantageous, as it reduces the need for a human during the battery swapping process.

In some embodiments, the battery handling mechanism of the battery station can comprise a battery grabber element. The battery grabber element can be configured to grab a battery positioned within the reaching range of the battery handling mechanism. The battery grabber element can facilitate the operation of the battery handling mechanism, by allowing the battery handling mechanism to grab the battery.

In some embodiments, the battery grabber element can be configured to latch and/or unlatch a battery from a station battery holder and/or a robot battery holder during loading and/or unloading of the battery from the station battery holder and/or the robot battery holder. That is, the battery grabber element can be configured to latch a battery to a station battery holder while the battery handling mechanism is loading the battery to the station battery holder. The battery grabber element can also be configured to unlatch the battery from the station battery holder while the battery handling mechanism is unloading the battery from the station battery holder. The battery grabber element can be configured to latch a battery to a robot battery holder while the battery handling mechanism is loading the battery to the robot battery holder. The battery grabber element can also be configured to unlatch the battery from the robot battery holder while the battery handling mechanism is unloading the battery from the station battery holder.

In some embodiments, the battery grabber element can be configured to keep a battery fixed to the battery handling mechanism during the transportation of the battery between different locations within the reaching range of the battery handling mechanism.

In some embodiments, the battery grabber element further can comprise at least one flexural joint, preferably a plurality of flexural joints. The flexural joints can be configured to increase the tolerable misalignment between the battery handling mechanism and the battery. Said tolerable misalignment can be the maximum incorrect positioning of the battery relative to the battery station such that the battery station can be able to load and unload the battery. Said tolerable misalignment can be the maximum incorrect positioning of the battery station (10) relative to the battery, such that the battery station is able to load and unload the battery. The flexural joint can be particularly advantageous if the surface where the battery is positioned is misaligned, such as inclined, with respect to the battery grabber element. The flexural joint can also be advantageous as it can absorb possible vibrations of the battery while the battery is grabbed by the grabber element. The flexural joint can further be advantageous as it can provide one or more degrees of freedom.

In some embodiments, the battery grabber element further can comprise at least one kinematic joint, preferably a plurality of kinematic joints. The kinematic joints can be configured to increase the tolerable misalignment between the battery handling mechanism and the battery. Said tolerable misalignment can be the maximum incorrect positioning of the battery relative to the battery station such that the battery station can be able to load and unload the battery. Said tolerable misalignment can be the maximum incorrect positioning of the battery station relative to the battery, such that the battery station is able to load and unload the battery. The kinematic joint similar can be particularly advantageous if the surface where the battery is positioned is misaligned, such as inclined, with respect to the battery grabber element. The kinematic join can also be advantageous as it can absorb possible vibrations of the battery while the battery is grabbed by the grabber element.

In some embodiments, the battery grabber element can comprise at least one of at least one kinematic joint and at least one flexural joint.

In some embodiments, the battery handling mechanism can comprise at least one lifting mechanism. The lifting mechanism can be configured to move the battery grabber element vertically with respect to ground. The lifting mechanism can also be configured to move the grabber element horizontally with respect to ground. The lifting mechanism can also be configured to move the battery in any direction comprising any combination of horizontal and vertical movement. The lifting mechanism can be advantageous as during loading and unloading of the battery to and from the robot or the charging units the battery handling mechanism can move the battery to position it in the targeted destination. A lifting mechanism can also be particularly advantageous when the battery of the mobile robot is heavy and can be difficult moved by a human. The lifting mechanism can avoid the need of using other lifting methods or devices to transport the battery in the targeted destination.

In some embodiments, the lifting mechanism can be configured as a scissor lift mechanism. That is, the lifting mechanism comprise two elongated structures jointed in an "X" shape, wherein the elongated structures can rotate with respect to the intersection point of the two elongated structures. The scissor lift can be advantageous as the lifting weight is distributed evenly. That is, while moving the battery, the battery's weight is equally distributed between the two elongated structures forming the scissor lift.

In some embodiments, the lifting mechanism can be configured as a parallelogram lift mechanism. The lifting mechanism can be advantageous as it consumes a small space and also requires a less force to lift the battery compared to the scissor lift.

In some embodiments, the battery handling mechanism can further comprise at least one linear actuator, preferably a plurality of linear actuators, such as 2 linear actuators. The linear actuators can be configured to move the battery grabber element to any location within the reaching range of the battery handling mechanism. The linear actuators can be advantageous as they can produce movement of the battery handling mechanism by transforming other forms of energy to kinetic energy without the need of a human producing such movements. The linear actuators can also be advantageous as their movement can be controlled in a precise manner to move the battery handling mechanism in a predefined manner.

In some embodiments, the linear actuators can be configured to move the battery grabber element in any direction within the reaching the range of the battery handling mechanism. That is, the linear actuators can allow the battery handling mechanism to position the grabber element in any location within the reaching range of the battery handling mechanism. Such a location can be the robot battery holder, a charging unit of the battery station, a station battery holder or any other location within the reaching range of the battery handling mechanism.

In some embodiments, the battery station can further comprise at least one wheel, preferably a plurality of wheels, such as 2 to 6 wheels. Such wheels are configured to facilitate the movement of the battery station. That is, the presence of the wheels can make it easier to displace, transport or move the battery station. In some embodiments, the battery station can be manually moved by an operator. In some embodiments, the battery station can further comprise a motor. The motor can be preferably configured to be remotely controlled by an operator. The motor and the wheels can be particularly advantageous as it can avoid the need for a human to manually move the battery station. In some embodiments, the battery station can be configured to at least one of autonomously and semi-autonomously move.

In some embodiments, the battery station can comprise a plurality of battery charging units, such as 2 to 10 battery charging units. This can advantageous, as it increases the battery storage capacity of the battery station. That is, the battery station can store a plurality of batteries, such as 2 to 10 batteries. The plurality of battery charging units can also be advantageous as it increases the number of batteries that the battery station can simultaneously charge. That is, the battery station can charge a plurality of batteries, such as 2 to 10 batteries. The plurality of battery charging units can be further advantageous as it allows the battery station to serve multiple mobile robots consecutively. That is, the battery station can serve a plurality of mobile robots such as 2 to 10 mobile robots, one after another, with none of the robots waiting for the batteries to be charged.

In some embodiments, the battery station can comprise a heating element. The heating element can be configured to produce and transfer energy in the form of heat to the battery station. The heating element can also be configured to produce and transfer energy in the form of heat to the mobile robot positioned in the battery load/unload position. The heating element can be particularly advantageous in low temperature environments, as it prevents the battery station's temperature lowering below a threshold temperature. That is, the heating element can prevent the battery station from freezing. The heating element can also transfer heat to the mobile robot and the battery of the mobile robot when the mobile robot is positioned in the battery load/unload position. For example, in environments where the robot may move through snow or ice, some of the snow or ice can get stuck on the wheels, undercarriage, or other parts of the robot. This can lead to the misalignment of the robot due to snow or ice being stuck on one wheel, or blocking of the battery compartment in case it is located at the robot's undercarriage. In such cases, the heating element can ensure that the snow or ice melts before proceeding to swap the battery of the robot.

In some embodiments, the battery station can comprise a localization element comprising or configured as a camera. That is, the localization element can be configured to capture at least one image. The camera can be positioned facing the top opening of the battery station. Thus, when a mobile robot is positioned on the battery load/unload position the camera can capture at least one image of the mobile robot, preferably of the battery positioned on the mobile robot (as allowed by the top opening of the battery station). The images captured by the camera can be processed by a data processing device, such as the controller of the battery station. The processing of the images can allow the data processing device to infer or determine the presence and preferably position of the battery on the images. By considering the setup of the camera, such as, the position of the camera and the determined position of the battery on the images captured by the camera, the position of the battery can be determined, e.g. relative to the camera, any other reference point, etc. This can be advantageous as it can allow the battery station to handle or grab the battery of the robot.

In some embodiments, the battery station can comprise a battery presence detector. The battery presence detector can be mounted on the battery grabber element. The battery presence element can be configured to provide a feedback when the battery is grabbed or supported by the battery grabber element. Thus, whenever the battery grabber element grabs a battery of the mobile robot from a charging unit or from a mobile robot, a feedback signal can be produced announcing the successful grabbing of the battery by the grabber element. Similarly, a feedback signal can be produced or the missing of a signal can be recognized a s identifying the release of the battery by the grabber element. For example, when the battery grabber element loads a battery to a charging unit or to the mobile robot, it can release the battery, thus not supporting it anymore. A feedback signal produced by the battery presence detector or the missing of the signal can indicate that the grabber element is not grabbing a battery. Put simply, a feedback signal can be produced by the battery presence detector and the presence or missing of said feedback signal can be used to infer presence or non-presence of a battery on the battery grabber element.

The battery presence detector can comprise a switch. Said switch can be pressed under the pressure of the battery, when the battery is supported by the grabber element, and can provide a feedback signal indicating the presence of the battery on the battery grabber element. Similarly, the switch may change state when the pressure of the battery is reduced or removed—i.e. the battery is not supported by the battery grabber element. Hence, either state of the switch (pressed/not pressed or on/off) can be detected, thereby inferring whether the battery is supported by the battery grabber element.

The battery presence detector can additionally or alternatively comprise a force sensor. The force sensor can be configured to measure the force that can be applied to it. For example, the force sensor can provide a feedback signal indicating the force applied to the force sensor. In some embodiments, the force sensor can be a force sensitive resistor, that is, a resistor with resistance depending on the force applied to it. Different resistance values or levels can be mapped to different force measures or levels. Thus, when the battery is on the battery grabber element, the force sensor can provide higher measures of the force applied to it. On the other hand, when the battery is not supported by the battery grabber element, the measured force values can be smaller.

Hence, using the force sensor, the presence of the battery on the battery grabber element can be determined.

The battery presence detector may also comprise other types of electronic contact/non-contact detectors that can be configured to detect the presence of the battery on the battery grabber element.

In some embodiments, the surface of the battery station, preferably the part of the surface that can be contacted by the wheels of the mobile robot, can be configured for avoiding slippage of the wheels of the mobile robot. That is, the friction coefficient of the surface of the battery station or part of the surface of the battery station can be increased. Increasing the friction coefficient the surface of the battery station (or at least part of the surface of the battery station) can be advantageous, as it can avoid slippage of the wheels of the mobile robot. Hence, a better or more accurate positioning of the mobile robot on the battery load/unload position can be achieved.

In some embodiments, wherein the surface of the battery station is configured for avoiding slippage of the wheels of the mobile robot, the surface of the battery station may be non-smooth. That is, the surface (or part of the surface) of the battery station may comprise steps and/or bumps that can make the surface (or part of the surface) of the battery station uneven. Hence, the friction of the surface (or part of the surface) of the battery station comprising the steps and/or bumps can be increased.

In some embodiments, wherein the surface of the battery station is configured for avoiding slippage of the wheels of the mobile robot, the battery station can comprise a high friction material. The high friction material can be applied to the surface of the battery station that can be contacted by the wheels of the mobile robot, such as, on the battery load/unload position.

In a second embodiment, a system for swapping and/or charging at least one battery is disclosed. The system comprises at least one battery station. The system further comprises at least one mobile robot. The mobile robot comprises at least one battery.

The present system can be particularly useful for mobile robots travelling between different destinations. In a specific example, such mobile robots can be used for delivering items to delivery recipients. The robots can be loaded with items at a first location and proceed to travel to a delivery location. While traveling, the robots will consume the energy stored in their batteries. Furthermore, the battery of the mobile robot can be malfunctioning, can reach a predefined loss of capacity, or can reach the end of life of the battery or its charge-discharge cycles can reach a predefined number, such as the maximum number of charge-discharge cycles that the battery can experience. Thus, such robots would require to charge their batteries, or require another battery. It can be desirable that such robots do not wait for their batteries to be charged, but are provided with already charged batteries which are swapped with the discharged battery of the robot, or another battery is provided to the robot and swapped with the malfunctioning battery of the robot. It can also be desirable that the battery swapping process achieves a high degree of automation, preferably full automation. Therefore, the battery station can be used to at least one of store and charge at least one battery preferably for use by the mobile robot. The battery station can also be used to swap the battery of the mobile robot with another battery, such as a charged battery, a new battery, a properly functioning battery.

In some embodiments, the battery station can comprise a battery load/unload position which can be configured to facilitate the service of the mobile robot by the battery station. That is, the battery load/unload position can be configured such that, when the mobile robot is positioned in the battery load/unload position the at least one of the batteries of the mobile robot is aligned with the battery station, within a misalignment range of 0.1-2 cm, such as 1 cm. The misalignment range can refer to a radius, that is, it can comprise a circle with a radius of 0.1 to 2 cm. The battery load/unload position can be advantageous as it can simplify at least one of load and unload of the battery from the mobile robot by the battery station.

In some embodiments, the mobile robot can be configured to seek service from the at least one battery station when the energy level of the at least one batteries of the mobile robot is below a certain threshold level. The threshold level can preferably be programmable onto the at least one robot. That is, while operating the mobile robot can consume the energy stored in at least one of its batteries. Thus, the energy level of at least one of its batteries can decrease. When the energy level of at least one of its batteries is smaller or equal to a threshold level, it can be desirable for the mobile robot to require a battery which is storing an energy bigger than the threshold level. Thus, it can be desirable for the mobile robot to seek service from the battery station. It can also be advantageous for the threshold level to be programmable on the mobile robot, so that it can easier adapt to cases when a different type of battery is used, or to other conditions that affect the battery consumption by the mobile robot.

In some embodiments, the mobile robot can be configured to seek service from the at least one battery station when the service life of the battery is over. For example, the mobile robot can seek service from the battery station when at least one of its batteries can be malfunctioning, has reached a predefined loss of capacity, which can be a fraction of the original capacity of the battery when the battery is produced, or when the battery has reached its end of life or has reached a predefined number of charge-discharge cycles, such as the battery has reached the maximum number of charge-discharge cycles it can experience and still work properly. This can be advantageous, as the battery station can comprise new batteries, or can comprise batteries with the number of charge-discharge cycles smaller than the predefined number of charge-discharge cycles.

In some embodiments, the mobile robot can be configured to seek service from the at least one battery station when the battery is malfunctioning. For example, the battery of the mobile robot does not work properly. That is, the battery of the mobile robot cannot supply the required energy, power, voltage and/or current. In another example, the battery's contact points can be damaged. Thus, it can be advantageous for the mobile robot to seek service from the battery station, as the battery station can comprise batteries that work in a proper way.

In some embodiments, the at least one battery station can comprise at least one guiding element. In such embodiments, the at least one mobile robot can further comprise at least one of at least one optical sensor and at least one camera. The optical sensors and the cameras can be configured to sense the guiding element of the battery station. Further, in such embodiments, the mobile robot can sense the guiding element to approach the battery load/unload position of the battery station. That is, the guiding element can indicate the battery load/unload position. The mobile robot using at least one of its optical sensors and cameras can sense the guiding element and thus approach the battery load/unload position.

In some embodiments, the battery station can be configured to detect a battery of the mobile robot when the mobile robot is positioned in the battery load/unload position. That is, the battery station can detect the presence of the battery of the mobile robot, when the mobile robot is positioned in the battery load/unload position. The battery station can also be configured to locate a battery of the mobile robot when the mobile robot is positioned in the battery load/unload position. That is, the battery station can find the position of a battery of the mobile robot, when the mobile robot is positioned in the battery load/unload position. In such embodiments, the battery station can comprise a localization element. The localization element can be configured to at least one of detect and locate a battery of the mobile robot, when the mobile robot is positioned in the battery load/unload position. This can be advantageous as it can improve the alignment between the mobile robot, particularly the battery of the mobile robot, with the battery station thus, facilitating the service of the mobile robot by the battery station. This can also be particularly advantageous if the battery station can at least one of load and unload the battery of the mobile robot from the mobile robot. By at least one of detecting and locating the battery of the mobile robot, the loading and unloading of the battery from the mobile robot can be easier.

In some embodiments, the mobile robot can comprise a robot battery holder. The robot battery holder can comprise a fixing element. The fixing element can be configured to hold the battery attached to the mobile robot. That is, the at least one of the batteries of the mobile robot can be positioned in the robot battery holder. The fixing elements of the robot battery holder can keep the battery fixed to the robot battery holder and thus to the mobile robot. In such embodiments, the battery station can comprise a localization element. The localization element can be configured to detect a robot battery holder when the mobile robot is positioned in the battery load/unload position. That is, the battery station can detect the presence of the robot battery holder when the mobile robot is positioned in the battery load/unload position. The battery station can also be configured to locate the position of the robot battery holder when the mobile robot is positioned in the battery load/unload position. That is, the battery station can locate the position of the robot battery holder, when the mobile robot is positioned in the battery load/unload position. This can be advantageous, as it can improve the alignment between the mobile robot, particularly the robot battery holder of the mobile robot, with the battery station, thus facilitating the service of the mobile robot by the battery station. This can also be particularly advantageous if the battery station is adapted to at least one of load and unload the battery of the mobile robot to the robot battery holder of the mobile robot. By at least one of detecting and locating the battery of the mobile robot, the loading and unloading of the battery from the mobile robot can be easier.

In some embodiments, the battery station can be configured to at least one of load and unload a battery from the mobile robot, when the mobile robot is positioned in the battery load/unload position. In such embodiments, the battery station can preferably be configured to unload a discharged battery from the mobile robot. The battery station can also preferably be configured to load a charged a battery to the mobile robot.

A discharged battery can refer to any battery with an energy level from empty to full. A discharged battery can also refer to a defective battery, a malfunctioning battery, a battery with a terminated life cycle, a battery which has reached a predefined number of charge discharge cycles, such as the maximum number of charge-discharge cycles the battery can experience and still work properly. A charged battery can refer to any battery with an energy level from fully charged to not empty. A charged battery can also refer to a battery that works properly. A charged battery can also refer to a battery that has experienced a charge-discharge number of cycles smaller than the predefined number of charge-discharge cycles.

In some embodiments, the mobile robot and the battery station can be configured to communicate with each other in order to facilitate at least one of battery swapping and charging process of the battery of the mobile robot by the battery station. In such embodiments, the mobile robot can communicate to the battery station the battery state of the at least one of the batteries the mobile robot is comprising. Further, the battery station can communicate to the mobile robot the battery state of the at least one of the batteries the battery station is comprising. The battery state can comprise energy level of the battery, number of charge-discharge cycles the battery have experienced, original and current capacity of the battery, cell voltages, current rate of charge-discharge, temperature of the battery.

In some embodiments, the system can further comprise at least one server. In such embodiments, the mobile robot can be configured to communicate with the server in order to facilitate the at least one of battery swapping and charging process. In such embodiments, the battery station can be configured to communicate with the server in order to facilitate the at least one of the battery swapping and charging process. In such embodiments, the server can monitor the operation of the mobile robot. The server can also assume control of the operation of the robot. The server can also assume control of the operation of the battery station. The server can comprise data related to at least one of position of the robot, position of the battery station, battery state of the battery of the robot, battery state of the batteries positioned in the battery station. The battery state can comprise energy level of the battery, number of charge-discharge cycles the battery has experienced, original and current capacity of the battery, cell voltages, current rate of charge-discharge, temperature of the battery. The battery state can be communicated to the robot when the battery is attached to the robot. The battery state can be communicated to the battery station when the battery is attached to the battery station. The battery state can be communicated from the battery to the server through the mobile robot, or it can be communicated to the server through the battery station.

In some embodiments, the system can comprise a hub. The hub can comprise at least one battery station. The hub can be configured to at least one of serve, house and maintain the at least one mobile robot. The hub can comprise a building, a part of a building, a truck, a storage container, or similar structures. In such embodiments, the battery station can be integrated in the floor of the hub, such that the top surface and the guiding element of the battery station are not covered by the floor. Integrating the battery station in the floor of the hub can be advantageous, since traveling through inclined surfaces to reach to the battery load/unload position of the battery station can be avoided for the mobile robot. This can also be advantageous, as integrating the battery station on the floor of the hub can preserve space. Leaving the top surface and the guiding element of the battery station exposed can be advantageous as the robot can sense the guiding element that can indicate the battery load/unload position to the mobile robot and also the battery station can reach the battery of the mobile robot.

In some embodiments, the battery station can be configured to approach a mobile robot. The battery station can approach the mobile robot autonomously. The battery station can also approach the mobile robot semi-autonomously. The battery station can also approach the mobile robot by being remotely controlled by an operator.

In some embodiments, the battery station can comprise a localization element comprising or configured as a camera. That is, the localization element can be configured to capture at least one image. The camera can be positioned facing the top opening of the battery station. Thus, when a mobile robot is positioned on the battery load/unload position the camera can capture at least one image of the mobile robot, preferably of the battery positioned on the mobile robot (as allowed by the top opening of the battery station). The images captured by the camera can be processed by a data processing device, such as, the controller of the battery station. The processing of the images can allow the data processing device to infer or determine the presence and preferably position of the battery on the images. By considering the setup of the camera, such as, the position of the camera and the determined position of the battery on the images captured by the camera, the position of the battery can be determined, e.g. relative to the camera. This can be advantageous as it can allow the battery station to handle or grab the battery of the robot. In addition, the battery of the mobile robot can comprise a recognizable pattern that can facilitate the detection of the battery on the images captured by the camera. For example, the recognizable pattern can comprise a distinctive feature, such as a distinctive color, hence, making it easier to be detected by a data processing device processing images of the battery and the recognizable pattern. In a third embodiment, a method for at least one of swapping and charging a mobile robot battery is disclosed. In such embodiments, at least one battery station is provided. Further, at least one mobile robot is provided. The mobile robot comprises at least one robot battery holder.

The method comprises the step of positioning the at least one mobile robot in the battery load/unload position. The load/unload position can be a position that facilitates the swapping of the battery from the mobile robot. The positioning of the at least one mobile robot at the battery load/unload position can be advantageous, as it can align the at least one of the batteries of the mobile robot with the battery station. Thus, the swapping process of the battery of the mobile robot by the battery station can be simplified.

The method further comprises the step of locating the at least one battery of the at least one mobile robot. That is, the battery station can locate at least one of the batteries of the at least one mobile robot, when the mobile robot is in the battery load/unload position. The battery station can find the position of at least one of the batteries of the mobile robot, when the mobile robot is positioned in the battery load/unload position. This step can be advantageous, as it can facilitate the swapping of the battery of the mobile robot. By finding the location of the battery of the mobile robot, it can be easier for the battery station to swap the battery of the mobile robot.

The method further comprises the step of unloading a discharged battery from the at least one mobile robot. A discharged battery can be any battery with an energy level from empty to full. A discharged battery can also be a defected battery, a malfunctioning battery, a battery which life cycles is over, a battery which has reached a predefined number of charge discharge cycles, such as the maximum number of charge-discharge cycles the battery can experience and still work properly.

The method further comprises the step of transporting and loading the discharged battery to an unoccupied charging unit. That is, the battery station can transport the battery to a charging unit. The charging unit can be unoccupied, in that it does not contain another battery. The battery station can also load the battery to a charging unit. That is, the battery station can approach the battery to the charging unit. The battery station can further fix the battery to the charging unit. The step of transporting and loading the battery to a charging unit of the battery station can be advantageous as the battery can be stored in the battery station. This step can be particularly advantageous if the charging unit can charge the batteries and thus prepare it for later use.

The method further comprises the step of unloading a charged battery from the at least one occupied battery charging unit. That is, the battery station can detect the presence of a battery, preferably of a charged battery, in one of its charging units. The battery station can further unload the battery from the charging unit. A charged battery can be any battery with an energy level from fully charged to not empty. A charged battery can also be a battery that works properly. A charged battery can also be battery that has experienced a charge-discharge number of cycles smaller than the predefined number of charge-discharge cycles.

The method further comprises the step of transporting and loading the charged battery to the at least one mobile robot. That is, the battery station can transport the battery toward the mobile robot. The battery station can further load the battery to the mobile robot. While loading, the battery can electrically connect with the mobile robot. Furthermore, while loading, the battery station can fix the battery to the mobile robot. This is advantageous, as the robot can continue its operation having a charged battery attached to it.

In some embodiments, the battery station can comprise a guiding element. Further, the mobile robot can comprise at least one of at least one optical sensor and at least one camera. The optical sensor and the camera can be configured to sense the guiding element. In such embodiments, the mobile robot can move to the battery load/unload position by sensing the guiding element with the at least one optical sensor and camera. That is, the guiding element can be configured to indicate the battery load/unload position. The mobile robot can also be configured to approach the battery load/unload position by sensing and following the direction indicated by the guiding element of the battery station.

In some embodiments, the battery station can comprise a localization element. The localization element can be configured to at least one of detect and locate a localization target. The localization target can be a mobile robot positioned in the battery load unload position. The localization target can also be the battery of the mobile robot positioned in the battery load/unload position. The localization target can also be both the mobile robot positioned in the battery load/unload position and the battery of the mobile robot. That is, in such embodiments, the method can comprise the step of the battery station detecting the presence of the localization target. In some specific embodiments, the battery station can achieve this by detecting the presence of the localization target, such as the presence of the mobile robot positioned in the battery load/unload position or the at least one of the batteries of the mobile robot when the mobile robot is positioned in the battery load/unload position. Detecting the mobile robot positioned in the battery load/unload position or the battery of the mobile robot can be advantageous as it can allow the battery station to know when to initiate the process of serving the mobile robot. That is, the battery station can know when to initiate the process of swapping the battery of the mobile robot. In such embodiments, the localization element can locate the battery of a mobile robot positioned in the battery load/unload position. The localization element can also locate the mobile robot positioned in the battery load/unload position. Such a localization element can be an inductive sensor, a capacitive sensor, a mechanical localization element or a combination of different types of localization elements. The localization element can be advantageous for the battery station as it can allow the battery station to detect the presence of the mobile robot positioned in the battery load/unload position. The localization element can also allow the battery to detect the presence of the battery of the mobile robot. It can further allow the battery station to find the position of the battery of the mobile robot or to find the position of the mobile robot.

In some embodiments, the process of locating the localization target can comprise the step of the localization element scanning the mobile robot, preferably part of the mobile robot that surrounds the battery of the mobile robot, by emitting electromagnetic waves, preferably oscillating electromagnetic waves. In such embodiments, the localization element can also move to facilitate the scanning. During the scanning process, the localization element can continuously measure changes in the emitted electromagnetic field, such as changes in frequency or amplitude of the electromagnetic field. Such changes can be caused by an external object, such as the localization target, positioned in the vicinity of the localization element. Further, the localization element can be configured to detect the changes of the electromagnetic waves caused by the presence of the localization target within the sensing range. That is, the localization element can detect changes in the electromagnetic field caused by the material of the localization target or caused by the distance between the localization target and the localization element. Further, the localization target can calculate the position of the localization target within a possible error of less than 8 mm, preferably less than 5 mm, more preferably less than 2 mm. Such a calculation can be processed by a processing unit connected to the localization element.

In some embodiments, the process of locating the localization target can comprise the step of the localization element emitting electromagnetic waves towards the part of the mobile robot comprising the battery to be located. The localization element can also emit the electromagnetic waves towards the battery to be located or localized. Further, the surface of the mobile robot comprising the battery to be located can reflect the emitted electromagnetic waves by the localization element. The battery to be located can also reflect the electromagnetic waves emitted by the localization element. The surface of the mobile robot comprising the battery and the battery can preferably reflect the electromagnetic waves in distinctive manners. In one specific example, the reflected electromagnetic waves by the battery can have a higher energy than the reflected electromagnetic waves reflected by the surface of the mobile robot comprising the battery. The process of locating a battery of a mobile robot can further comprise the step of the localization element receiving and measuring the reflected electromagnetic waves. That is, the localization element can detect and receive the electromagnetic waves reflected by at least one of the surface of the mobile robot comprising the battery to be located and the battery to be located. The localization element can further perform measurements on the received waves. In one specific example, the localization element can measure the amplitude of such received electromagnetic waves. In another example, the localization element can measure the frequency of the received electromagnetic waves. Further, the localization element can categorize the reflected electromagnetic waves as being reflected by the battery and as being not reflected by the battery. That is, the localization element can distinct between the electromagnetic waves reflected by the battery from the electromagnetic waves that are not reflected by the battery. Further, the localization element can calculate the position of the localization target, with a possible error of less than 8 mm, preferably less than 5 mm, more preferably less than 2 mm. That is, the localization element, based on the distinction of the electromagnetic waves reflected by the battery and the electromagnetic waves not reflected by the battery can find the position of the battery.

In some embodiments, the battery station can comprise a battery handling mechanism. The battery handling mechanism can be configured to operate on a reaching range, said reaching range can comprise at least one of the battery of the mobile robot positioned in the battery load/unload position and the battery charging unit. That is, the battery handling mechanism can operate on its reaching range. Such a reaching range can comprise the at least one of the batteries of the mobile robot, when the mobile robot is positioned in the battery load/unload position. The reaching range can also comprise the at least one of the battery charging units of the battery station. Such a reaching range can be advantageous as it can allow the battery handling mechanism, thus the battery station, to reach at least one of the batteries of the mobile robot positioned in the battery load unload position. The reaching range can also allow the battery handling mechanism to reach the battery charging units, thus the batteries that can be in the battery charging units. The battery station can further comprise a battery grabber element. The battery grabber element can be configured to grab a battery positioned within the reaching range of the battery handling mechanism. The battery grabber element can facilitate the operation of the battery handling mechanism, by allowing the battery handling mechanism to grab the battery.

In such embodiments, the mobile robot can further comprise a robot battery holder. The robot battery holder can comprise a fixing element. The fixing element can be configured to hold the battery attached to the mobile robot. That is, the fixing element can fix the battery to the robot battery holder and thus to the mobile robot. The grabber element can be configured to unlatch the battery from the fixing element of the robot battery holder. Furthermore, in such embodiments, the battery charging unit can comprise a station battery holder. The station battery holder can comprise a fixing element. The fixing element can be configured to keep the battery attached to the station battery holder, thus to the battery station. That is, the fixing element can fix the battery to the station battery holder and thus to the battery station. The grabber element can be configured to unlatch the battery from the fixing element of the at least one station battery holder.

In some embodiments, the battery handling mechanism can unload the battery from the mobile robot. The process of unloading the battery from the mobile robot can comprise the step of the battery handling mechanism positioning the battery grabber element in the robot battery holder. That is, the battery handling mechanism can approach the battery grabber element to the robot battery holder such that the battery grabber element can grab the battery positioned in the robot battery holder. Further, the battery grabber element can grab the battery positioned in the robot battery holder. That is, the battery grabber element can fix the battery positioned in the robot battery holder to its body and thus to the battery handler mechanism. Further, the battery grabber element can unlatch the battery from the fixing element of the robot battery holder. That is, the battery grabber element can move the battery away from the fixing element such that the battery can be removed from the robot battery holder. Thus, if the battery handling mechanism moves the battery grabber element, the battery will move with it. Further, the battery handling mechanism can move the battery grabber element, holding the battery away from the robot battery holder. That is, the battery handling mechanism can unload the battery from the mobile robot by removing the battery from the robot battery holder.

In some embodiments, the battery handling mechanism can transport the grabbed battery to an unoccupied charging unit. An unoccupied charging unit can be a charging unit of the battery station that does not contain a battery. Thus, an unoccupied charging unit can be a charging unit that can neither be storing nor charging a battery. In such embodiments, at least one controller unit can be provided. The controller unit can be configured to facilitate the operations of the battery station. The at least one controller unit can check the battery charging units of the battery stations whether they are occupied by a battery and whether they are not occupied by a battery. That is, the controller unit can allow the battery station to know which of its battery charging unit are storing or charging a battery and which are not. The at least one of the controllers of the battery station can find an unoccupied battery charging unit. The at least one controller of the battery station can provide the coordinates of the unoccupied charging unit to the battery handling mechanism. The battery handling mechanism can position the grabber element holding a battery in the unoccupied charging unit.

In some embodiments, the battery grabber element can load the grabbed battery to the said unoccupied charging unit. That is the battery grabber element can position the battery in the charging unit and can preferably fix it in the charging unit. In such embodiments, the battery handling mechanism can position the battery grabber element holding a battery in the station battery holder of the unoccupied charging unit. That is the battery handling mechanism can approach the battery grabber element to the station battery holder of the battery charging unit, so that the battery grabber element can load the battery to station battery holder. Further, the battery grabber element can latch the battery in the fixing element of the station battery holder of the unoccupied charging unit. That is, the battery grabber element can fix the battery in the station battery holder and thus in the battery station. This is advantageous, as the battery station can store the batteries in the station battery holders. The battery grabber element can release the battery. That is, the battery is not fixed to the battery grabber element and the movements of the battery grabber element cannot affect the battery.

In some embodiments, the battery handling mechanism can transport the grabbed battery to a battery charging unit being occupied by a charged battery. An occupied charging unit can be a charging unit of the battery station that contains a battery. Thus, an occupied charging unit can be a charging unit that can be storing or charging a battery. In such embodiments, at least one controller unit can be provided. The controller unit can be configured to facilitate the operations of the battery station. The at least one controller unit can check the battery charging units of the battery stations whether they are occupied by a battery and whether they are not occupied by a battery. That is, the controller unit can allow the battery station to know which of its battery charging unit are storing or charging a battery and which are not. The at least one of the controllers of the battery station can find a battery charging unit occupied by a charged battery. The at least one controller of the battery station can provide the coordinates of the battery charging unit occupied by a charged battery to the battery handling mechanism. The battery handling mechanism can position the grabber element holding a battery in the battery charging unit occupied by a charged battery.

In some embodiments, the battery handling mechanism can unload the charged battery from the battery charging unit. The process of unloading the battery from the mobile robot can comprise the step of the battery handling mechanism positioning the battery grabber element in the station battery holder of the charging unit occupied by a battery. That is, the battery handling mechanism can approach the battery grabber element to the station battery holder such that the battery grabber element can grab the battery positioned in the station battery holder. Further, the battery grabber element can grab the battery positioned in the station battery holder. That is the battery grabber element can fix the battery positioned in the station battery holder to its body and thus to the battery handler mechanism. Further, the battery grabber element can unlatch the battery from the fixing element of the station battery holder. That is, the battery grabber element can move the battery away from the fixing element such that the battery can be removed from the station battery holder. Thus, if the battery handling mechanism moves the battery grabber element the battery will move with it. Further, the battery handling mechanism can move the battery grabber element, holding the battery away from the station battery holder. That is, the battery handling mechanism can unload the battery from the station battery holder by removing the battery from the station battery holder.

In some embodiments, the battery handling mechanism can transport the battery grabber element holding a charged battery to the robot battery holder. In such embodiments, at least one controller unit can be provided to facilitate the operations of the battery station. The at least one controller unit of the battery station can provide the position of the robot battery holder to the battery handling mechanism. In some embodiments, this can be accomplished by providing to the battery handling mechanism the same coordinates that were obtained when locating the discharged battery of the mobile robot. In some embodiments, the localization element can locate the robot battery holder and can provide the coordinates of the robot battery holder to the battery handling mechanism. Further, the battery handling mechanism can position the battery grabber element holding a charged battery to the robot battery holder. That is, the battery handling mechanism approaches the battery grabber element to the robot battery holder, such that the battery grabber element can load the battery to the robot battery holder.

In some embodiments, the battery grabber element can load the charged battery to the at least one robot battery holder. That is the battery grabber element can position the battery in the robot battery holder and can preferably fix the battery in the robot battery holder. In such embodiments, the battery handling mechanism can position the battery grabber element holding a battery in the robot battery holder. That is the battery handling mechanism can approach the battery grabber element to the robot battery holder of the mobile robot, so that the battery grabber element can load the battery to the robot battery holder. Further, the battery grabber element can latch the battery in the fixing element of the robot battery holder. That is, the battery grabber element can fix the battery in the robot battery holder and thus in the mobile station. The battery grabber element can further release the battery. That is, the battery is not fixed to the battery grabber element and the movements of the battery grabber element cannot affect the battery.

In some embodiments, the method further can comprise the battery station initiating the charging process of the discharged batteries in the charging unit. That is, the battery station can comprise at least one charging unit. The charging unit can be configured to charge at least one battery. This can be advantageous as it can allow the battery station to charge at least one battery. This can also be advantageous particularly for the mobile robot, as it can be provided with charged batteries by the battery station.

In some embodiments, further a server is provided. In such embodiments, the server can communicate with the at least one mobile robot to facilitate the battery swapping and/or charging process. Further, the server can communicate with the at least one battery station to facilitate the battery swapping and/or charging process. The server can be advantageous for the method as it can coordinate the operations of the mobile robot and battery station. Furthermore, the server can also assume control of the operation of the robot. The server can also assume control of the operation of the battery station. The server can comprise data related to at least one of position of the robot, position of the battery station, battery level of the battery of the robot, battery level of the batteries positioned in the battery station.

In some embodiments, the method can further comprise capturing at least one image of the battery of the mobile robot. For example, the battery station can comprise a localization element that can comprise or be configured as a camera, which localization element can be configured to detect the presence and position of a battery of a mobile robot. The method can further comprise processing the at least one image captured by the camera of the battery station to detect the presence and position of a battery on the at least one captured and processed image. This can be advantageous, as the position of the battery of the robot can be inferred e.g. relative to the camera. Hence, it can be easier for the battery station to grab or handle the battery during its operation.

In some embodiments, the method can further comprise facilitating the positioning of the mobile robot on the battery load/unload position by providing a high friction material on the surface of the battery station or high friction surface contacted by the mobile robot. The battery station can comprise a high friction material. The high friction material can be applied to the surface of the battery station that can be contacted by the wheels of the mobile robot, such as, on the battery load/unload position. The high friction material can be advantageous as it can avoid slippage of the wheels of the mobile robot. Hence, a better or more accurate positioning of the mobile robot on the battery load/unload position can be achieved.

In some embodiments, the method can further comprise providing feedback when the battery station loads and/or unloads the battery from the mobile robot. The battery station can comprise a battery presence detector. The battery presence detector can be mounted on the battery grabber element. The battery presence element can be configured to provide a feedback when the battery is grabbed or supported by the battery grabber element. Thus, whenever the battery grabber element grabs a battery of the mobile robot from a charging unit or from a mobile robot, a feedback signal can be produced announcing the successful grabbing of the battery by the grabber element. Similarly, a feedback signal can be produced or the missing of a signal can be recognized as announcing the release of the battery by the grabber element. For example, when the battery grabber element loads a battery to a charging unit or to the mobile robot, it can release the battery, and thus not supporting it anymore. A feedback signal produced by the battery presence detector or the missing of the signal can indicate that the grabber element is not grabbing a battery. Put simply, a feedback signal can be produced by the battery presence detector and the presence or missing of said feedback signal can be used to infer presence or non-presence of a battery on the battery grabber element.

Below further numbered embodiments of the invention will be discussed.

Device Embodiments

D1. A battery station (10), preferably for use by at least one mobile robot (20), comprising:
  a) a battery charging unit (132) configured to perform at least one of:
    i. holding at least one battery (400),
    ii. charging at least one battery (400);
  b) a battery load/unload position (115) configured to facilitate loading and unloading of a battery (400) to and from a mobile robot (20);
  c) a battery handling mechanism (300) configured to operate on a reaching range, said reaching range comprising at least one of the following:
    i. the battery (400) of the mobile robot (20) positioned in the battery load/unload position (115),
    ii. the battery charging unit (132);
  d) a localization element (343) configured to at least one of detect and locate at least one of the following:
    i. a battery (400) of a mobile robot (20), wherein the mobile robot (20) is positioned in the battery load/unload position (115),
    ii. a battery (400) positioned in a battery charging unit (132).

Dimensions

D2. A battery station (10) in accordance with the preceding embodiment, wherein the battery station (10) comprises a width in the range of 30 to 100 cm, preferably 50 to 70 cm, a height in the range of 15 to 35 cm, preferably 20 to 25 cm and a length in the range of 50 to 150 cm, preferably 80 to 110 cm.

Guiding Element (105)

D3. A battery station (10) in accordance with any of the preceding embodiments, wherein the battery station (10) is configured to facilitate the positioning of the mobile robot (20) in the battery load/unload position (115).

D4. A battery station (10) in accordance with any of the preceding embodiments, wherein the battery station (10) further comprises at least one guiding element (105) configured to facilitate the positioning of the mobile robot (20) in the battery load/unload position (115).

D5. A battery station (10) in accordance with the preceding embodiment, wherein the guiding element (105) comprises at least one marker (105), preferably a plurality of optical markers (105).

D6. A battery station (10) in accordance with any of the preceding embodiments and with the features of embodiment D4, wherein the guiding element (105) is configured as a straight line (105), preferably as a plurality of straight lines (105), such as 2 to 10 straight lines, indicating the battery load/unload position (115).

D7. A battery station (10) in accordance with the preceding embodiment, wherein the plurality of straight lines (105) is configured as a battery station (10) identifier, wherein at least one of the following is unique to one battery station (10) or to a specific group of battery stations (10):
a) the width of any of the plurality of straight lines (105),
b) the length of any of the plurality of straight lines (105),
c) the distance between any of the plurality of straight lines (105),
d) the color of any of the plurality of straight lines (105),
e) the number of the straight lines (105).

Localization Element (343)

D8. A battery station (10) in accordance with any of the preceding embodiments, wherein the localization element (343) comprises at least one sensor device (510), wherein the sensor device (510) comprises at least one of
a) at least one inductive sensor (510), preferably a plurality of inductive sensors (510), such as 2 to 6 inductive sensors (510);
b) at least one capacitive sensor (510), preferably a plurality of capacitive sensors (510), such as 2 to 6 capacitive sensors (510).

D9. A battery station (10) in accordance with any of the preceding embodiments, wherein the localization element (343) comprises at least one mechanical localization element (343) configured to guide the movement of the battery handling mechanism (300) toward the battery (400).

D10. A battery station (10) in accordance with any of the preceding embodiments, wherein the localization element (343) is configured to at least one of emit, receive and process electromagnetic waves.

D11. A battery station (10) in accordance with any of the preceding embodiments, wherein the localization element (343) is configured to locate the battery (400) based on at least one of:
a) distinguishing between different materials, preferably distinguishing between conductive and non-conductive materials, more preferably distinguishing the presence of the battery (400) from the presence of another material within a sensing range (515) of the localization element (343),
b) distance between the battery (400) and the localization element (343).

D12. A battery station (10) in accordance with any of the preceding embodiments, wherein the localization element (343) is positioned on the body of the battery station (10).

D13. A battery station (10) in accordance with any of the preceding embodiments, wherein the localization element (343) is positioned on the battery handling mechanism (300).

D14. A battery station (10) in accordance with any of the preceding embodiments, wherein the localization element (343) is configured to locate the battery (400) with a precision of at least 8 mm, preferably at least 5 mm, more preferably at least 2 mm.

D15. A battery station (10) in accordance with any of the preceding embodiments, wherein the localization element (343) increases the tolerable misalignment between the battery (400) and the battery handling mechanism (300), said tolerable misalignment comprising at least one of the following:
a) maximum incorrect positioning of the battery (400) relative to the battery station (10), such that the battery station (10) is able to load and unload the battery (400),
b) maximum incorrect positioning of the battery station (10) relative to the battery (400), such that the battery station (10) is able to load and unload the battery (400).

Station Battery Holder (600)

D16. A battery station (10) in accordance with any of the preceding embodiments, wherein the battery station (10) is configured to perform at least one of:
a) storing the at least one battery (400), preferably a plurality of batteries (400), such as 2 to 10 batteries (400),
b) charging the at least one battery (400), preferably a plurality of batteries (400), such as 2 to 10 batteries (400).

D17. A battery station (10) in accordance with any of the preceding embodiments, wherein the battery charging unit (132) comprises a station battery holder (600) that is configured to be occupied by a battery (400).

D18. A battery station (10) in accordance with the preceding embodiment, wherein the station battery holder (600) further comprises a fixing element (610) configured to support the battery (400) attached to the at least one station battery holder (600).

D19. A battery station (10) in accordance with the preceding embodiment, wherein the fixing element (610) comprises at least one elongated part (610) protruding from the body of the station battery holder (600), such as at least one latch (610), preferably a plurality of latches (610).

D20. A battery station (10) in accordance with any of the preceding embodiments, wherein the battery charging unit (132) comprises a fixing element (610) configured to support the battery (400) attached to the at least one battery charging unit (132).

D21. A battery station (10) in accordance with the preceding embodiment, wherein the fixing element (610) comprises at least one elongated part (610) protruding from the body of the battery charging unit (132), such as at least one latch (610), preferably a plurality of latches (610).

Battery Handling Mechanism (300)

D22. A battery station (10) in accordance with any of the preceding embodiments, wherein the battery station (10) is configured to perform at least one of the following:
a) grab the battery (400) from at least one of
i. the mobile robot (20) positioned in the battery load/unload position (115) and
ii. the charging unit (132);

b) transport the battery (400) from the mobile robot (20) to the battery charging unit (132) and/or from the charging unit (132) to the mobile robot (20), said mobile robot (20) positioned in the battery load/unload position (115), and/or from the charging unit (132) to another charging unit (132).

D23. A battery station (10) in accordance with any of the preceding embodiments, wherein the battery handling mechanism (300) comprises a battery grabber element (350, 350A, 350B) configured to grab the battery (400) positioned within the reaching range of the battery handling mechanism (300).

D24. A battery station (10) in accordance with the preceding embodiment, wherein the battery grabber element (350, 350A, 350B) comprises at least one grabbing gripper (355), preferably 2 to 4 grabbing grippers (355).

D25. A battery station (10) in accordance with any of the preceding embodiments and with features of embodiment D23, wherein the battery grabber element (350, 350A, 350B) is configured to latch and/or unlatch a battery (400) from a station battery holder (600) and/or a robot battery holder (602) during loading and/or unloading of the battery (400) from the station battery holder (600) and/or the robot battery holder (602).

D26. A battery station (10) in accordance with any of the preceding embodiments and with features of embodiment D23, wherein the battery grabber element (350, 350A, 350B) is configured to keep a battery (400) fixed to the battery handling mechanism (300) during the transportation of the battery (400) between different locations within the reaching range of the battery handling mechanism (300).

D27. A battery station (10) in accordance with any of the preceding embodiments and with features of embodiment D23, wherein the battery grabber element (350, 350A, 350B) further comprises at least one flexural joint (360), preferably a plurality of flexural joints (360), configured to increase the tolerable misalignment between the battery handling mechanism (300) and the battery (400), said tolerable misalignment comprising at least one of the following:
a) maximum incorrect positioning of the battery (400) relative to the battery station (10), such that the battery station (10) is able to load and unload the battery (400),
b) maximum incorrect positioning of the battery station (10) relative to the battery (400), such that the battery station (10) is able to load and unload the battery (400).

D28. A battery station (10) in accordance with any of the preceding embodiments and with the features of embodiment D23, wherein the battery grabber element (350, 350A, 350B) further comprises at least one kinematic joint, preferably a plurality of kinematic joints, configured to increase the tolerable misalignment between the battery handling mechanism (300) and the battery (400) said tolerable misalignment comprising at least one of the following:
a) maximum incorrect positioning of the battery (400) relative to the battery station (10), such that the battery station (10) is able to load and unload the battery (400),
b) maximum incorrect positioning of the battery station (10) relative to the battery (400), such that the battery station (10) is able to load and unload the battery (400).

D29. A battery station (10) in accordance with any of the preceding embodiments and with the features of embodiment D23, wherein the battery grabber element (350, 350A, 350B) further comprises at least one kinematic joint and at least one flexural joint (360), configured to increase the tolerable misalignment between the battery handling mechanism (300) and the battery (400) said tolerable misalignment comprising at least one of the following:
a) maximum incorrect positioning of the battery (400) relative to the battery station (10), such that the battery station (10) is able to load and unload the battery (400),
b) maximum incorrect positioning of the battery station (10) relative to the battery (400), such that the battery station (10) is able to load and unload the battery (400).

D30. A battery station (10) in accordance with any of the preceding embodiments and with the features of embodiment D23, wherein the battery handling mechanism (300) further comprises at least one lifting mechanism (325), configured to move the battery grabber element (350, 350A, 350B) vertically and/or horizontally with respect to ground.

D31. A battery station (10) in accordance with the preceding embodiment, wherein the lifting mechanism (325) is configured as a scissor lift mechanism (325).

D32. A battery station (10) in accordance with any of the preceding embodiments and with the features of embodiment D30, wherein the lifting mechanism (325) is configured as a parallelogram lift mechanism (325A).

D33. A battery station (10) in accordance with any of the preceding embodiments and with the features of embodiment D23, wherein the battery handling mechanism (300) further comprises at least one actuator (327A), preferably a plurality of linear actuators (327A, 307, 327), such as 2 linear actuators (327A, 307) configured to move the battery grabber element (350, 350A, 350B) to any location within the reaching range of the battery handling mechanism (300).

D34. A battery station (10) in accordance with the preceding embodiment, wherein the linear actuators (327A, 307, 327) are configured to move the battery grabber element (350, 350A, 350B) in any direction within the reaching range of the battery handling mechanism (300).

Mobility of Battery Station

D35. A battery station (10) in accordance with any of the preceding embodiments, wherein the battery station (10) further comprises at least one wheel, preferably a plurality of wheels, such as 2 to 6 wheels, configured to facilitate the movement of battery station (10).

D36. A battery station (10) in accordance with the preceding embodiment wherein the battery station (10) is configured to be manually moved by an operator.

D37. A battery station (10) in accordance with any of the preceding embodiments and with the features of embodiment D35, wherein the battery station (10), further comprises a motor, wherein the motor is preferably configured to be remotely controlled by an operator.

D38. A battery station (10) in accordance with the preceding embodiment, wherein the battery station (10) is configured to autonomously and/or semi-autonomously move.

Including Plurality of Elements

D39. A battery station (10) in accordance with any of the preceding embodiments, wherein the battery station (10) comprises a plurality of battery charging units (132), such as 2 to 10 battery charging units (132), in accordance with any of the embodiments D16 to D21.

D40. A battery station (10) in accordance with any of the preceding embodiments, wherein the battery swapping station (10) comprises a plurality of battery handling mechanisms (300) in accordance with any of the embodiments D22 to D34.

Heating Element

D41. A battery station (10) in accordance with any of the preceding embodiments, wherein the battery station (10) comprises a heating element configured to produce and transfer heat to at least one of the battery station (10) and mobile robot (20).

Localization Element as a Camera

D42. A battery station (10) in accordance with any of the preceding embodiments, wherein the localization element (343) comprises a camera (343).

D43. A battery station (10) according to the preceding embodiment, wherein the camera (343) is configured to capture at least one image of the battery (400) of the mobile robot (20), wherein the mobile robot (20) is positioned in the battery load/unload position (115).

D44. A battery station (10) according to the preceding embodiment, wherein the at least one image captured by the camera (343) is provided to a data processing device, such as to a controller of the battery station (10), said data processing device configured to process the at least one image captured by the camera (343) for the purpose of detecting at least one of the presence and position of the battery (400) on the at least one image.

Battery Presence Detector

D45. A battery station (10) according to any of the preceding embodiments and with the features of embodiment D22, wherein the battery station (10) comprises a battery presence detector (359) configured to detect whether or not the battery handling mechanism (300) grabs the battery (400).

D46. A battery station (10) according to the preceding embodiment, wherein the battery presence detector (359) comprises a switch cover (3594) flexible attached to a battery presence detector frame (3593) by at least one flexible attachment (3592), preferably four flexible attachments (3592).

D47. A battery station (10) according to the preceding embodiment, wherein the switch cover (3594) covers a switch and can assume at least two positions, such that on at least one of the positions the switch cover (3594) contacts and preferably presses the switch to activate it and/or on at least one other position the switch cover (3594) does not contact the switch, thus deactivating it.

D48. A battery station (10) according to the preceding embodiments, wherein the said switch when activated allows the flow of an electrical signal through it.

D49. A battery station (10) according to any of the preceding four embodiments and with the features of embodiment D23, wherein the battery presence detector (359) is mounted or attached to the battery grabber element (350).

D50. A battery station (10) according to any of the preceding five embodiments, wherein the battery presence detector comprises a force sensor, such as a force sensitive resistor.

High Friction Material

D51. A battery station (10) according to any of the preceding embodiments, wherein the surface of the battery station (10), preferably the surface of the battery station (10) the mobile robot (20) can drive on, such as the surface of the battery station (10) on the battery load/unload position (115) comprise a high friction material and/or high friction surface (1150).

D52. A battery station (10) according to the preceding embodiment, wherein the high friction material (1150) is configured to increase the friction coefficient of the contact surface between the mobile robot (20), preferably wheels of the mobile robot (20) and the battery station (10).

System Embodiments

S1. A system for swapping and/or charging at least one battery (400) comprising:
  a) at least one battery station (10) in accordance with any of the embodiments D1 to D52;
  b) at least one mobile robot (20) comprising at least one battery (400).

S2. A system in accordance with the preceding embodiment, wherein the battery station (10) comprises a battery load/unload position (115) configured to facilitate the service of the mobile robot (20) by the battery station (10).

S3. A system in accordance with any of the preceding embodiments S1 to S2, wherein the mobile robot (20) is configured to seek service from the at least one battery station (10) when the energy level of the at least one batteries (400) of the robot (20) is below a threshold level, said threshold level being preferably programmable onto the at least one robot (20).

S4. A system in accordance with any of the preceding embodiments S1 to S3, wherein the mobile robot (20) is configured to seek service from the at least one battery station (10) when the service life of the battery (400) is over, such as it has reached a predefined number of charge—discharge cycles.

S5. A system in accordance with any of the preceding embodiments S1 to S4, wherein the mobile robot (20) is configured to seek service from the at least one battery station (10) when the battery (400) is malfunctioning, such as it does not work properly.

Optical Sensor+Guiding Element

S6. A system in accordance with any of the preceding embodiments S1 to S5, wherein
  a) the at least one battery station (10) comprises at least one guiding element (105) in accordance with any of the embodiments D4 to D7, and
  b) the at least one mobile robot (20) further comprises at least one of optical sensor (812) and camera (812), configured to sense the guiding element (105) of the battery station (10).

S7. A system in accordance with any of the preceding embodiments S1 to S6 and with the features of embodiment S2, and with the features of embodiment S6, wherein the mobile robot (20) senses the guiding element (105) to approach the battery load/unload position (115).

Localization Element+Battery+Robot Battery Holder

S8. A system in accordance with any of the preceding embodiments S1 to S7 and with the features of embodiment S2, wherein the battery station (10) is configured to perform at least one of the following:
  a) detect a battery (400) of the mobile robot (20), when the mobile robot (20) is positioned at the battery load/unload position (115),
  b) locate a battery (400) of the mobile robot (20), when the mobile robot (20) is positioned at the battery load/unload position (115).
S9. A system in accordance with the preceding embodiment, wherein the battery station (10) comprises a localization element (343) in accordance with any of the embodiments D8 to D15 and wherein the localization element (343) is configured to detect and/or locate a battery (400) of the mobile robot (20), when the mobile robot (20) is positioned at the battery load/unload position (115).
S10. A system in accordance with any of the preceding embodiments S1 to S9, wherein the mobile robot (20) comprises a robot battery holder (602) comprising a fixing element (610) configured to hold the battery (400) attached to the mobile robot (20)
S11. A system in accordance with the preceding embodiment and with the features of embodiment S2, wherein the battery station (10) comprises a localization element (343) in accordance with any of the embodiments D8 to D15 and wherein the localization element (343) is configured to detect and/or locate a robot battery holder (602) of a mobile robot (20), when the mobile robot (20) is positioned in the battery load/unload position (115).

Operations of Battery Swapping Station on Mobile Robot

S12. A system in accordance with any of the preceding embodiments S1 to S11 and with the features of embodiment S2, wherein the battery station (10) is configured to load and/or unload a battery (400) from the mobile robot (20), when the mobile robot (20) is positioned at the battery load/unload position (115), preferably unload a discharged battery from the mobile robot (20) and/or load a charged battery (400) to the mobile robot (20).
S13. A system in accordance with any of the preceding embodiments S1 to S12, and with the features of embodiment S2, wherein the battery station is configured to load, unload and/or charge a battery (400) of a mobile robot (20) when the mobile robot (20) is positioned in at the battery load/unload position (115), preferably unload a discharged battery from the mobile robot (20) and/or load a charged battery (400) to the mobile robot (20) and/or charge the said unloaded discharged battery (400) from the mobile robot (20).

System With/Without a Server

S14. A system in accordance with any of the preceding embodiments S1 to S13, wherein the mobile robot (20) and the battery station (10) are configured to communicate with each other in order to facilitate the battery swapping and/or charging process of the battery (400) of the mobile robot (20) by the battery station (10).
S15. A system in accordance with any of the preceding embodiments S1 to S14, wherein the system further comprises at least one server (90).
S16. A system in accordance with the preceding embodiment, wherein the mobile robot (20) is configured to communicate with the server (90) in order to facilitate the battery swapping and/or charging process of the battery (400) of the mobile robot (20) by the battery station (10).
S17. A system in accordance with any of the preceding embodiments S1 to S16 and with the features of embodiment S15, wherein the battery station (10) is configured to communicate with the server (90) in order to facilitate the battery swapping and/or charging process of the battery (400) of the mobile robot (20) by the battery station (10).

System with a Hub

S18. A system in accordance with any of the preceding embodiments S1 to S17, wherein the system further comprises a hub (80) and wherein the hub (80) comprises at least one battery station (10) and the hub (80) is configured to serve, house, and/or maintain the at least one mobile robot (20).
S19. A system in accordance with the preceding embodiment, wherein the at least one battery station (10) is integrated in the floor (801) of said hub (80), such that the top surface and/or the guiding element (105) of the battery station (10) are not covered by the floor (801).

Mobile Robot

S20. A system in accordance with any of the preceding embodiments S1 to S19, wherein the mobile robot (20) is autonomous and/or semi-autonomous.
S21. A system in accordance with any of the preceding embodiments S1 to S20, wherein the mobile robot (20) is used for delivery purposes.
S22. A system in accordance with any of the preceding embodiments S1 to S21, wherein the mobile robot (20) further comprises a space for holding at least one delivery.
S23. A system in accordance with any of the preceding embodiments S1 to S22, wherein the robot (20) further comprises a wheel mechanism comprising at least four wheels that are configured for land-based motion.
S24. A system in accordance with any of the preceding embodiments S1 to S23, wherein the mobile robot (20) is configured to travel with a speed of no more than 10 km/h, or no more than 8 km/h, or no more than 6 km/h, preferably between 3 and 6 km/h, more preferably between 4 and 5 km/h.
S25. A system in accordance with any of the preceding embodiments S1 to S24, wherein the mobile robot (20) comprises at least one optical sensor.
S26. A system in accordance with any of the preceding embodiments S1 to S25, wherein the mobile robot (20) comprises at least one camera.

Localization Element as a Camera

S27. A system according to any of the preceding embodiments S1 to S26, wherein the battery station (10)

comprises a localization element (343) comprising a camera (343) according to any of the embodiments D42 to D44.

S28. A system according to the preceding embodiment, wherein the camera (343) is configured to capture at least one image of the at least one battery (400) of the mobile robot (20).

S29. A system according to any of the preceding two embodiments, wherein the at least one battery (400) of the mobile robot (20) comprises a recognizable pattern (3436) comprising a distinctive feature, such as a distinctive color, that can be detected by the camera (343).

Method Embodiments

M1. A method for swapping and/or charging a mobile robot battery (400) comprising the steps of:
 a) providing at least one battery station (10) in accordance with any of the embodiments D1 to D51, and at least one mobile robot (20) comprising at least one battery (400) and at least one robot battery holder (602);
 b) positioning the at least one robot (20) in the battery load/unload position (115);
 c) locating the at least one battery (400) of the at least one mobile robot (20);
 d) unloading a discharged battery (400) from the at least one mobile robot (20);
 e) transporting and loading the discharged battery (400) to an unoccupied charging unit (132);
 f) unloading a charged battery (400) from the at least one occupied battery charging unit (132); and
 g) transporting and loading the charged battery (400) to the at least one mobile robot (20).

Guiding to the Battery Load/Unload Position (115)

M2. A method in accordance with the preceding embodiment, wherein the battery station (10) comprises a guiding element (105) in accordance with any of the embodiments D4 to D7, and wherein the mobile robot (20) comprise at least one optical sensor (812), and/or at least one camera (812), configured to sense the guiding element (105).

M3. A method in accordance with the preceding embodiment, wherein the mobile robot (20) moves to the battery load/unload position (115) by sensing the guiding element (105) with the at least one optical sensor (812) and/or camera (812).

Locating the Battery (400)

M4. A method in accordance with any of the preceding embodiments M1 to M3, wherein the battery station (10) comprises a localization element (343), in accordance with any of the preceding embodiments D8 to D15, configured to at least one of detect and locate a localization target (700), the localization target (700) comprising at least one of:
 a) the mobile robot (20) positioned in the battery load/unload position (115),
 b) the battery (400) of the mobile robot (20) positioned in the battery load/unload position (115).

M5. A method in accordance with the preceding embodiment, wherein the process of locating the localization target (700) comprises the steps of:
 a) the localization element (343) scanning the mobile robot (20), preferably part of the mobile robot (20) surrounding the battery (400) attached to the mobile robot (20) by emitting electromagnetic waves, preferably oscillating electromagnetic waves,
 b) the localization element (343) continuously measuring changes in the emitted electromagnetic field,
 c) the localization element (343) detecting the changes of the emitted electromagnetic field caused by the presence of the localization target (700) within the sensing range (515), and
 d) the localization element (343) calculating the position of the localization target (700) with a possible error of less than 8 mm, preferably less than 5 mm, more preferably less than 2 mm.

M6. A method in accordance with embodiment M4, wherein the process of locating the localization target (700) comprises the steps of:
 a) the localization element (343) emitting electromagnetic waves towards the surface of the mobile robot (20) comprising the battery (400) and towards the battery (400),
 b) the surface of the mobile robot comprising the battery (400) and the battery (400) reflecting the emitted electromagnetic waves by the localization element (343),
 c) the localization element (343) receiving and measuring the reflected electromagnetic waves,
 d) the localization element (343) categorizing the reflected electromagnetic waves as being reflected by the battery (400) and as being not reflected by the battery (400),
 e) the localization element (343) calculating the position of the localization target (700) with a possible error less than 8 mm, preferably less than 5 mm, more preferably less than 2 mm.

Swapping the Battery (400)

M7. A method in accordance with any of the preceding embodiments M1 to M6, wherein the battery station (10) further comprises a battery handling mechanism (300) and a battery grabber element (350, 350A, 350B) in accordance with any of the embodiments D23 to D34.

M8. A method in accordance with the preceding embodiment, wherein the mobile robot (20) further comprises a robot battery holder (602) comprising a fixing element (610) configured to hold the battery (400) attached to the mobile robot (20) and wherein the grabber element (350, 350A, 350B) is configured to unlatch the battery (400) from the fixing element (610) of the robot battery holder (602).

M9. A method in accordance with any of the preceding embodiments M1 to M8 and with the features of embodiment M7, wherein the battery charging unit (132) further comprises a station battery holder (600) and a fixing element (610) in accordance with any of the embodiments D17 to D19 and wherein the grabber element (350, 350A, 350B) is configured to unlatch the battery (400) from the fixing element (610) of the at least one station battery holder (600).

M10. A method in accordance with any of the preceding embodiments M1 to M9 and with features of embodiments M7 and M8, wherein the battery handling mechanism (300) unloads the battery (400) from the mobile robot (20), wherein the process of unloading a battery (400) from a mobile robot (20) comprises the steps of:
- a) the battery handling mechanism (300) positioning the battery grabber element (350, 350A, 350B) in the robot battery holder (602),
- b) the battery grabber element (350, 350A, 350B) grabbing the battery (400) positioned in the robot battery holder (602),
- c) the battery grabber element (350, 350A, 350B) unlatching the battery (400) from the fixing element (610) of the robot battery holder (602),
- d) the battery handling mechanism (300) moving the battery grabber element (350, 350A, 350B) holding the battery (400) away from the robot battery holder (602).

M11. A method in accordance with any of the preceding embodiments M1 to M10 and with features of embodiment M7, wherein the battery handling mechanism (300) transports the grabbed battery (400) to an unoccupied charging unit (132), wherein the process of transporting a battery (400) to an unoccupied charging unit (132) comprises the steps of:
- a) providing at least one controller unit configured to facilitate the operations of the battery station (10),
- b) the at least one controller unit of battery station (10) checking the battery charging units (132) whether they are occupied by a battery (400) and/or whether they are not occupied by a battery (400),
- c) the at least one controller unit of the battery station (10) finding an unoccupied battery charging unit (132),
- d) the at least one controller unit of the battery station (10) providing the coordinates of the unoccupied charging unit (132) to the battery handling mechanism (300),
- e) the battery handling mechanism (300) positioning the battery grabber element (350, 350A, 350B) holding a battery (400) in the unoccupied charging unit (132).

M12. A method in accordance with any of the preceding embodiments M1 to M11 and with the features of embodiments M7 and M9, wherein the battery grabber element (350, 350A, 350B) loads the grabbed battery (400) to the said unoccupied charging unit (132) and wherein the process of loading a battery (400) to an unoccupied charging unit (132) comprises the steps of:
- a) the battery handling mechanism (300) positioning the battery grabber element (350, 350A, 350B) holding a battery (400) in the station battery holder (600) of the unoccupied charging unit (132),
- b) the battery grabber element (350, 350A, 350B) latching the battery (400) in the fixing element (610) of the station battery holder (600) of the unoccupied charging unit (132),
- c) the battery grabber element (350, 350A, 350B) releasing the battery (400).

M13. A method in accordance with any of the preceding embodiments M1 to M12 and with the features of embodiment M7, wherein the battery handling mechanism (300) transports the battery grabber element (350, 350A, 350B) to a battery charging unit (132) being occupied by a charged battery (400), wherein the process of transporting a battery (400) to an occupied charging unit (132) comprises the steps of:
- a) providing at least one controller unit configured to facilitate the operations of the battery station (10),
- b) the at least one controller unit of battery station (10) checking the battery charging units (132) whether they are occupied by a charged battery (400) and/or whether they are not occupied by a charged battery (400),
- c) the at least one controller unit of the battery station (10) finding a battery charging unit (132) occupied by a charged battery (400),
- d) the at least one controller unit of the battery station (10) providing the coordinates of the battery charging unit (132) occupied by a charged battery (400) to the battery handling mechanism (300),
- e) the battery handling mechanism (300) positioning the battery grabber element (350, 350A, 350B) in the battery charging unit (132) occupied by a charged battery (400).

M14. A method in accordance with any of the preceding embodiments M1 to M13 and with the features of embodiment M7 and M9, wherein the battery handling mechanism (300) unloads the charged battery (400) from the battery charging unit (132), wherein the process of unloading a battery from a charging unit (132) comprises the steps of:
- a) the battery handling mechanism (300) positioning the battery grabber element (350, 350A, 350B) in the station battery holder (600) of the charging unit (132) occupied by a battery (400),
- b) the battery grabber element (350, 350A, 350B) grabbing the battery (400) positioned in the said station battery holder (600),
- c) the battery grabber element (350, 350A, 350B) unlatching the battery (400) from the fixing element (610) of the said station battery holder (600),
- d) the battery handling mechanism (300) moving the battery grabber element (350, 350A, 350B) holding the battery (400) away from the station battery holder (600).

M15. A method in accordance with any of the preceding embodiments M1 to M14, and with the features of embodiment M7 and M8, wherein the battery handling mechanism (300) transports the battery grabber element (350, 350A, 350B) holding a charged battery (400) to the robot battery holder (602), wherein the process of transporting a battery (400) to a mobile robot (20) comprises the steps of:
- a) providing at least one controller unit configured to facilitate the operations of the battery station (10),
- b) the at least one controller unit of the battery station (10) providing the position of the robot battery holder (602) to the battery handling mechanism (300) by providing the position obtained in step M5 to the battery handling mechanism (300),
- c) the battery handling mechanism (300) positioning the battery grabber element (350, 350A, 350B) holding a charged battery (400) to the robot battery holder (602).

M16. A method in accordance with any of the preceding embodiments M1 to M15, and with the features of embodiments M4 and M8, wherein the localization element (343) is further configured to locate the at least one robot battery holder (602) of the mobile robot (20).

M17. A method in accordance with any of the preceding embodiments M1 to M16 and with the features of embodiment M7 and M8, wherein the grabber element (350, 350A, 350B) loads the charged battery (400) to the at least one robot battery holder (602) of the mobile robot (20) and wherein the process of loading a battery to a mobile robot (20) comprises the steps of:
a) the battery handling mechanism (300) positioning the battery grabber element (350, 350A, 350B) holding a battery (400) in the robot battery holder (602),
b) the battery grabber element (350, 350A, 350B) latching the battery (400) in the fixing element (610) of the robot battery holder (602),
c) the battery grabber element (350, 350A, 350B) releasing the battery (400).

Initiating Charging Process

M18. A method in accordance with any of the preceding embodiments M1 to M17 further comprising the battery station (10) initiating the charging process of the discharged batteries (400) in the charging unit (132).

Server

M19. A method in accordance with any of the preceding embodiments M1 to M18, wherein further a server (90) is provided.
M20. A method in accordance with the preceding embodiment wherein the server (90) communicates with the at least one mobile robot (20) and with the at least one battery station (10) to facilitate the battery swapping and/or charging process.

Locating the Battery with Camera

M21. A method according to any of the preceding embodiments wherein the battery station (10) comprises a camera (343) capturing at least one image of the battery (400) of the mobile robot (20) positioned in the battery load/unload position (115).
M22. A method according to the preceding embodiment, comprising processing, by a data processing device, the at least one image captured by the camera (343).
M23. A method according to the preceding embodiment, comprising the data processing device determining at least one of presence and position of the battery (400) on the at least one captured image by camera (343).

High Friction Material

M24. A method according to any of the preceding embodiment, comprising facilitating the positioning of the mobile robot (20) on the battery load/unload position (115) by providing a high friction material (1150) on and/or in the surface and/or high friction surface of the battery station (10) contacted by the mobile robot (20).

Battery Presence Detector

M25. A method according to any of the preceding embodiments, wherein the battery station comprises a battery presence detector (359) providing a feedback when the battery station (10) loads and/or unloads the battery (400) from the mobile robot (10).
M26. A method according to the preceding embodiment and with the features of embodiment M10, the method further comprising providing a feedback signal during step b) of embodiment M10,—i.e. when the battery grabber element (350, 350A, 350B) grabbing the battery (400) positioned in the robot battery holder (602), is performed.
M27. A method according to any of the two preceding embodiment and with the features of embodiment M12, the method further comprising providing a feedback signal during step c) of embodiment M12,—i.e. when the battery grabber element (350, 350A, 350B) releasing the battery (400), is performed.
M28. A method according to any of the three preceding embodiment and with the features of embodiment M14, the method further comprising providing a feedback signal during step b) of embodiment M14,—i.e. when the battery grabber element (350, 350A, 350B) grabbing the battery (400) positioned in the said station battery holder (600), is performed.
M29. A method according to any of the four preceding embodiment and with the features of embodiment M17, the method further comprising providing a feedback signal during step c) of embodiment M17,—i.e. when the battery grabber element (350, 350A, 350B) releasing the battery (400), is performed.

BRIEF DESCRIPTION OF THE DRAWINGS

The drawings shown and described below serve for illustration purposes only. They illustrate specific embodiments of the invention and do not intend to limit the scope of the present teachings in any way.

DESCRIPTION OF VARIOUS EMBODIMENTS

In this section, exemplary embodiments of the battery station 10 will be described, referring to the figures. These examples are given to only provide further understanding of the invention and do not intend to limit the scope of the present teaching in any way.

In the following description, a series of features and/or steps are described. The skilled person will appreciate that unless required by the context, the order of features and steps is not critical for the resulting configuration and its effect. Further, it will be apparent to the skilled person that irrespective of the order of features and steps, time delays between steps can be present between some or all of the described steps.

Figure 1A:
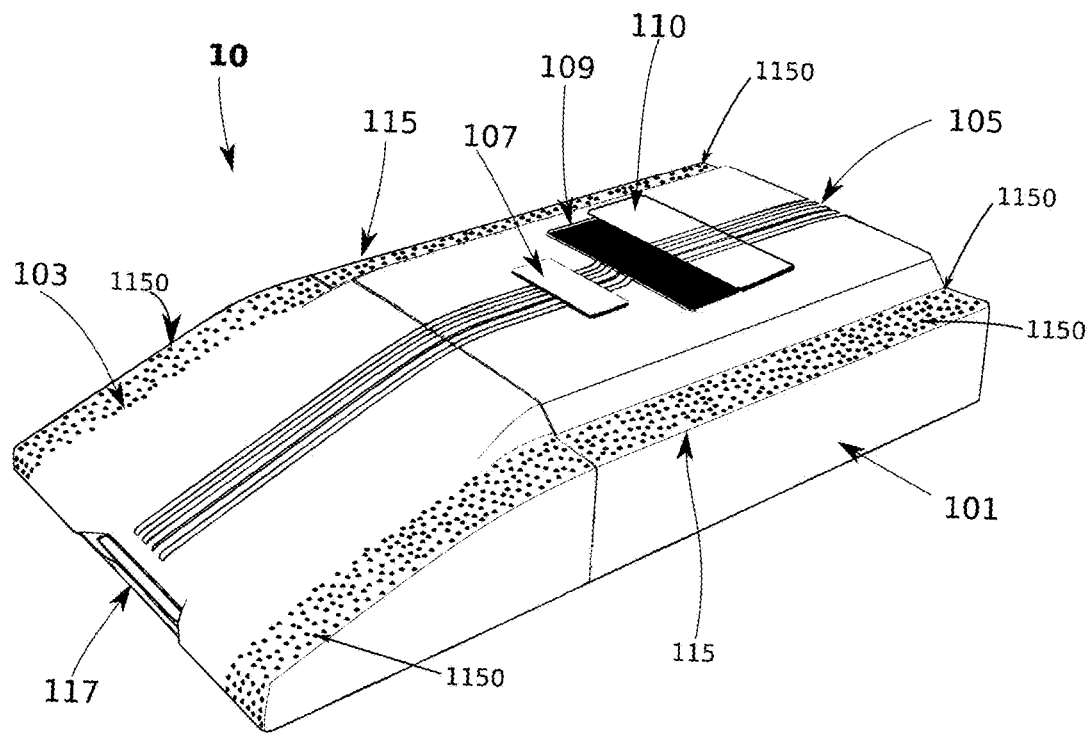
FIG. 1A shows a perspective view of an embodiment of a battery station.

FIG. 1A depicts an outer perspective view of an embodiment of the battery station 10. Throughout the text, to keep the sentences clear and not overloaded, the battery station 10 may be referred to as station 10. The embodiment of the station 10 as depicted in FIG. 1A, may comprise a station body 101 encapsulating inner elements of station 10. The station body 101 can be a rigid material adapted to support the weight of a mobile robot 20 (shown in FIG. 7A) that can be serviced by the station 10. The station body 101 may comprise plastic material, such as acrylonitrile butadiene styrene (ABS). Further, the station body 101 may comprise a thickness in the range of 2 to 5 mm, such as 3 mm.

In the front section of the station 10 a ramp 103 can be attached to the station body 101. The ramp 103 can assume a closed position and an open position (not shown in the figure). Further the ramp 103 may comprise a handle element 117. The handle element 117 can be adapted to open the ramp 103 such that inner elements of station 10 can be accessed by an operator. The handle element 117 can be further adapted to keep the ramp 103 fixed to the station body 101 when the ramp 103 assumes a closed position. The handle element 117 can be further adapted to remove the ramp 103 from the station body 101. In another embodiment of station 10, the ramp 103 may be a continuation of the station body 101 (i.e. there can be no distinct separation between ramp 103 and station body 101). In yet another embodiment, station 10 may not comprise the ramp 103. The ramp 103 can be inclined from the top of the station 10 to the ground such that the mobile robot 20 can easily approach station 10 to a battery load/unload position 115 (refer to FIG. 1B).

The battery load/unload position 115 can be a position configured to facilitate the operation of the station 10 on the mobile robot 20 such as the loading and unloading of the battery 400 to and from a mobile robot 20. That is, the battery load/unload position 115 can be a position configured such that, when the mobile robot 20 can be positioned in the battery load/unload position 115, the at least one of the batteries 400 of the mobile robot 20 can be aligned with the battery station 10, within a misalignment range of 0.1-2 cm, such as 1 cm. In a specific embodiment, the battery load/unload position 115 can be a position where the center of the battery 400 of the mobile robot 20 can be aligned with the center of the surface opening 109 of the station 10 in the X and Y coordinates, i.e. the center of the battery 400 of the mobile robot 20 can comprise the same X and Y coordinate with the center of the surface opening 109, when the mobile robot 20 can be positioned in the battery load/unload position 115 (refer to the reference axis provided in FIG. 1B).

According to an embodiment, station 10 can be configured to facilitate the positioning of the mobile robot in the battery load/unload position 115. In such embodiments, the station 10 can further comprise at least one guiding element 105, preferably a plurality of guiding elements 105. The guiding elements 105 can be adapted to facilitate the positioning of the mobile robot 20 to the battery load/unload position 115. In a preferred embodiment, the guiding elements 105 can comprise at least one marker 105, preferably a plurality of optical markers 105. In a more preferred embodiment, the at least one guiding element 105 can be configured as a straight line 105, preferably as a plurality of straight lines 105. The station 10 can preferably comprise 2 to 10 straight lines that can be configured to indicate the battery load/unload position 115. The horizontal lines 105 can comprise colors preferably distinguishable from the colors of station body 101. In an exemplary embodiment, the station body 101 may comprise a dark grey color, and the horizontal lines 105 may comprise white or bright yellow color. The mobile robot 20, by means of optical sensors and/or cameras 812 (refer to FIG. 7A), can be adapted to sense the horizontal lines 105 and can continue to drive until it cannot sense the horizontal lines 105 anymore. Lengths of the horizontal lines 105 can be adapted such that to direct the mobile robot 20 to the battery load/unload position 115.

In some embodiments, the straight lines 105 can be configured as an identifier for the battery station 10 or for a specific group of battery stations 10. That is, the battery station 10 or a specific group of battery stations 10 can comprise a specific width of any of the plurality of straight lines 105. The battery station 10, or a specific group of battery stations 10 can also comprise a specific length of any of the plurality of straight lines 10. The battery station 10 or a specific group of battery stations 10 can also comprise a specific distance between any of the plurality of straight lines 105. The battery station 10 or a specific group of battery stations 10 can comprise a specific color of any of the plurality of straight lines 105. The battery station 10 or a specific group of battery stations 10 can also comprise a specific number of straight lines 105. Such a feature of the straight lines 105 can be advantageous for the battery station 10 and preferably for the mobile robot 20, as it can uniquely identify a battery station 10, or a specific group of battery stations 10. Thus, the mobile robot 20 can know which of the battery station 10 or which group of the battery stations 10 it is using. The straight lines 10 configured as a battery station identifier can also be advantageous, as they avoid the need of implementing a separate identifier on the battery station 10 by integrating it into the plurality of the straight lines 105.

Additionally, the positioning of the mobile robot 20 in the battery load/unload position 115 can be facilitated by the high friction material 1150 or a high friction surface topography etc. The high friction material 1150 can be placed on the surface of the battery station 10, more preferably, on the surface of the battery station 10 that can be contacted by the wheels of mobile robot 20 (see FIG. 7A for more details on the mobile robot 20). As depicted in FIG. 1A, the high friction material 1150 can cover part of or all of the battery load/unload position 115 of station 10. Additionally or alternatively, the high friction material 1150 can cover part or all of the ramp 103, preferably part of the ramp 103 wherein it can be expected for the wheels of the robot 20 to contact the ramp 103, such as, on the sides of the ramp 103 as depicted in FIG. 1A.

The high friction material 1150 can comprise a material with a high friction coefficient. Thus, the high friction material 1150 positioned between the battery station 10 and the wheels of the mobile robot 20, while the mobile robot 20 drives on the battery station 10, can provide a contact surface with a higher friction coefficient between the station 10 and the robot 20—as compared to the case when the high friction coefficient 1150 is not provided. This may result in the reduction or elimination of slippage of the wheels 806 of the mobile robot 20 (see FIG. 7A) while driving on the station 10, which in turn ca facilitate a more accurate positioning of the mobile robot 20 on the battery load/unload position 115. For example, the mobile robot 20 may use, among other sensors, an odometer for measuring the distance it travels based on wheel rotations. Slippage of the wheels of robot 20, cause "empty rotations", that is, part of rotation of the wheels of the robot 20 does not contribute on movement of the robot 20. Hence, the data received by the odometer may lose accuracy in instances of wheel slippages, which can cause an inaccurate positioning of the robot 20 on the load/unload position 115. However, the application of the high friction material 1150 on the surface of the station 10 that can be contacted by wheels of robot 20, can reduce or eliminate slippage of wheels of the robot 20, and thus, contributing on a better positioning of the robot 20 on the battery load/unload position 115.

The high friction material 1150 can be applied on the surface of station 10 like an ink, adhesive and/or layer 1150 configured for comprising a high friction coefficient. For example, the ink or layer 1150 can create a non-smooth surface on top of or adhered to the surface of station 10 wherein it can be applied on. The surface of the station 10 that can be contacted by the robot 20, such as, on the sides of the ramp 103 and the battery load/unload position 115, can be treated or painted with the ink 1150 or a layer 1150 can be adhered therein, hence resulting in a less smooth surface with a higher friction coefficient 1150.

Further, the battery station 10 can comprise a surface opening 109 that can be adapted to allow a battery handling mechanism 300, which may also be referred to as handling mechanism 300 (refer to FIG. 4A, 4B) to access the battery 400 (refer to FIG. 2A, 2B, 2C) of the robot 20, when the robot 20 is positioned in the battery load/unload position 115. In an embodiment of station 10, the surface opening 109 can be further adapted to allow the battery 400 pass through it, i.e. the surface opening 109 comprises dimensions slightly bigger or bigger than the battery 400, such that the battery handling mechanism 300, can at least one of load and unload the battery 400 from the mobile robot 20.

Further, the surface opening 109 may comprise a covering element 110. The covering element 110 of the surface opening 109 can be adapted to prevent external objects such as dust, mud, stones, etc., from entering inside the station 10. Such external objects may damage the inner elements of the station 10, if allowed entry. Thus, to make station 10 more robust to such damages from external objects, the covering element 110 can be provided. The covering element 110 can also secure that unauthorized persons access the inner elements of station 10. The covering element 110 can assume an open and a closed position. In FIG. 1A only the open position of the covering element 110 is shown, i.e. the covering element 110 can slide over the surface of the battery station 10, thus opening or uncovering the top opening 109. When the covering element 110 is in the open position, the battery 400 and the handling mechanism 300 can pass through the surface opening 109. When the covering element 110 is in the closed position, it covers the surface opening 109, thus isolating the inside of station 10 from the outside. In one embodiment, the covering element 110 can be attached by one of its edges to the corresponding edge of the surface opening 109 by means of a rotational joint (not shown). In such an embodiment, the covering element 110 can rotate with respect to the edge of joint, thus opening and closing the surface opening 109. In another embodiment, the covering element 110 of the surface opening 109 can slide beneath the surface of station 10 to assume the said opening position. In yet another embodiment, as depicted in FIG. 1A, the covering element 110 can slide over the surface of the battery station 10 to assume the opening position—i.e. to uncover or open the top opening 109.

In one embodiment, the covering element 110 of station 10 can be opened by the handling mechanism 300. When the handling mechanism 300 approaches the surface opening 109, it can apply a force on the covering element 110, thus forcing it to open. In such embodiments, the covering element 110 can be adapted to easily open i.e. a small force is required to open it, so that the structure of the station 10 and/or handling mechanism 300 cannot be damaged. In another embodiment, the covering element 110 can be automatically controlled by the controllers of station 10. In such embodiments, moving actuators (not shown) can be provided for the covering element 110, which can be controlled by the controllers of station 10 to open and/or close the covering element 110.

Station 10 can further comprise an identification element 107. The identification element 107 can be adapted to be read by the mobile robot 20 such that the mobile robot 20 can recognize at which station 10 it is currently located. In a preferred embodiment, each station 10 or each group of stations 10 can comprise a unique identification element 107. The identification element 107 preferably can be a QR code 107 that can be read by optical sensors and/or cameras 812 of the mobile robot 20.

Station 10 can further comprise a plurality of wheels (not shown) attached to the bottom of the station body 101 such that the station 10 can be moved freely and/or in a guided manner. Station 10 may comprise a motor (not shown) which would further facilitate the movements of the station 10. In another embodiment, the station 10 may be remotely controlled by an operator. In yet another embodiment, the station 10 can be adapted to move autonomously or semi-autonomously. In a hazard situation, the battery 400 of the mobile robot 20 can drain below the expected energy level required for the robot 20 to approach a hub 80, or a station 10. In such a situation, an operator can remotely control station 10, to approach the said mobile robot 20 with the drained battery 400 and/or the station 10 can semi-autonomously drive to the location of the said mobile robot 20. When station 10 approaches the said robot 20, the battery swapping procedure (described below) can initiate. A hazard situation can also be a situation when the battery 400 malfunctions.

Typical dimensions of the station 10 may be as follows. Width: 30 to 100 cm, preferably 50 to 70 cm. Height: 15 to 35 cm, preferably 20 to 25 cm. Length: 50 to 150 cm, preferably 80 to 110 cm.

Figure 1B:
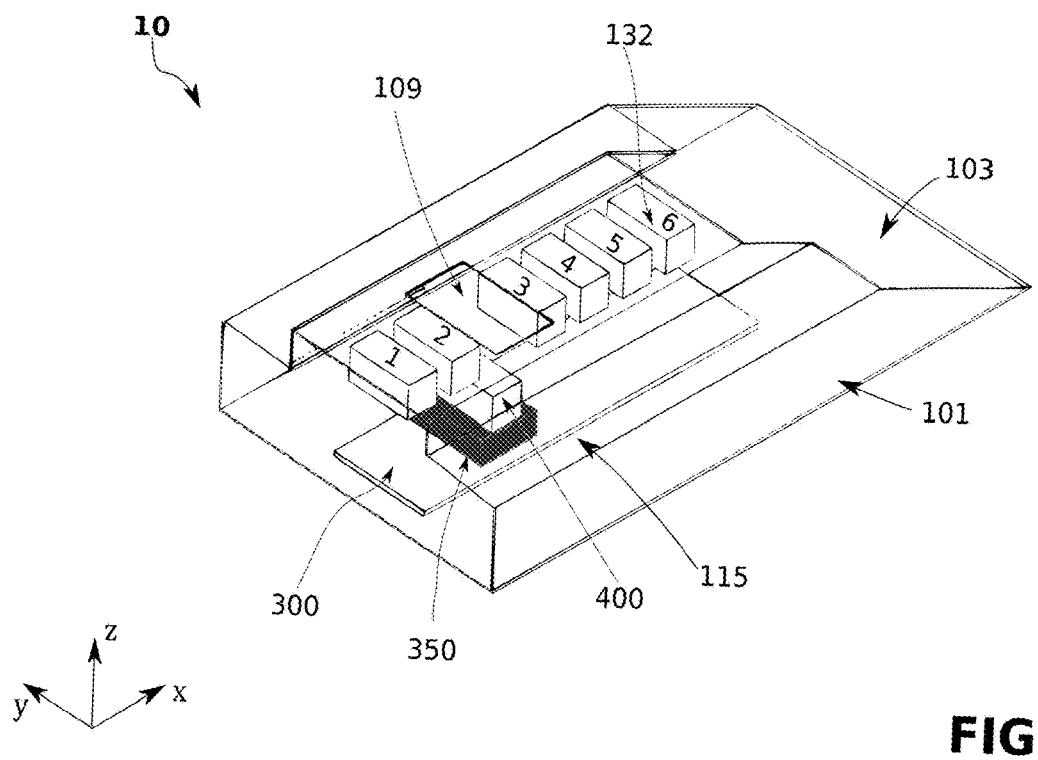
FIG. 1B shows an inner perspective view of an embodiment of the battery station.

Referring now to FIG. 1B, an inner perspective view of an embodiment of station 10 is shown. In this figure, for a better illustration of the inner elements of station 10, the station body 101 and ramp 103 of station 10 are neglected and shown as transparent. Station 10 can comprise at least one battery charging unit 132, which can be also referred to as charging unit 132. In a preferred embodiment, station 10 can comprise a plurality of battery charging units 132, preferably 2-10 charging units 132, more preferably 3-5 charging units 132, such as 3 charging units 132. In FIG. 1B, station 10 comprises six battery charging units 132, numbered from 1 to 6. It should be noted that this numbering is done for illustration purposes only.

Battery charging units 132 can be adapted to at least one of hold and charge the batteries 400. That is, in an embodiment the battery charging units 132 can be configured to hold at least one battery 400, i.e. keep the battery 400 fixed to battery charging unit 132. In another embodiment, the battery charging unit 132 can be configured to charge the battery 400. In a preferred embodiment, the battery charging unit 132 can be configured for both hold and charge a battery 400.

Further, the battery charging unit 132 can be configured to charge the batteries 400 at variable rates, such as with variable charging currents. The charging rate can be adjustable to the charging unit 132, preferably at the beginning or during the battery 400 charging process. The charging rate can be adjusted by a remote operator. In an embodiment, the charging rate of the charging units 132 can also be adjusted by the controllers of the station 10. The charging rate can be chosen based on different factors such as: the capacity of the battery 400, temperature of the battery 400, temperature of the charging unit 132, required time for the battery 400 to be charged, etc. The battery charging units 132 can be preferably configured to charge with a minimum rate of 0.6 C to 4 bC, more preferably 1 C to 3 C, with C referring to the capacity of the battery 400 being charged, or with C referring to a battery capacity taken as a reference capacity. Thus, charging with lower rates, such as 0.6 C can require more time to charge the battery and, charging with higher rates, such as 4 C can require less time. Usually, charging with higher rates can have destructive effects on the batteries, such as reducing the lifetime of the battery. Thus, deciding on a charging rate can be a trade-off between considering battery health and reducing the time needed to charge the battery.

Further, the charging units 132 may indicate to the controller unit (not shown) of station 10 if they occupy a battery 400. A battery charging unit 132 that can be at least one of holding and charging a battery 400 can be referred to as an occupied charging unit 132. The charging units 132 may indicate to the controller unit (not shown) of station 10 if they do not occupy a battery 400. A battery charging unit 132 that is not holding and charging a battery 400 can be referred to as an unoccupied charging unit 132. The charging units 132 may also indicate to the controller of station 10 the charging level of the battery 400 they are occupying. Thus, the station 10 can know at every moment which of its battery charging units 132 is occupied by a battery 400 and at the same time can know which of the batteries 400 positioned in its charging units 132 are fully charged and can be used for swapping. The controller unit of station 10 can be programmed to use different algorithms for making the decision of assigning the current discharged battery 400, unloaded from the mobile robot 20, to a charging unit 132 or choosing a charged battery 400 from the charging unit 132 and loading it to the mobile robot 20. An example of such an algorithm can be First-In-First-Out (FIFO) algorithm, i.e. the first battery that finished the charging process will be used for the next battery swapping.

As depicted by FIG. 1B station 10 can further comprise a battery handling mechanism 300 preferably attached to the base of the station body 101. The handling mechanism 300 can be adapted to move the grabber element 350 a precise distance, in its reaching range, in the x, y, z directions as depicted by the reference axes shown in FIG. 1B. Said reaching range can be the space comprising the charging units 132 of charging station 10 and the battery 400 of a mobile robot 20 wherein said robot 20 is positioned in the battery load/unload position 115. Thus, given a specific point $p(x_1, y_1, z_1)$ in the reaching range of the handling mechanism 300, the handling mechanism 300 can position, the grabber element 350, for example the center point of the grabber element 350, at point $p(x_1, y_1, z_1)$, within the range of some positioning error E. The value of E depends on the actuators comprised by the battery handling mechanism 300. The positioning error E, should preferably be less than 10 mm, more preferably less than 5 mm, even more preferably less than 2 mm.

Figure 2A:
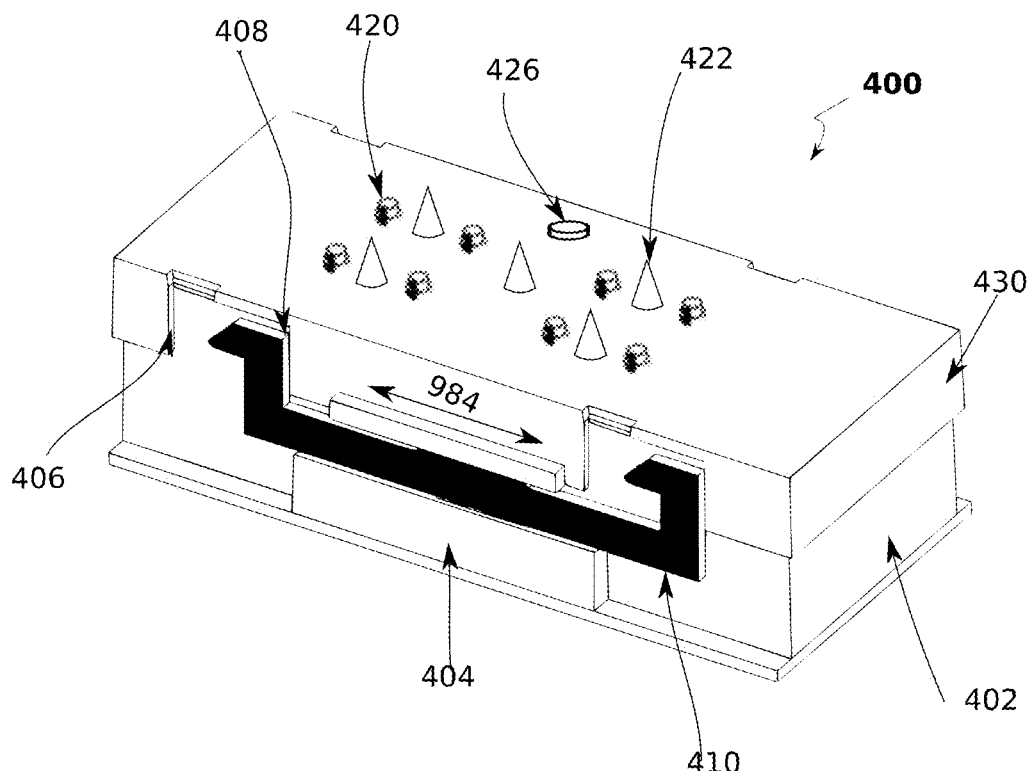
FIG. 2A shows an embodiment of a battery used with the battery station comprising rectangular pin layout.

Referring to FIG. 2A, an enlarged view of an embodiment of the battery 400 that can be used by station 10 is shown. Internal elements (not shown) of the battery 400 can be encapsulated by battery body 402. On the top the battery body 402 can comprise a battery lid 430. The battery lid 430 can be attached on the rest of the battery body 402. In an embodiment, the battery lid 430 can assume a closed and/or an open position (not shown). When the battery lid 430 assumes the closed position, it can cover the top surface of the battery body 402, thus enclosing the internal elements of the battery 400. When the battery lid 430 assumes the open position, the internal element of the battery 400 can be exposed. An operator can have access to the internal elements of the battery 400 and/or replace or fix the elements of the battery 400. In another embodiment of the battery 400, the battery lid 430 can be a continuation of the battery body 402, i.e. there can be no clear distinction between the battery body 402 and the battery lid 430. Yet in another embodiment the battery body 400 may not comprise a battery lid (430).

Further, the battery 400 can comprise a plurality of electrical connectors 420, preferably a plurality of electrical pins 420. In the embodiment depicted in FIG. 2A, the electrical connectors can be attached on the battery lid 430. These electrical pins 420 can be adapted to electrically connect the battery 400 with the battery charging units 132 and/or the mobile robot 20. They can be further adapted to provide extra support for the battery 400, damping to some level the vibrations of the battery 400 due to the movements of the mobile robot 20. In an embodiment, the station battery holder 600 and the robot battery holder 602 (refer to FIG. 3A, FIG. 3B) can comprise electrical contact points (not shown) configured to create contact with the electrical pins 420 when the battery 400 is positioned respectively in the station battery holder 600 or the robot battery holder 602. That is, in such embodiments, the electrical contact points can allow the station battery holder 600 and the robot battery holder 602 to electrically connect with the electrical pins 420, and thus the battery 400, when the battery 400 is positioned in the station battery holder 600, or the robot battery holder 602. In another embodiment, the station battery holder 600 and/or the robot battery holder 602 can comprise pin insertion places (not shown), where electrical pins 420 can be inserted to establish an electric connection between the battery 400 and respectively the station battery holder 600 or the robot battery holder 602. In another embodiment, the station battery holder 600 and the robot battery holder 602 can comprise a combination of the electrical contact points and pin insertion places, configured to establish an electric connection between the battery 400 and respectively the station battery holder 600 or the robot battery holder 602.

In one embodiment, the battery 400 can further comprise at least two damping pins 422. In a preferred embodiment, the battery 400 can comprise a plurality of damping pins 422. In the embodiment depicted in FIG. 2A, the battery 400 comprises a plurality of damping pins 422 attached in the battery lid 430. The at least two damping pins 422 can protrude from the battery body 402. The damping pins 422 comprise a distal top and a proximal base. The proximal base is located closer to the battery body 402 than the distal top. The minimum bounding circle of the proximal base is larger than the minimum bounding circle of the distal top. In a simple example, the damping pins 422 can be pyramid or cone shaped (or, preferably, shaped as a truncated cone or pyramid). However, the damping pins 422 can comprise different shapes, as long as the minimum bounding circle of the base is larger than that of the top. The minimum bounding circle refers to the smallest circle encapsulating the whole area of the base and the top respectively.

In an embodiment, the robot battery holder 602 and the station battery holders 600 can comprise a plurality of damping pin insertion places (not shown), where the damping pins 422 can be inserted. In another embodiment, the robot battery holder 602 and the station battery holder 600, may not comprise the damping pin insertion places. The damping pins 422 can be adapted to provide extra fixing means of the battery 400 to the robot battery holder 602 or the charging units 132 of station 10. The damping pins 422 can be adapted to damp possible vibrations of the battery 400 when the battery 400 can be attached to the mobile robot 20 or when attached to the charging units 132. As the mobile robot 20 moves, this can cause vibrations of the battery 400. These vibrations can damage the structure of the battery 400, for example, they can damage the electrical pins 420, the battery lid 430, the battery cells (not shown), the inner circuitry of the battery (not shown) etc. Particularly the electrical connectors 420 can, over time, deform the electronics they can be connected to if not balanced out by the damping pins 422. The same situation can happen when the battery 400 can be attached to one of the charging units of the station 10, where possible vibrations can be produced by the station 10 being in motion, by the operation of the station 10 etc. At the same time, these vibrations can also cause possible damages to the structure of the mobile robot 20 or charging units 132, more specifically to the robot battery holder 602 and/or to the station battery holder 600. Thus, to avoid these damages and/or to provide a longer life for the battery 400, robot 20 and/or station 10 the damping pins 422 can be provided. When the battery 400 can be attached to a robot battery holder 602 and/or station battery holder 600, the damping pins 422 can be inserted in their respective damping pin insertion places, consequently the battery will be attached to the battery holders 600 and/or 602 in a more fixed manner, thus it will be more robust to vibrations. Alternatively, no insertion places may be provided, and the damping pins 422 can compensate for the force applied by the electrical connectors 420.

Battery 400 can further comprise at least one battery status transmitter 426. In a preferred embodiment, the battery status transmitter can comprise an infrared transmitter and/or receiver 426, such as an infrared sensor 426. In the embodiment depicted in FIG. 2A, the battery status transmitter 426 can be attached to the battery lid 430. The battery status transmitter 426 can be adapted to transmit information related to the status of the battery 400. Such information can include the unique battery ID and/or the charging level of the battery 400, and/or other battery parameters such as charging cycles. The mobile robot 20 and/or the station 10 can be adapted to detect, sense and/or decode the information transmitted by the battery status transmitter 426. In the preferred embodiment, wherein the battery status transmitter 426 can comprise an infrared sensor 426, the mobile robot 20 and/or the station 10 can also comprise a second infrared sensor (not shown) adapted to detect, sense and/or decode the signals emitted by the battery infrared sensor 426. The information received can then be processed by the controller units of the mobile robot 20 and or the controller units of the charging station 10, to create a history for each of the batteries 400, to count the number of charge-discharge cycles that a certain battery 400 has experienced, to decide on the charging time of a certain battery 400 and/or to decide whether a battery requires service, etc. Other benefits of the battery status transmitter 426 are explained further in this document, with reference to the mobile robot 20, when describing FIG. 7A.

Further, the battery 400 can comprise a fixing unit 410, which may also be referred to as a latch/unlatch mechanism 410. In some embodiments, the battery 400 can comprise at least one fixing unit 410, preferably a plurality of fixing units 410, such as two fixing units 410. The plurality of fixing units 410 can be configured to fix the battery 400 to the station battery holder 600 or the robot battery holder 602 in a more rigid manner. That is, the plurality of fixing units 410 can create a stronger support for the battery 400. The plurality of fixing units 410, such as two fixing units 410, can be positioned on opposite sides of the battery 400. This can be advantageous as it can prevent possible non-intended inclinations of the battery 400 relative to the station battery holder 600 or the robot battery holder 602 when the battery 400 is attached respectively to the station battery holder 600 or the robot battery holder 602. Such inclinations can cause damages on the structure of the battery 400 or to the structure of the station battery holder 600 or the robot battery holder 602. Such inclinations can further electrically disconnect the battery 400 from the station battery holder 600 or the robot battery holder 602.

The fixing unit 410 can be configured to fix the battery 400 to the robot battery holder 602 or station battery holder 600. That is, the fixing unit 410 can be configured to keep the battery 400 fixed and preferably non-movable in the robot battery holder 602 or station battery holder 600. The fixing unit 410 can also be configured to support at least the weight of the battery 400. This can be particularly advantageous if an external force, such as gravity, acts on the battery, tending to displace the battery from the intended position in the robot battery holder 602 or station battery holder 600. The fixing unit 410, can move back and forth in a direction as depicted by double arrow 984, within a distance limited by walls 406 and 408 of the battery body 402. It should be noted, that the double arrow is shown here just for illustration purposes and is not part or element of any embodiment of battery 400. In an embodiment, the fixing unit 410 can comprise a sliding latch configured to move along the battery body 402 between a closed position and an open position. The fixing unit 410 positioned in the closed position can be configured to extend in the structure of the station battery holder 600 or the robot battery holder 602 to latch the battery 400 to the station battery holder 600 or the robot battery holder 602. The fixing unit 410 positioned in the open position is configured to unlatch the battery 400 from the station battery holder 600 or the robot battery holder 602.

Further, the battery body 402 can comprise a protruding structure 404 to help fix the fixing unit 410 on the battery 400. The protruding structure can be further configured to allow the grabber element 350 (refer to FIG. 3A) to grab the battery 400. The grabber 350 can move the fixing unit 410 of the battery 400 back and forth to release/fix the battery 400 from/to the latches 610 of the station battery holder 600 and the robot battery holder 602 (refer to FIG. 3A).

Figure 2B:
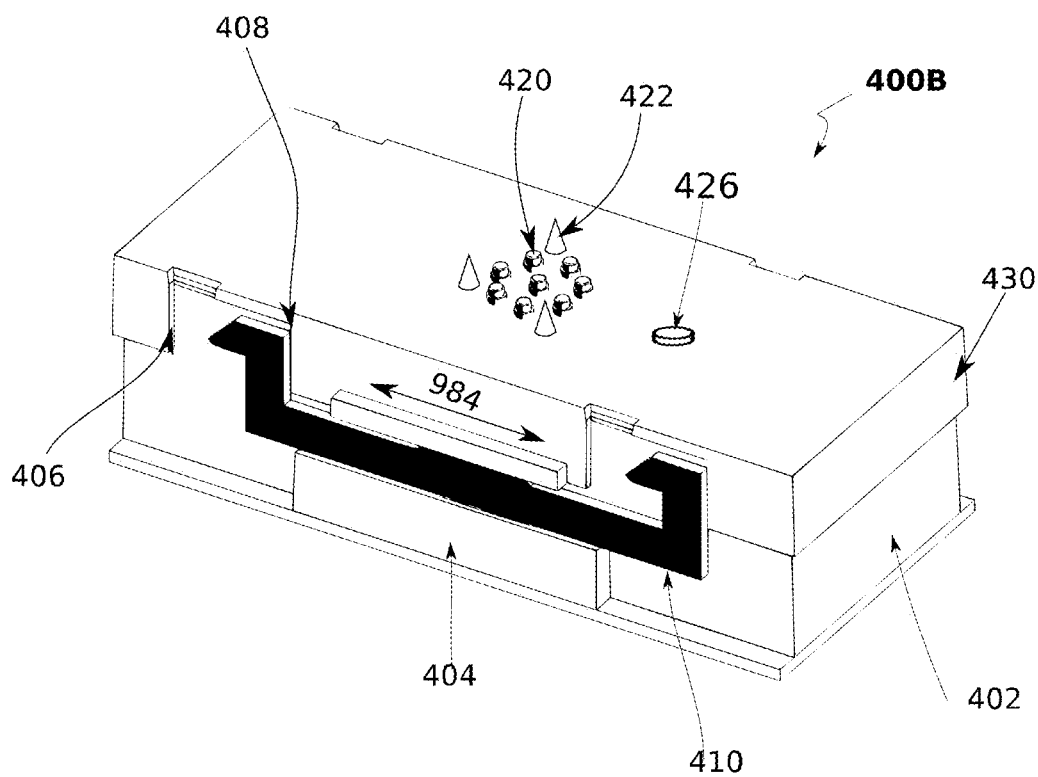
FIG. 2B shows another embodiment of a battery used with the battery station comprising circular pin layout.

Referring now to FIG. 2B, another embodiment of the battery 400 is shown, referred as battery with circular pin layout 400B, or simply as battery 400B. Similar to the embodiment of the battery 400 depicted in FIG. 2A, the battery 400B can comprise a battery body 402, a battery lid 430, electrical pins 420, damping pins 422, battery status transmitter 420, latch/unlatch mechanism 410, limiting walls 406, 408 and/or the protruding structure 404. These components comprised by the battery embodiment 400B can be similar to the components of the battery embodiment 400 depicted in FIG. 2A and therefore their description is omitted. The description of these components made for the embodiment of FIG. 2A, can be also valid for the components of the battery 400B. What differs the embodiment of the battery 400 depicted in FIG. 2A, from the embodiment of the battery 400B depicted in FIG. 2B, is the layout of the electrical and damping pins 420, 422. In FIG. 2A, the battery 400 comprises a substantially rectangular layout of the electrical and damping pins 420, 422. In FIG. 2B the embodiment of the battery 400B comprises a substantially circular layout of the electrical and damping pins 420, 422. It should be noted that the embodiments depicted in FIG. 2A and FIG. 2B are illustrative embodiments for the battery 400. Other embodiments of the battery 400, e.g. with different layouts of the electrical and damping pins 420, 422 may be used with the station 10. It should be noted, that throughout this document, for simplicity reasons, and to keep the sentences clear, whenever referring to the battery 400, only reference to the embodiment of the FIG. 2A is explicitly provided, with the numeral 400. Whenever referring to the battery 400, reference to the embodiment 400B and other embodiments of the battery should be implied.

Figure 2C:
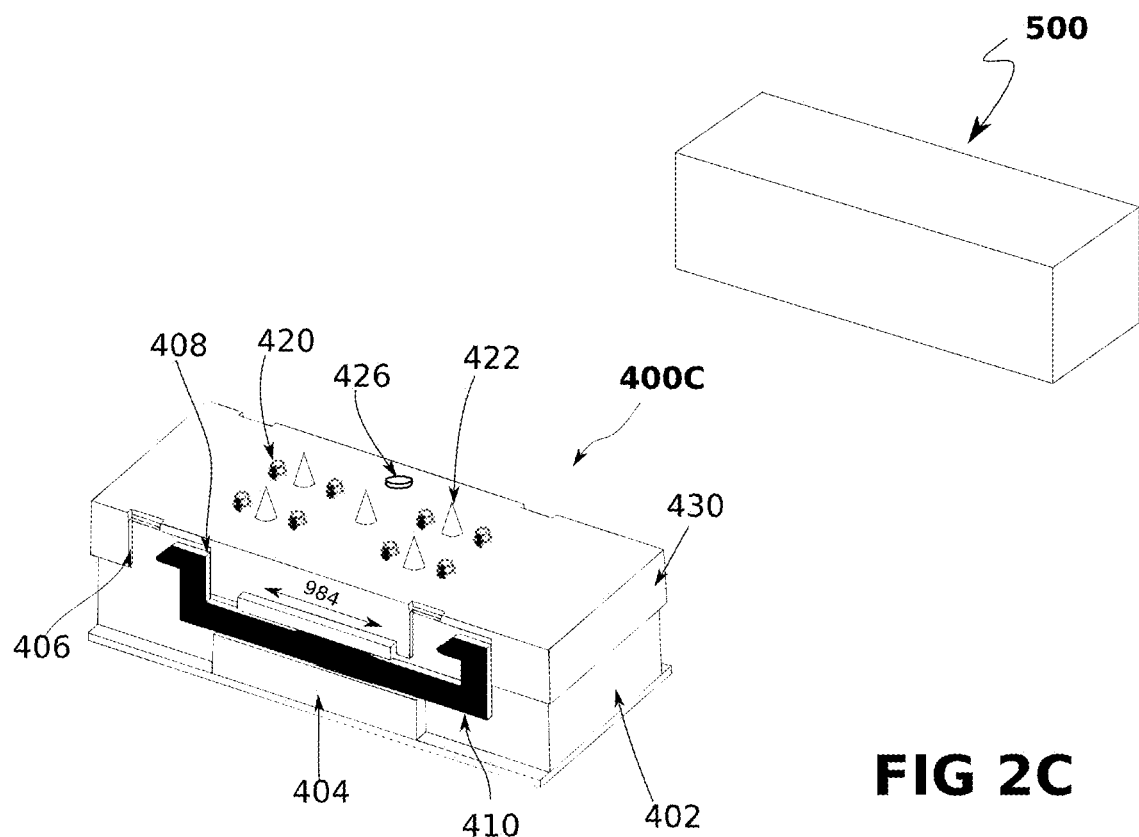
FIG. 2C shows an embodiment of a battery case used with the battery station.

In another embodiment, the battery body 402 and the battery lid 430, comprising the elements 420, 426, 422, 408, 406, 404 and/or 410, described in the preceding paragraphs, can be a component on its own as depicted by battery case 400C, shown in FIG. 2C. The battery case 400C comprises a battery case body 402, and/or a battery case lid 430. It can further comprise a plurality of electrical connectors 422, at least two damping pins 426, a battery status transmitter 426, at least one latch/unlatch mechanism 410, limiting walls 406, 408, and/or a protruding structure 404. The outer structure of the battery case 400C can be similar to the outer structure of the battery 400. Therefore, they can comprise similar elements and the description for these elements is omitted, since the elements 402, 430, 420, 426, 422, 408, 406, 404 and 410 are described in the preceding paragraphs.

In one embodiment, the battery case 400C can encapsulate the inner elements (not shown) of the battery 400. Inner elements of the battery 400 may refer to any element of the battery 400 that is not exposed to the surroundings, i.e. can be encapsulated by the battery body 402, battery lid 430 and/or the battery case 400C, such as the battery cells, the required wiring for transmitting the electric charges in and out of the battery 400, the required circuitry for charging, discharging and/or other functionalities of the battery 400, like the circuitry needed for battery status transmission, etc. Thus, in such an embodiment, the battery 400 comprises the inner elements (like the examples provided in the preceding sentence) which can be enclosed by the battery case 400C. In this embodiment, the manufacturing of the battery can be separated from the manufacturing of the inner elements and the production of the battery case 400C. Thus, during the manufacturing of the battery 400, the inner elements can be adapted to fit in the battery case 400C and/or the battery case 400C can be adapted to encapsulate and/or hold the inner elements of the battery 400.

In another embodiment, the battery case 400C can serve as a battery adapter 400C. Different mobile robot battery standards exist in the state of the art. In this document, it is referred to such batteries as universal mobile robot batteries 500. A universal mobile robot battery can be any battery that can be used by a mobile robot 20. An example of a universal mobile robot battery 500 can be the battery 400. Thus, the universal mobile robot battery 500 refers to a more general class of robot batteries than the battery 400. In one embodiment, the universal robot battery 500 can be adapted to be inserted into, i.e. encapsulated by the battery case 400C.

In a preferred embodiment, the battery case 400C can be adapted to encapsulate the universal robot battery 500. The adapter means can refer to, for example, means for establishing an electrical connection (not shown), means for keeping the battery 500 fixed to the battery case 400C (not shown), etc. The adapter means can further include electronic and/or electric circuitries (not shown) for adapting the voltage, current and/or power produced by the universal robot battery 400C, to the voltage, current and/or power required by the device using the universal robot battery 400C such as a mobile robot 20, a station 10, etc. The battery case 400C serving as an adapter for the universal robot battery 500 can be facilitated further if the 3D printing technology can be used for the production of the battery case 400C. In such an embodiment, the battery case 400C, can allow the use of a more general class of batteries 500 to be used by the station 10 and/or the mobile robot 20, than the one depicted by the battery 400.

It should be noted, that whenever referring to the battery 400, reference to the battery case 400C encapsulating a universal mobile robot battery 500 can be implied as well. For clarity, explicit reference to battery case 400C encapsulating a universal mobile robot battery 500 is avoided by referring only to the battery 400.

Figure 3A:
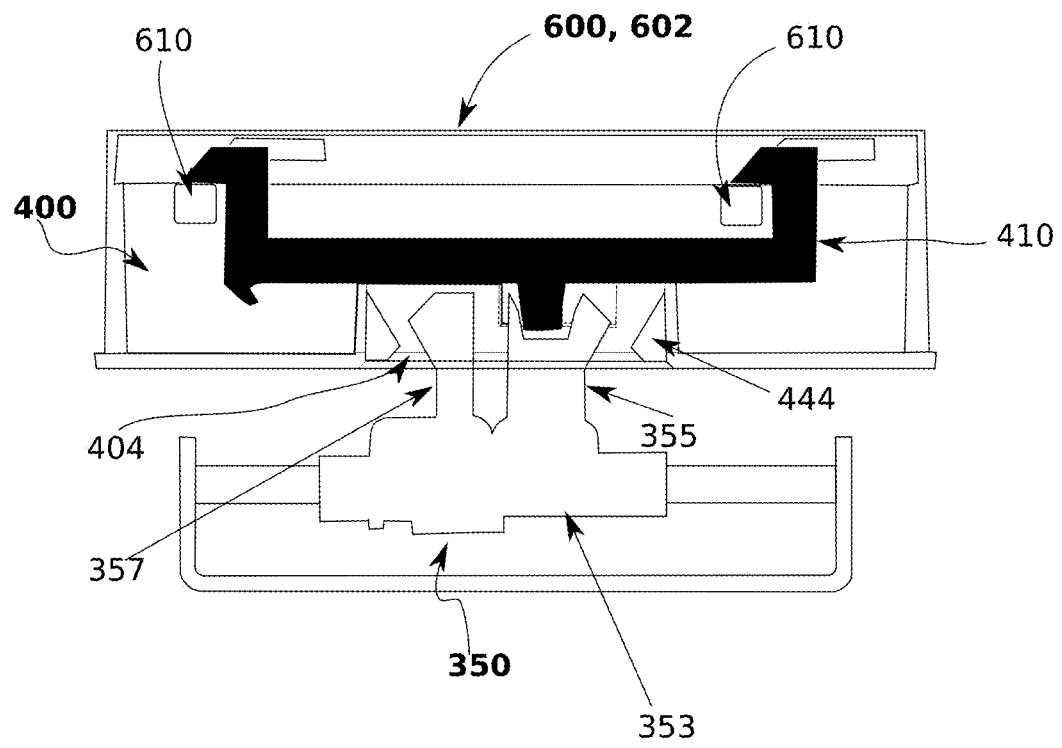
FIG. 3A shows a front elevation view of a battery mounted in a station battery holder of a charging unit or in a robot battery holder of a mobile robot.

Referring now to FIG. 3A, an embodiment of a station battery holder 600 of the charging unit 132 is shown. The robot battery holder 602 comprises similar elements as the station battery holder 600. For this reason, explicit figures for both the station battery holder 600 and the robot battery holder 602 are not shown. Thus, in this paragraph whenever referring to station battery holder 600, reference to robot battery holder 602 should be implied. The station battery holder 600 can comprise a cavity, which in the figure is shown to be occupied by the battery 400. The cavity of the station battery holder 600 can be adapted to enclose or encapsulate the battery 400. Further, the station battery holder 600 can comprise a fixing element 610 that keep the battery 400 fixed to the station battery holder 600 once the battery 400 can be attached to it. The fixing element 610 can comprise latches 610 as shown in FIG. 3A. Latches 610 can be some elongated parts extended from the body of station battery holder 600, adapted to support the weight of the battery 400.

In FIG. 3A, the battery grabber element 350 of the battery handling mechanism 300 of the station 10 is shown in more detail. The battery grabber element 350 can comprise a grabber element frame 353. The grabber element frame 353 can be adapted to attach the grabber 350 to the battery handling mechanism 300. Further, the grabber element 350 can comprise two pairs of grippers: grabbing grippers 355 and supportive grippers 357. Grippers 355 and 357 can be attached on both sides of the grabber element frame 353 such that each side of the grabber element frame 353 comprises at least one grabbing gripper 355 and one supportive gripper 357. The grabbing grippers 355 can be adapted to grab the fixing unit 410 of the battery 400. Supportive grippers 357 can be adapted to provide extra support so that the grabber element 350 can hold the battery 400 while loading, unloading and/or transporting it. In another embodiment, the grabber element 350 can comprise only the grabbing grippers 355. In yet another embodiment, the grabber element can comprise only the supportive grippers 357. In another embodiment, the grabbing grippers 355 can be adapted to also support the battery 400. In yet another embodiment, the supportive grippers 357 can be adapted to also grab the fixing unit 410 of the battery 400. In another embodiment, the grabber element 350 can comprise an actuator (not shown) wherein the said actuator can be configured to move the grabbing grippers 355 and/or the supportive grippers 357. Said actuator can be controlled by the controller units of the station 10, to move the grabbing grippers 355 and/or the supportive grippers 357 in a certain manner configured for grabbing and/or releasing the battery 400 from the grabber element 350.

For a better understanding on how the grabber element 350, the station battery holder 600 and the battery 400 interact, a load/unload procedure of the battery 400 from the station battery holder 600 is described in the following. To unload the battery 400 from the station battery holder 600, the grabber 350 can first attach itself to the battery 400 by attaching its grabbing grippers 355 to the fixing unit 410 of the battery 400. Then, the grabber element 350 can proceed by detaching the battery 400 from the station battery holder 600. This can be accomplished by moving the fixing unit 410 away from the latches 610. In an embodiment, the grabbing grippers 355 can unlock the battery 400 from the station battery holder 600, by moving the fixing unit 410 away from latches 610 a predefined distance. That is the grabbing grippers 355 can reach a specific unlocking position. The battery grabber element 350 can be configured so that a feedback signal is communicated to the controllers of the station 10 when grabbing grippers 355 reach said specific unlocking position while unlocking the battery 400 from the station battery holder 600. When such a feedback signal is processed in the controllers or in a processing component of station 10, the controllers of station 10 can confirm that the grabbing element 350 was able to successfully unlock and grab the battery 400 from the station battery holder 600 (see FIGS. 3C and 3D for embodiments of the grabber element 350 configured to provide at least one feedback signal when it successfully grabs the battery 400). The protruding structure 404 can comprise an extended element 444, which can also be referred to as the ear 444. In a preferred embodiment, the ears 444 are positioned in the inner part of the protruding structure 404, in both sides of the protruding structure 404. The respective ears 444 can be allowed contact with the respective grabbing grippers 355 and the supportive grippers 357, when the grabber element 350 unlatches the battery 400 from the latches 610, i.e. moves the fixing unit 410 away from the latches 610. In a specific example, when the grabber element 350 unlatches the battery 400, the grabbing grippers 355 and the supportive grippers 357 move toward the respective ear 444. This way, when the battery handling mechanism 300 moves the battery grabber 350 away from the station battery holder 610, the contact between the grippers 355, 357 and the respective ear 444, makes it possible for the battery 400 to follow the movement of the battery grabber element 350. The battery handling mechanism 300 can move the grabber element 350 away from the station battery holder 600, thus unloading the battery 400 from the station battery holder 600. Similar unloading procedure can also be done for unloading a battery 400 from the robot battery holder 602.

To load the battery 400 to the station battery holder 600, the reverse procedure to the one just described can be done. Firstly, the battery handling mechanism 300 can direct the grabber element 350 holding a battery 400 towards the station battery holder 600 such that the battery 400 can occupy the cavity of the station battery holder 600. At the same time, the electrical pins 420 of the battery 400 can be inserted into the corresponding holes on the station battery holder 600, establishing the electric connection between them. Then, the grabber element 350 can lock the battery 400 to the station battery holder 600 with the help of the grabbing grippers 355. This can be done by moving the fixing unit 410 of the battery 400 towards the latches 610 of the station battery holder 600. The battery 400 can be locked in the station battery holder 600 if the fixing unit 410 is moved a predefined distance towards the latches 610, that is when the grabbing grippers 355 have reached a specific locking position. The battery grabber element 350 can be configured so that if the grabbing grippers 355 have reached said specific locking position, a locking feedback signal is generated and communicated to the controllers of station 10. When such a feedback signal is processed by the controllers of station 10, station 10 can confirm that the grabbing element 350 was able to successfully lock the battery 400 to the station battery holder 600 (see FIGS. 3C and 3D for embodiments of the grabber element 350 configured to provide feedback signal when it releases the battery 400 from itself). Having loaded the battery 400 successfully in the station battery holder 600, the grabber 350 can release the battery 400 and the battery handling mechanism 300 can move the grabber 350 away from the battery 400. Similar loading procedure can also be done for loading a battery 400 to the robot battery holder 602.

Figure 3B:
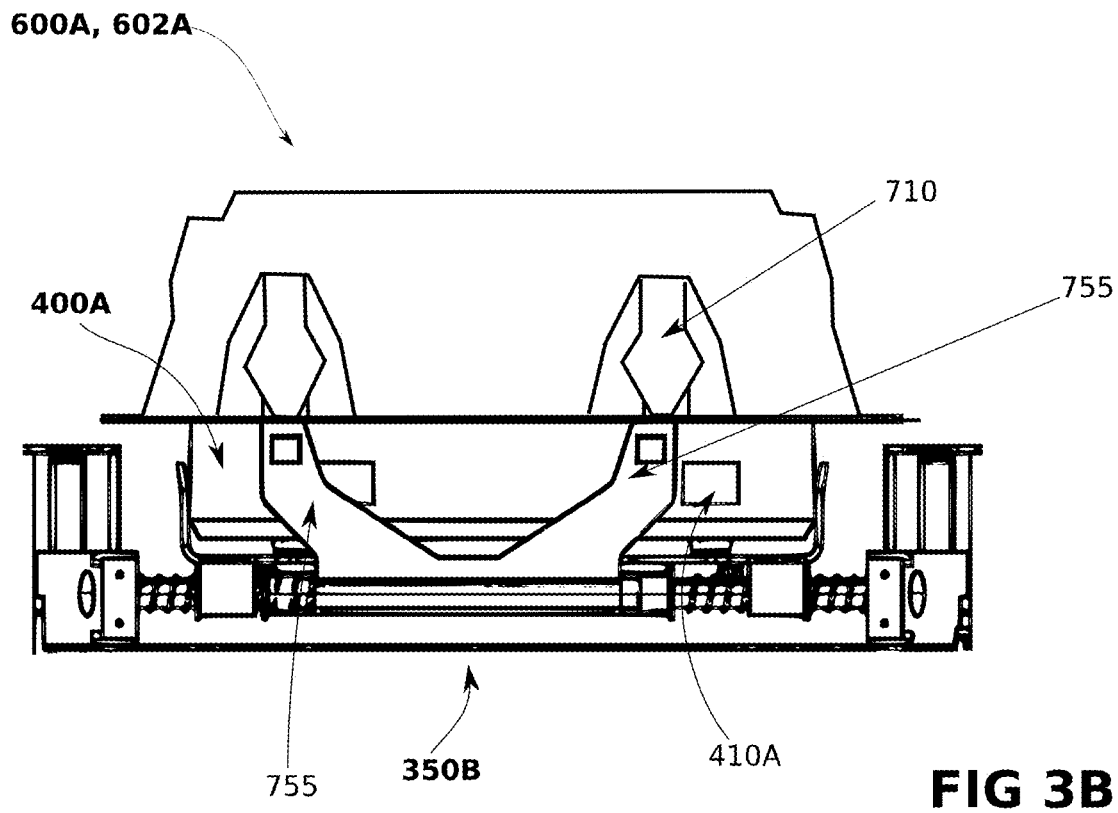
FIG. 3B shows a front elevation view of another embodiment of a battery mounted in a station battery holder of a charging unit or in a robot battery holder of a mobile robot.

In FIG. 3B, another embodiment of the station battery holder 600, referred to as 600A, is shown. The robot battery holder 602A comprise similar or corresponding elements as the station battery holder 600A. For this reason, an explicit figure for both the station battery holder 600A and the robot battery holder 602A is not shown. Thus, in this and the following paragraph whenever referring to station battery holder 600A, reference to robot battery holder 602A should be implied. Station battery holder 600A comprises different fixing elements compared to the embodiment shown in FIG. 3A. The station battery holder 600A can comprise latches 710 that extend from the body of the station battery holder 600A. Latches 710 can assume an open position, allowing the battery to move freely in the station battery holder 600A, or a closed position keeping the battery fixed to the station battery holder 600A. Preferably, the station battery holder 600A can comprise a plurality of latches 710. The battery body 402 of the battery 400A can comprise fixing unit 410A adapted such that the latches 710 of the station battery holder 600A can be attached to keep the battery 400A fixed in the station battery holder 600A. Preferably, the battery 400A comprises a plurality of fixing unit 410A, symmetric to the latches 710 of the station battery holder 600A. Fixing unit 410A can be a plurality of holes in the battery body 402 of the battery 400A such that the latches 710 of the station battery holder 600A can be inserted into the holes 410A of the battery 400A.

In the embodiment of FIG. 3B, the battery grabber element 350B can comprises a plurality of grippers 755, symmetric to the latches 710 of station battery holder 600A. To load the battery 400A the grabber 350B can open the latches 710, allowing the battery 400A to be inserted into the station battery holder 600A. Then, the grabber 350B can load the battery 400A into the station battery holder 600A such that the latches 710 can be inserted in the holes 410A of the battery 400A. To unload the battery 400A from the station battery holder 600A, a similar process can be done. First, the grabber 350B can position its grippers 755 between the latches 710A and the holes 410A, then it can proceed by opening the latches 710, thus detaching the battery 400A from the latches 710. At this moment, the battery 400A can be pulled out of the station battery holder 600.

Figure 3C:
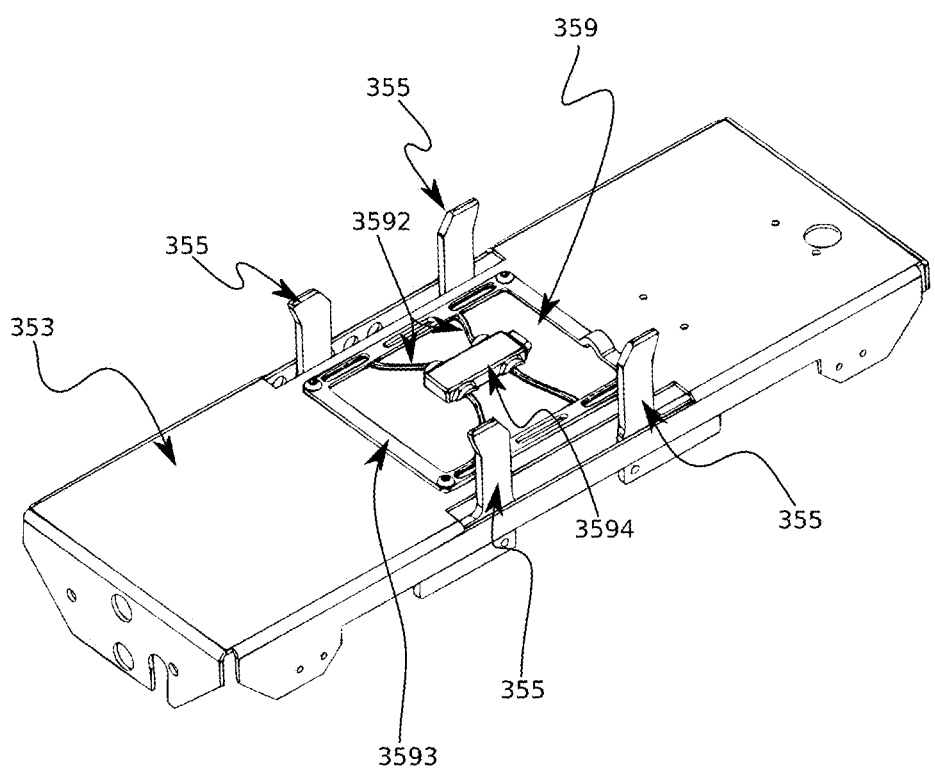
FIG. 3C depicts an embodiment of a battery grabber element configured to provide feedback signal when successfully grabbing a battery.

In FIG. 3C, a detailed view of an embodiment of a battery grabber element 350 is depicted. The battery grabber element 350 depicted herein, is configured to provide feedback signals when it successfully grabs or releases a battery 400.

As already discussed (e.g. in FIG. 3A), the battery grabber element 350 can comprise a battery grabber element frame 353. Said battery grabber element frame 353 can be configured to provide support to the structure of the grabber element 350. Additionally, the battery grabber element frame 353 can be configured to attach the grabber element 350 to the battery handling mechanism, as well as attach or assemble the parts of the battery grabber element 350. That is, attached to the battery grabber element frame 353 the grabbing grippers 355 can be provided. Through the grabbing gripper 355 the grabber element 350 can grab the battery 400 and displace it.

Additionally, attached to battery grabber element frame 353 the grabber element 350 can comprise a battery presence detector 359. The battery presence detector 359 can be configured to provide a feedback when the battery 400 is attached to or grabbed by the battery grabber element 350. Vis-à-vis the presence detector 359 can be configured to provide feedback if the battery 400 is not attached to or grabbed by the battery grabber element 350. Such feedback may facilitate or improve the operation of the grabber element 350 and in general of the station 10.

The battery presence detector 359 can comprise a battery presence detector frame 3593, for simplicity also referred as frame 3593 (not to be confused with the battery grabber element frame 353). Said frame 3593 of the battery presence detector 359 can be configured to attach or secure the battery presence detector 359 on the battery grabber element 350, such as on the battery grabber element frame 353. For example, the frame 3593 of battery presence detector 359 can be screwed on the battery grabber element frame 353.

Additionally, flexibly connected to the frame 3593 of the battery presence detector 359 a switch cover 3594 can be provided to the battery presence detector 359. The flexible connection between the frame 3593 of the battery presence detector 359 and the switch cover 3594 can be realized by the flexible attachments 3592 which can also be referred as buckled elastic rods 3592. As depicted in FIG. 3C, four flexible attachment 3592 can attach the switch cover 3594 with frame 3593 through four different corners of the switch cover 3594. The flexible attachments 3592, like strings, can keep the switch cover "hanging" on the frame 3593. Thus, the switch cover 3594 can move, "up and down" in a direction perpendicular to the frame battery grabber element 353.

Below or covered by the switch cover 3594, at least one switch (not shown) can be placed, such as two switches. Hence, the allowed movement of the switch cover 3594 can activate and deactivate the switch, e.g. by pressing or releasing a button. That is, the allowed movement of the switch cover 3594, provided by the flexible attachment 3592, can allow the switch cover 3594 to assume or move between at least two positions, wherein in one of the positions the switch cover 3594 can contact and preferably apply a force on the switch below it and on the other position the switch cover 3594 may not contact the switch covered by it and/or the pressure applied on the switch may be lower (as compared to the first position). The switch can be configured to open and close a circuit, that can be connected to the controller of the station 10. Hence, it can be known, e.g. by the controller of station 10 and/or an operator, that the switch covered by the switch cover 3594 is closed or opened.

Thus, when the grabber element 350 grabs the battery 400 it can lie on the battery grabber element frame 353 and can contact the switch cover 3594. Furthermore, the weight of the battery 400 can move the switch cover 3594 toward the battery grabber element frame 353, hence pressing toward the at least one switch positioned therein between the battery grabber element frame 353 and switch cover 3594. This can cause the at least one switch to change its state (e.g. from a closed state to an open state or vice-versa), which change of state can be captured and recognized by the controller of station 10. Hence, upon a successful grabbing of the battery 400 a feedback signal can be produced by the battery presence detector 359 announcing to a processor unit or the controller of station 10 that the battery 400 is successfully grabbed.

Similarly, when the battery 400 is released from the battery grabber element 350 the pressure on the switch cover 3594 pressing it towards the battery grabber element frame 353 can reduce. This can cause the switch beneath the switch cover 3594 to change its state, hence announcing to the controller of station 10 that the battery 400 is released from the battery grabber element 350 and that the battery 400 is not anymore supported or grabbed by the grabber element 350.

Figure 3D:
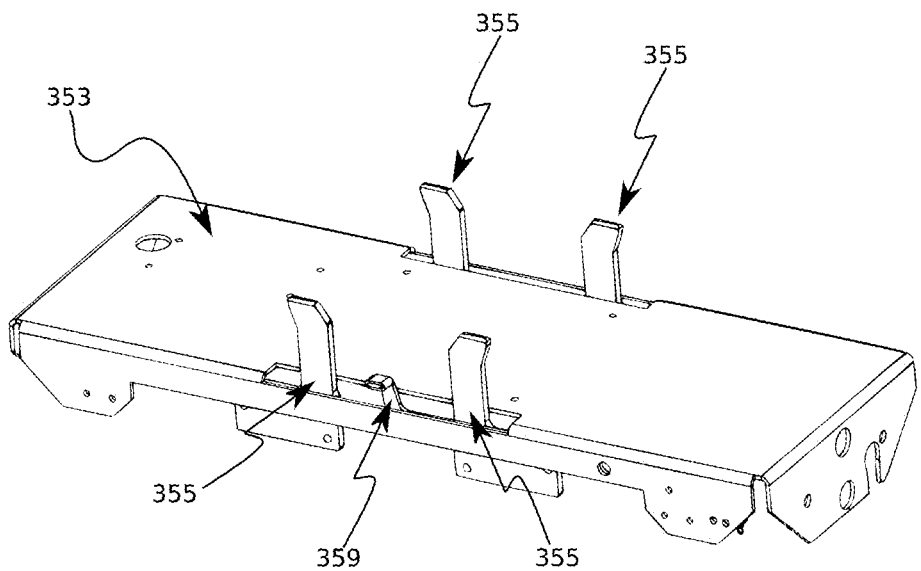
FIG. 3D depicts another embodiment of a battery grabber element configured to provide feedback signal when successfully grabbing a battery.

In FIG. 3D yet another embodiment of a battery grabber element 350 comprising a battery presence detector 359 is depicted. In this embodiment, the battery presence detector 359 can be provided between the grippers 355 of the grabber element 350. In FIG. 3D, only one battery presence detector 359 is depicted, however, the grabber element 350 can be provided with multiple battery presence detectors 359. For example, another battery presence detector can be provided between the other pair of grippers 355 of the battery grabber element 350.

In a similar manner as discussed with respect to the embodiment of FIG. 3C, the battery presence detector 359, depicted in FIG. 3D, can be flexibly attached to the battery grabber element frame 353. The flexible connection with the battery grabber element frame 353 can allow the battery presence detector 359 to move "up and down" in the direction perpendicular to the battery grabber element frame 353. Thus, the battery presence detector 359 can be contacted and pressed by the battery 400, when the grabber element 350 grabs the battery 400. Battery 400 pressing on the battery presence detector 359 can change the state of a switch (not shown) comprised by the battery presence detector 359. The state change of the switch can be recognized by the controller of the station 10, hence indicating the grabbing of the battery 400 by the grabber element 350. Similarly, when the battery 400 is released from the grabber element 350, pressure on the battery grabber element 359 can be reduced, allowing the battery presence detector 359 to return to its normal position, which in turn changes the state of the switch comprised by the battery presence detector 359. This can allow the controller 10 to check if the battery is released or grabbed by the grabber element 350.

In the preceding paragraphs, a limited number of embodiments of the battery 400, the station battery holder 600 and the battery grabber element 350 are illustrated. It is valuable to notice, that different embodiments of the battery 400, the station battery holder 600 and the battery grabber element 350 can be used with the station 10. Furthermore, the embodiments of the battery 400, the station battery holder 600 and the grabber 350 can be combined in different ways to provide different embodiments of the station 10. In the following paragraphs whenever referring to station battery holder 600 with the corresponding battery embodiment 400 and corresponding battery grabber element embodiment 350 with their corresponding elements, reference to the station battery holder 600A with the corresponding battery embodiment 400A and corresponding battery grabber element embodiment 350B with their corresponding elements should be implied and whenever referring to the robot battery holder 602 with the corresponding battery embodiment 400 and corresponding battery grabber element embodiment 350 with their corresponding elements, reference to the robot battery holder 602A corresponding battery embodiment 400A and corresponding battery grabber element embodiment 350B with their corresponding elements should be implied. In other words, whenever referring to the embodiments depicted in FIG. 3A reference to the embodiments depicted in FIG. 3B or FIG. 3C should be implied, unless otherwise clarified by the context.

Figure 4A:
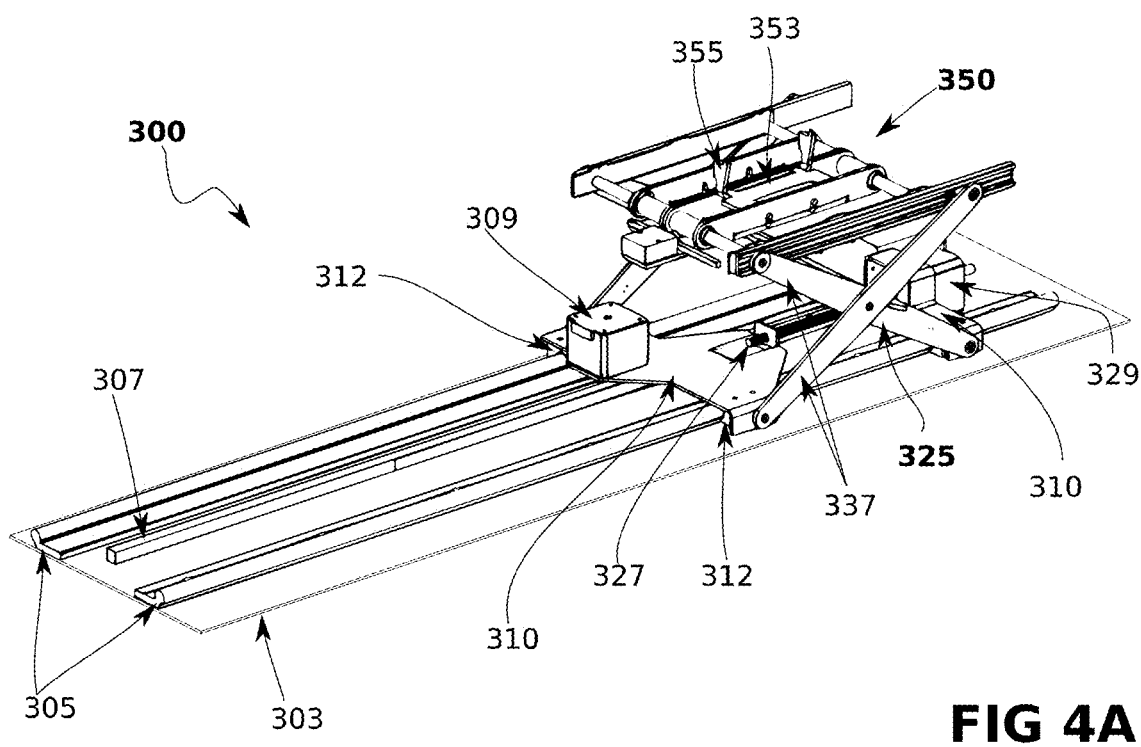
FIG. 4A shows a general perspective view of an embodiment of a battery handling mechanism.

Referring now to FIG. 4A, an embodiment of the battery handling mechanism 300, which may also be referred to as handling mechanism 300, is shown. As described in the preceding paragraphs, the handling mechanism 300 can be adapted to position the grabber element 350 in a specific location p(x, y, z) within its reaching range. During loading and/or unloading of the batteries 400 from the station battery holder 600, or the robot battery holder 602, the controller unit of the station 10 can provide the coordinates of the battery 400 load or unload location to the handling mechanism 300. The battery load/unload location can be the location where the handling mechanism 300 should load or unload the battery 400, such as the station battery holder 600 or the robot battery holder 602. The handling mechanism 300 can be adapted to position the grabber element 350 at the specified coordinates.

The handling mechanism 300 can comprise a base 303, referred to as battery handling mechanism frame 303. The battery handling mechanism frame 303 of the handling mechanism 300 can be fixed in the base of the station 10 (refer to FIG. 1B). At least one linear shaft 305 can be attached to the battery handling mechanism frame 303. In a preferred embodiment, a plurality of parallel linear shafts 305 can be attached to the battery handling mechanism frame 303, such as two parallel linear shafts 305. Linear shafts 305 can be adapted to facilitate the movement of the grabber element 350, by guiding the grabber element 350, in the direction of the x- axis (with reference to the coordinative system given in FIG. 1B). In a preferred embodiment, the linear shafts 305 can comprise elongated metallic rods 305 adapted to comprise a smooth outer surface, such as, for example, high carbon chromium steel. The length of the linear shafts 305 can be adapted such that the handling mechanism 300 can position the grabber element 350, according to the x- direction, at each of the charging units 132 of the station 10, as well as at the surface opening 109. The diameter and/or strength of the linear shafts 305 can be adapted to support the weight of the grabber element 350 and of the batteries 400.

Further, the battery handling mechanism 300 can comprise at least one x-axis actuator 307. The x-axis actuator 307 can be adapted to move the grabber element 350 in the x-direction (with reference to the coordinate system given in FIG. 1B). In one embodiment, the x-axis actuator 307 can comprise a motor 309. The motor 309 can be controlled so as to produce predefined linear movements of the grabber element 350 in the x-direction. For example, the controllers of the station 10 can signal the motor 309 to move $x_1$ cm on the x-axis, wherein $x_1$ can be any number from 0 to the maximum reaching range of the x-axis actuator. In a preferred embodiment, motor 309 can be a stepper motor 309. The x-axis actuator 307 can be a hydraulic actuator, pneumatic actuator, electrical actuator, magnetic actuator, or a mechanical actuator, electro-mechanical actuator, etc. In a preferred embodiment, the x-axis actuator 307 can be an electrical-mechanical actuator 307, such as a traveling-nut actuator with fixed nut and roller screw, a traveling-nut actuator with fixed screw and roller nut, rack and pinion actuator, etc. It should be noted that in this paragraph only some exemplary embodiments of actuator types for the x-axis actuator 307, are provided. Other actuators can also be adapted to be used by the battery handling mechanism 300 of the station 10.

It should be noted that, throughout the text, the coordinate system depicted in FIG. 1B should be taken as a reference coordinate system unless otherwise implied by the context.

The grabber element 350 can be attached to the linear shafts 305 and/or to the x-direction actuator 307, by means of horizontal frames 310 and lifting mechanism 325. The horizontal frames 310 can comprise move smoothing elements 312. The move smoothing elements 312 can be placed in the vicinity of the connection points between the horizontal frames 310 and the linear shafts 305. The move smoothing elements 312 can be adapted to decrease the friction between the horizontal frame 310 and the linear shafts 305, resulting in a smooth linear movement of grabber element 350 along the linear shafts 305. In a preferred embodiment, the move smoothing elements 312 comprise at least one linear bearing 312. The diameter of linear bearing 312 can be in accordance with the diameter of the linear shafts 305.

The lifting mechanism 325, in the embodiment shown in FIG. 4A, can be adapted to guide the movement of the grabber element 350 in the z- direction. In the embodiment depicted in FIG. 4A, the lifting mechanism 325 can be configured as a scissor lift mechanism 325. The lifting mechanism 325, as shown in the embodiment of FIG. 4A, can comprise two elongated structures 337 forming an "X" shape and/or can be formed like a scissor lift. The elongated structures 337 can be adapted to facilitate the movement of the grabber element in the z-direction. The elongated structures 337 can be further adapted to provide extra support for the lifting mechanism 325 to hold the grabber element 350 and/or the battery 400. The lifting mechanism 325 can be attached to the horizontal frame 310 and to the grabber element 350 by means of rotational joints. Further, the two elongated structures 337 of the lifting mechanism 325 can be attached to each other by means of rotational joints. These joints can be adapted to allow the grabber element 350 to assume any position on the z-axis within the reaching range of the handling mechanism 300.

The movement of the grabber element 350, in the z-direction can be produced by the z-axis actuator 327. In one embodiment, the z-axis actuator 329 can comprise a motor 329. The motor 329 can be controlled so as to produce predefined linear movements of the grabber element 350 in the z-direction. For example, the controllers of the station 10 can signal to the motor 329 to move $z_1$ cm on the z-axis, wherein $z_1$ can be any number from 0 to the maximum reaching range of the z-axis actuator. In a preferred embodiment, motor 329 can be a stepper motor 329. The z-axis actuator 327 can be a hydraulic actuator, pneumatic actuator, electrical actuator, magnetic actuator, and/or a mechanical actuator, electro-mechanical actuator, etc. In a preferred embodiment, the z-axis actuator 327 can be an electrical-mechanical actuator 327, such as a traveling-nut actuator with fixed nut and roller screw, a traveling-nut actuator with fixed screw and roller nut, rack and pinion actuator, etc. It should be noted that in this paragraph only some exemplary embodiments of actuator types for the z-axis actuator 327, are provided. Other actuators can also be adapted to be used by the battery handling mechanism 300 of the station 10.

Figure 4B:
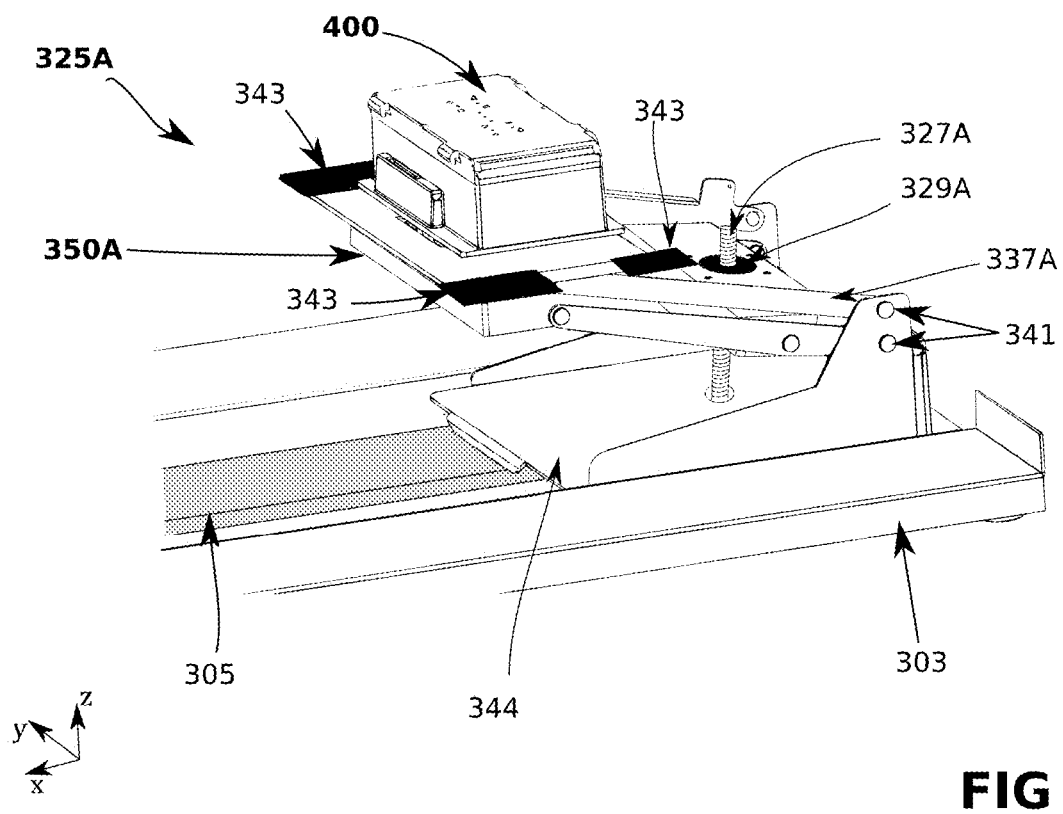
FIG. 4B shows a general perspective view of another embodiment of a battery handling mechanism.
Figure 4C:
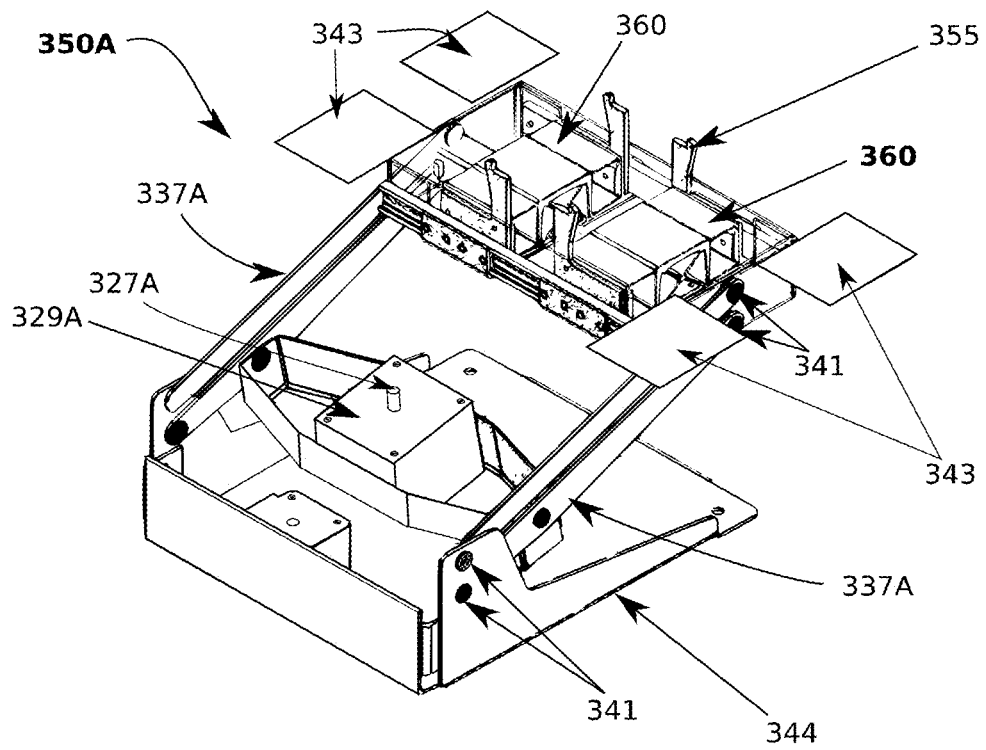
FIG. 4C shows an enlarged view of an embodiment of a battery grabber element.

Referring now to FIG. 4B and FIG. 4C, another embodiment of the lifting mechanism referred to with numeral 325A is shown. In the embodiment depicted in FIG. 4B and FIG. 4C, the lifting mechanism 325A can be configured as a parallelogram lift 325. The lifting mechanism 325A comprises a base frame 344. The base frame 344 can be adapted to attach the lifting mechanism 325A to the linear shafts 305 by means of move smoothing elements 312 (not shown here) that can be similar to the ones described with reference to FIG. 4A. The grabber element 350A (refer to FIG. 4C) can be attached to the base frame 344 by the guiding lifting elements 337A. The guiding lifting elements 337A can be adapted to facilitate the movement of the grabber element in the z-direction. The guiding lifting elements 337A can be further adapted to provide extra support for the lifting mechanism 325A to hold the grabber element 350A and/or the battery 400. In a preferred embodiment, the lifting mechanism 325A comprises a plurality of guiding lifting elements 337A. The guiding lifting elements 337A can be separated into two pairs, wherein each pair can be attached to one of the two sides of the grabber 350A parallel to the plane (x, z), as depicted in FIG. 4A. The guiding lifting elements 337A can be attached to the grabber element 350A by means of rotational joints 341.

Further, the lifting mechanism 325A can comprise a z-axis actuator 327A. The z-axis actuator 327A can be a hydraulic actuator, pneumatic actuator, electrical actuator, magnetic actuator, or a mechanical actuator, electro-mechanical actuators, etc. In a preferred embodiment, the z-axis actuator 327A can be an electrical-mechanical actuator 327A, such as a traveling-nut actuator with fixed nut and roller screw, a traveling-nut actuator with fixed screw and roller nut, rack and pinion actuator, etc. It should be noted that in this paragraph only some exemplary embodiments of actuator types for the z-axis actuator 327A, are provided.

In the depicted embodiment of FIG. 4B said z-axis actuator 327A can be configured as a traveling-nut actuator 327A comprising at least one screw metallic rod and one motor 329A, preferably a stepper motor 329A. The motor 329A can be controlled such as to produce predefined linear movements of the grabber element 350A in the z-direction. The z-axis actuator 327A can act on the grabber element 350A with a force parallel to the z-direction. While loading, or unloading a battery 400, the grabber element 350A can move in parallel with the z-direction. In other words, the lifting mechanism 325A can produce movement of the grabber 350 along the z-axis only. However, the torque generated by the z-axis actuator 327A can produce movement in the z-direction and x-direction at the same time. Thus, it can be advantageous that the x-direction movement be nulled. To accomplish this, the x-axis actuator 307 (refer to FIG. 4A) can compensate the x-direction movement produced by the torque of the z-axis actuator 327A. So, suppose the z-axis actuator 327A can rotate the grabber 350 by an angle $\alpha$ with respect to the base frame 344 and suppose that the length of guiding lifting elements 337A is l. This can mean that the grabber 350 can move a distance (l·sin $\alpha$) along the z-direction and (l·cos $\alpha$) along the x-direction. For keeping a constant position in the x-direction while lifting the grabber 350, the x-axis actuator 307 can simultaneously move (−l·cos $\alpha$), while the z-axis actuator 327A can rotate the grabber 350 by an angle $\alpha$. Thus, the movement in the x-direction can be compensated for, while the movement in the z-direction can be (l·sin $\alpha$).

Figure 4D:
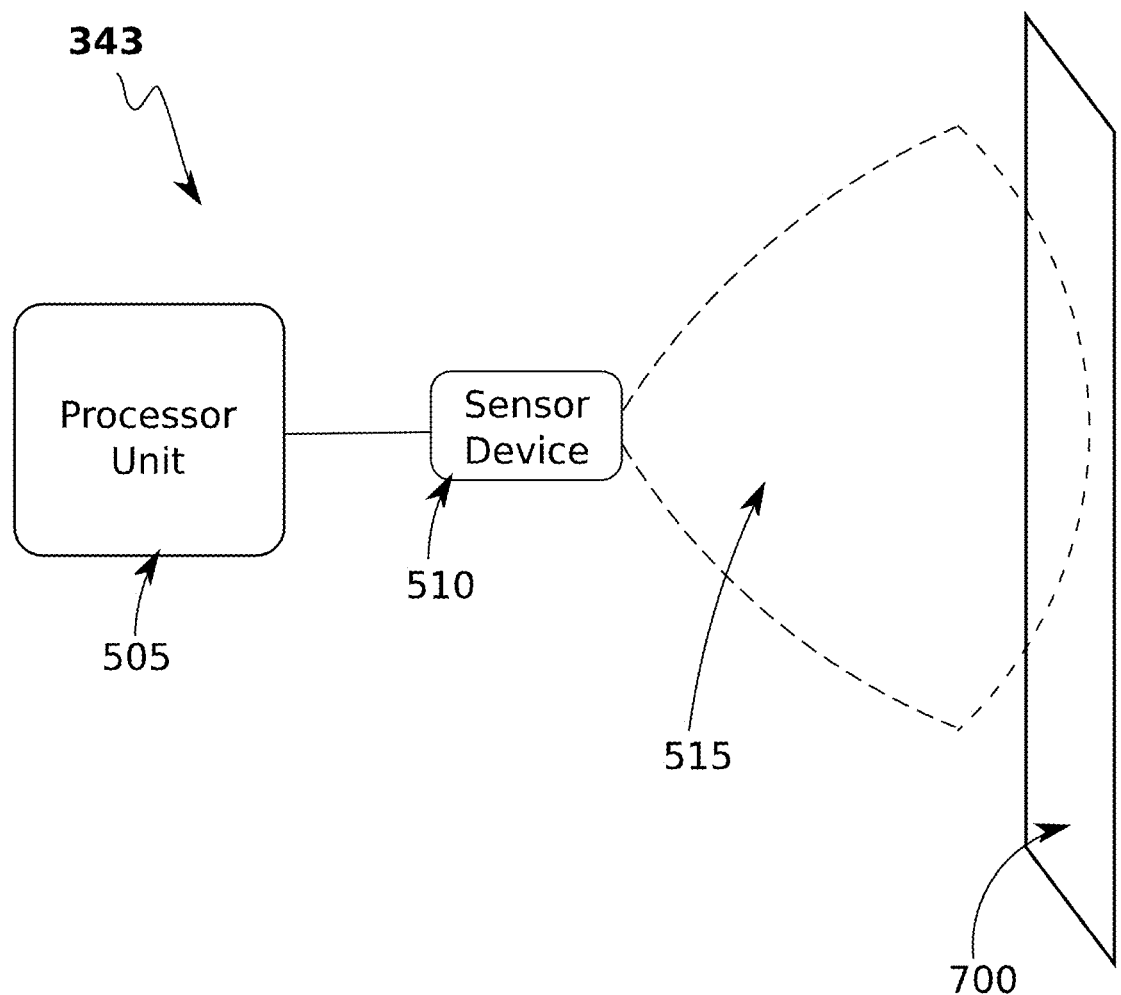
FIG. 4D shows a schematic view of a localization element.

In FIG. 4D, a schematic view of a localization element 343 according to an embodiment is shown. The localization elements 343 can be implemented in the station 10. In an embodiment, the localization elements 343 can be implemented directly in or on the surface of station 10, facing the bottom of the mobile robot 20. The localization element can be placed on or in the station body 101. In another embodiment, the localization elements 343 may be implemented in the handling mechanism 300, preferably in the battery grabber 350 of the handling mechanism 300. In the embodiment depicted in FIG. 4B, FIG. 4C, the localization element 343 can be implemented in the battery grabber element 350A. In an embodiment, the localization element 343 can be configured to detect the presence of at least one localization target 700 in its sensing range 515. In another embodiment, the localization element 343 can be configured to locate at least one localization target 700 in its sensing range 515. In yet another embodiment, the localization element 343 can be configured to detect and locate at least one localization target 700 in a reaching range of the grabber element 350.

The localization target 700 can be any object that can be positioned in the sensing range 515 and that can be detected and/or located by the localization target 343. In an embodiment, the localization target 700 can be the battery 400. That is, in such embodiments, the localization element 343 can be configured to at least one of detect and locate the battery 400, when the battery 400 is in the sensing range 515. In a specific example, the localization element can be configured to at least one of detect and locate the battery 400 of the mobile robot 20, when the mobile robot 20 is in the battery load/unload position 115. In another embodiment, the localization target can be the mobile robot 20. That is, in such embodiments, the localization element 343, can be configured to at least one of detect and locate a mobile robot 20, when the mobile robot 20 is in the sensing range 515. In a specific example, the localization element 343 can detect and locate a mobile robot 20, when the mobile robot 20 is positioned in the battery load/unload position 115. In yet another embodiment, the localization target 700 can be both the battery 400 and the mobile robot 20. In some embodiments, the localization target 700 can comprise any of the battery 400, mobile robot 20, part of mobile robot 20 surrounding the battery 400, the battery charging unit 132, the station battery holder 600, the robot battery holder 602.

The localization elements 343 may comprise at least one sensor device 510, that can also be referred to as sensor 510, preferably a plurality of sensors 510 adapted to sense the localization target 700, when said localization target 700 is positioned within the sensing range 515 of said sensors 510. The sensor device 510 can be configured to emit electromagnetic waves. Such electromagnetic waves can comprise a non-negligible energy or a non-negligible amplitude in the sensing range 515. That is, the sensing range 515 can be the zone in the vicinity of the sensor device 510, wherein the electromagnetic waves emitted by the sensor 510 can comprise a non-negligible energy or amplitude. The sensor device 510 can be configured to detect changes in the emitted electromagnetic waves in the sensing range 515. That is, the sensing range 515 can be the zone in the vicinity of sensor 510, wherein the sensor 510 can be capable of detecting changes in the electromagnetic field the sensor 510 creates. Outside the sensing range 515, the sensor 510 cannot detect the changes in the electromagnetic field it creates. The volume of the sensing range 515 can depend on the type of the senor device 510 that can be used. Different sensor 510 types and technologies comprise different sensing range. It can be advantageous and desirable that such a sensing range be maximized. In a specific example, the sensing range 515 can have dimensions, such that when the mobile robot 20 is positioned in the battery load/unload position 115, the at least one of mobile robot 20 and battery 400 of the mobile robot 20 is positioned within the sensing range 515.

The sensor device 515 can detect the presence of the localization target 700 in the sensing range 515 by continuously, such as periodically, emitting electromagnetic waves in the sensing range 515 and being able to detect changes in the electromagnetic field in the sensing range 515. Such changes in the electromagnetic field can be caused by the presence of the localization target 700 in the sensing range 515.

In an embodiment, the sensor device 510 can be an inductive sensor 510. In such an embodiment, the presence of a conductive material in the sensing range 515 can cause changes in the electromagnetic field created by the inductive sensor 515. Thus, the localization target 700 can be a conductive material surrounding or being surrounded by a non-conductive material, or the localization target 700 can be a non-conductive material surrounding or being surrounded by a conductive material. In a specific example, the battery 400 can comprise a non-conductive material while the part of the mobile robot 20 surrounding the battery 400, such as the bottom of the mobile robot 20, can comprise a conductive material such as a metal sheet like aluminum, or composite material like plastic coated with aluminum. A specific inductive sensor 515 can detect a localization target 700 as follows. An oscillating current, such as AC current, that can flow through an inductor (part of localization element 343) can generate an oscillating magnetic field, such as AC magnetic field. If a conductive material, such as a metal object, is brought into the vicinity of the inductor within the sensing range 515, the magnetic field will induce a circulating current (Eddy Current) on the surface of the conductor. The resistance and inductance of induced current caused by the Eddy current can be modeled as a distance dependent resistive and inductive component on the localization element 343. Thus, the localization element can detect the presence of a conductive material in the sensing range 515 of the localization element 343.

In another embodiment, the sensor device 510 can be a capacitive sensor 510. In such an embodiment, the presence of a localization target 700 in the sensing range 515 can cause changes in the electromagnetic field created by the capacitive sensor 510. In such embodiments, the localization target 700 can comprise any material and can be surrounded by or surrounding a different material.

In another embodiment, the sensor device 510 can be configured as a radar 510. That is, the radar 510 can be configured to emit electromagnetic waves and receive the electromagnetic waves reflected by a localization target 700 within the sensing range 515. In such embodiments, the localization target 700 can be a conductive material surrounded by or surrounding a non-conductive material, or the localization target 700 can be a non-conductive material surrounded by or surrounding a conductive material. In a specific example, the battery 400 can comprise a non-conductive material, while the part of the mobile robot 20 surrounding the battery 400, such as the bottom of the mobile robot 20, can comprise a conductive material such as a metal sheet like aluminum, or composite material, such as plastic coated with aluminum. In such an example, the radar 510 can emit electromagnetic waves towards the battery 400 and the bottom of the mobile robot 20, when the mobile robot 20 is in the battery load/unload position 115, i.e. the battery 400 and the bottom of the mobile robot 20 can be in the sensing range 515. The bottom of the mobile robot 20, comprising a conductive material, can reflect the electromagnetic waves emitted by the radar 510. The battery 400, comprising a non-conductive material, cannot reflect the electromagnetic waves, or the reflected electromagnetic waves by the battery 400 can comprise a negligible amplitude or energy. Thus, the radar can detect the presence or the non-presence of the localization target 700 in the sensing range by emitting and receiving electromagnetic waves.

Further, the localization element 343 can comprise a processor unit 505. The processor unit 505 can be configured to receive the sensor 510 readings and process them to at least one of detect and locate the localization target 700. The processor unit 505 can be part of the controller circuitry of the battery station 10 or can be a separate processor unit connected to the sensor device 510.

The localization element 343 can be configured to locate a localization target 700. That is, the localization element 343 can find the position of the localization target 700. The localization element 343 can be configured to find at least one of the spatial coordinates of the localization target 700 with reference to a coordinate system, such as the one depicted in FIG. 1B. In an embodiment, the localization target 343 can scan the space in the vicinity of the localization target including the localization target. While scanning, the processor unit 505 can keep track of the sensors' 510 position. The readings from the sensors can be used to decide whether the localization target 700 is sensed or not. Thus, by sensing the localization target 700 and keeping track of the position of the sensor 510, the localization target 700 can be located. In a specific example, the localization element 343 can scan the bottom of the mobile robot 20. After the scanning, the position of the mobile robot 20 can be found. The processor unit 505 can know where the battery 400 is positioned in the mobile robot 20. Thus, by having found the position of the mobile robot 20 and knowing were the battery 400 is in the mobile robot 20, the position of the battery 400 can be calculated. In another example, the localization element 343 can directly find the location of the battery 400.

Figure 4E:
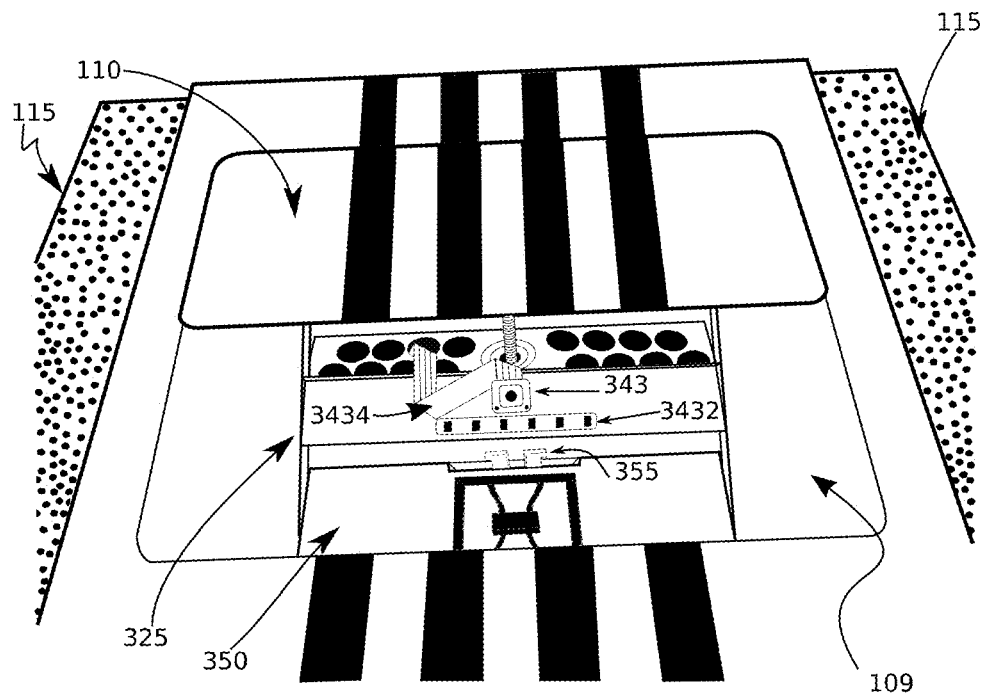
FIG. 4E depicts a localization element comprising a camera.

FIG. 4E depicts another embodiment of the localization element 343. FIG. 4E depicts a view from the top of the station 10, with the cover element 110 slid over the surface of station 10, thus opening or uncovering the top opening 109. The top opening 109 can allow the battery lifting mechanism 325 and the battery grabber element 350 to be seen in the depicted view. Other elements of station 10, that may be normally visible through the top opening 109, are not depicted in FIG. 4E, such that the figure is not overloaded.

As it can be noticed, the localization element 343 can be placed near the grippers 355 of the grabbing element 350. For example, the localization element 343 can be fixated on the structure of the lifting mechanism 325, close to the grippers 355, having a view towards the top opening 109 of station 10. This can allow the localization element 343 to sense the region through the top opening 109 of station 10, hence facilitating localization of the battery 400 of a mobile robot 10 positioned in the battery load/unload position 115.

The localization element 343 can comprise a camera 343. Camera 343 can be connected to a processor unit (not shown) or to the controller of the station 10. For example, camera 343 can be connected with a processor unit and/or the controller of station 10 through the wired connection 3434. The camera 343, placed facing the top opening 109, can capture at least one image, preferably a plurality of images, of the view allowed by the top opening 109 (when the cover element 110 is in the open position). As discussed, when a mobile robot 10 is positioned in the battery load/unload position 115, its battery or batteries 400 can be aligned with the top opening 109. Thus, the camera 343 can capture at least one image of the battery 400 of the mobile robot 10.

The images captured by camera 343 can be stored in a memory and provided to a processing unit, e.g. to the controller of station 10. The processing unit can process the images captured by the camera 343. The algorithm executed to process images captured by camera 343 can be configured to detect the presence and position of battery 400 on the at least one captured image. For example, the algorithm can compare the captured images by the camera 343 with training images, said training images comprising images of the battery 400, preferably from different viewing angles and/or light conditions and preferably images of the side of battery 400 that normally faces the camera 343.

Thus, using images captured by camera 343 (or localization element 343) the position of the battery 400 relative to the station 10 and/or battery grabber element 350 and/or with reference to a coordinate system can be inferred. Information regarding position of the battery 400 can facilitate the process of grabbing the battery 400.

In a similar manner, the camera 343 can capture images of the robot battery holder 602 and can be configured to localize it. This can facilitate the loading of a battery 400 in the robot battery holder 602.

In addition, at least one light source 3432, such as a strip of LED lights 3432, flashes etc., can be provided near the camera 343, preferably facing the top opening 109. The light source 3432 can improve the light conditions around camera 343, e.g. can illuminate the battery 400. Thus, the light source 3432 can improve the quality of images captured by camera 343, which can contribute on better results for localizing the battery 400 and/or the battery holder 602.

Figure 4F:
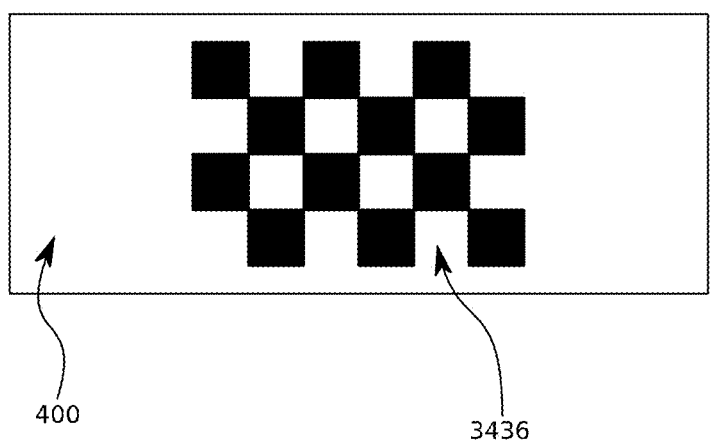
FIG. 4F depicts a battery comprising a recognizable pattern.

Localization of the battery 400 by the camera 343 can be facilitated by a recognizable pattern 3436 provided in the battery 400, more particularly on the side of battery 400 that can be "seen" by camera 343, as depicted in FIG. 4F. The recognizable pattern 3436 can comprise distinctive features, such as, distinctive colors, as compared to the battery 400 and/or the surrounding. Thus, on the images captured by the camera 343 the recognizable pattern 3436 can be detected automatically by a processor unit processing the images. Though, in FIG. 4F the recognizable pattern is depicted as a regular rectangular pattern, in general it can be any distinctive pattern which can be easily (or easier) to detect on an image captured by the camera 343.

The recognizable pattern 3436 can make the detection of the battery 400 faster, as it can be easier to detect the recognizable pattern 3436 as compared, for example, to detecting the battery 400. For example, on the images captured by the camera 343 the edges separating the battery 400 from the background or rest of the image may be less visible than the edges separating the recognizable pattern 3436 from the rest of the image. Thus, it can be easier and faster for a processing unit to detect the recognizable pattern 3436. Similarly, the recognizable pattern 3436 can be detected and localized with higher precision as compared to localizing the battery 400 without the recognizable pattern 3436, hence improving the accuracy of localizing the battery 400.

Figure 5A:
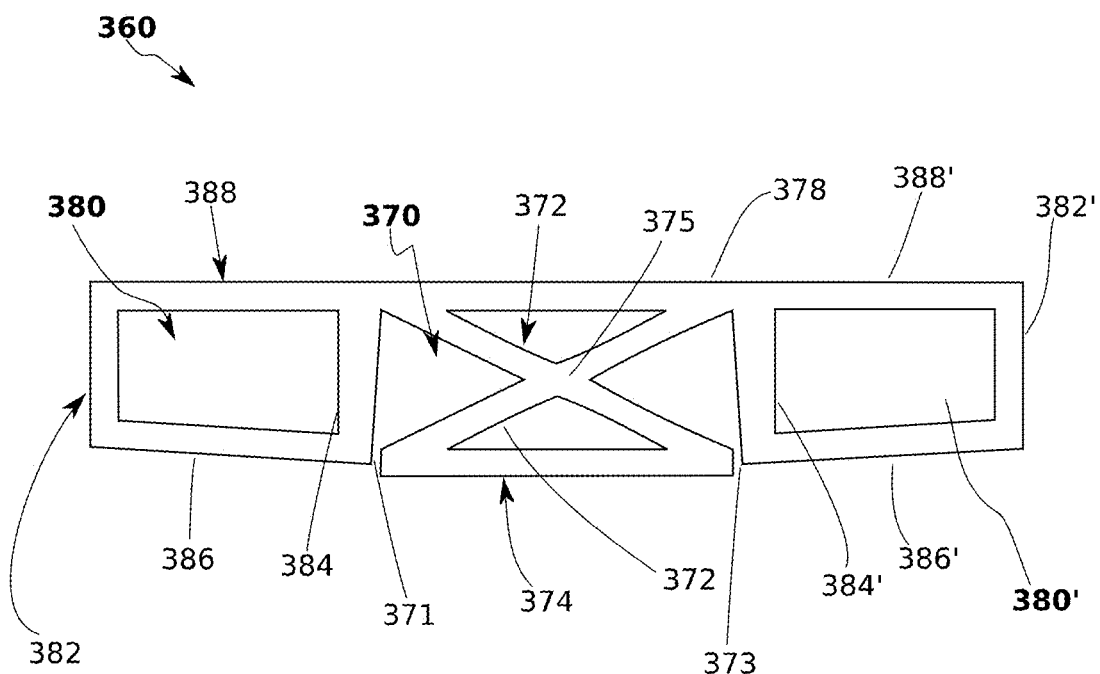
FIG. 5A shows a front view of an embodiment of a flexural joint used with the battery station.
Figure 5B:
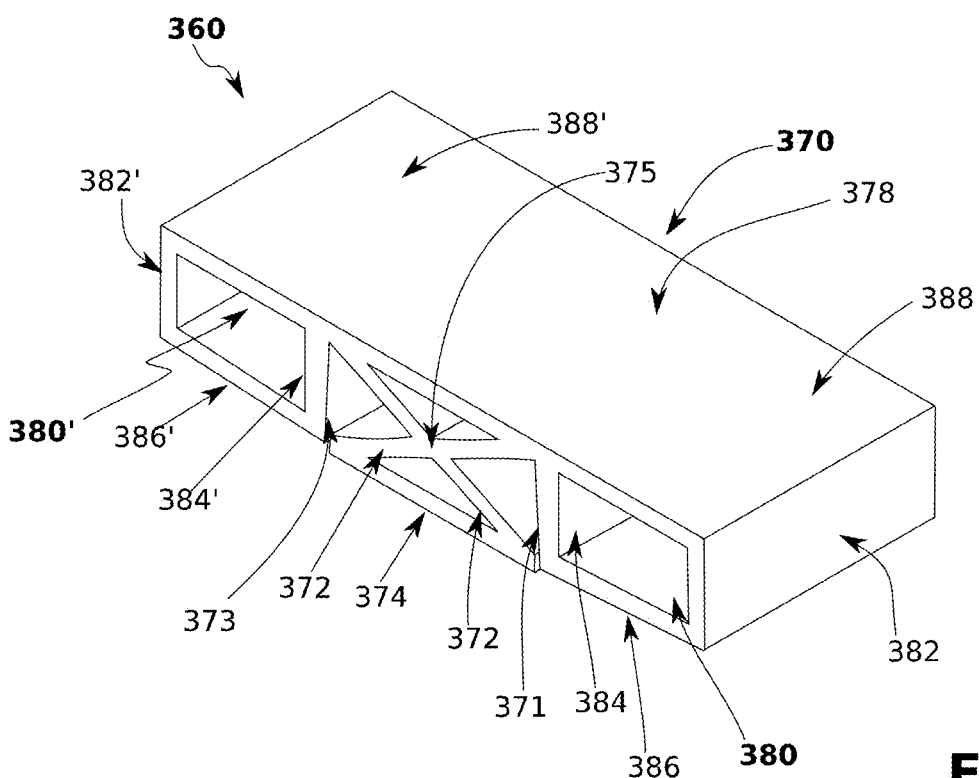
FIG. 5B shows a perspective view of the embodiment of the flexural joint.

As shown in FIG. 4C, the grabber element 350A can further comprise a plurality of grippers 355, such as four grippers 355. The grippers 355 can be attached to the grabber element 350A by means of a flexural joint 360. The flexural joint 360 can allow the grippers 355 to adapt to horizontal misalignments of the battery 400. For example, due to some obstacles like snow, stones, dust, mud etc., stuck to the wheels 806 (see FIG. 7A) of the robot 20, the bottom surface of the robot 20 may not be parallel to the grabber element 350A, which can cause possible misalignment between the grabber element 350A and the battery 400. In another example, a downward force due to the weight of the battery 400 can be applied on the grabber element 350A, when the battery grabber element 350A can support the battery 400. Due to possible misalignments, this force can be unequally distributed on the grippers of the grabber element 350A, more particularly on the grippers 355. Thus, a bigger downward force due to the weight of the battery 400 can be applied on some of the grippers 355 than on the other grippers 355. The same unequal distribution of forces can be applied on the battery 400, due to the counterforce associated with each force, wherein some parts of the battery 400 can suffer a bigger force than other parts of the battery 400. In yet another case, possible vibrations of the grabber element can occur while the battery handling mechanism 300 moves the grabber element 350A. These vibrations can also be produced by the possible movements of the station 10, or by other similar external effects. In a case where the battery grabber element 350 can loaded with a battery 400, said vibrations can also be transmitted to the battery 400. Such situations can damage the structure of the grippers 355, the battery grabber element 350A and/or the battery 400. Thus, to deal with such hazardous situations, the grippers 355 can be attached to the battery grabber element 350A by means of the flexural joint 360. Referring to FIG. 5A and FIG. 5B an embodiment of the flexural joint 360 is shown. The flexural joint 360 can be an element adapted to join two or more other elements, e.g. the flexural joint 360 can be adapted to join the gripper 355 to the grabber element 350A. Further, the flexural joint 360 can be adapted to allow certain motion by bending in certain directions, e.g. due to possible hazard situations discussed in the preceding paragraph, the flexural joint 360 can bend at certain parts that can be attached to the grippers 355 experiencing a larger force due to the unequal distribution of the weight of the battery 400. The bending of the flexural joint 360, at certain parts of it, can be proportional to the force applied on those respective parts, i.e. the grippers 355 experiencing a bigger force can bend part of the attachment with the flexural joint 360 more than the grippers 355 experiencing a weaker force. This feature of the flexural joint 360 can equalize the distribution of weight of the battery 400 over the grippers 355, thus overcoming the hazard situations related to possible misalignment of the battery 400 with the grabber element 350.

The movement of the flexural joint 360 can be made possible by deforming the material of the flexural joint 360. The flexural joint 360 can comprise flexible material. The flexural joint 360 can be made out of one piece of material. In a preferred embodiment, the flexural joint 360 can comprise a material that can repeatedly bend, to a certain bend level, without disintegrating. In a preferred embodiment, the flexural joint 360, can be manufactured using 3D printing technology.

Referring to FIG. 5A and FIG. 5B a preferred embodiment of the flexural joint 360 is depicted. The flexural joint 360 can be adapted to join two or more other elements. Thus, the flexural joint 360 can comprise at least two mounting points, preferably a plurality of mounting points, adapted to attach the other elements to the flexural joint 360. In the embodiment depicted in FIG. 5A and FIG. 5B the flexural joint comprises three mounting two of them positioned at the first mounting sides 382 and 382' and the other one positioned at the mounting base 374. Thus, in such an embodiment, the flexural joint 360 can be adapted to join three elements to each other. In another embodiment, the flexural joint 360 can have another mounting point on the top side 378 of flexural joint 360. In another embodiment, the flexural joint 360 can have at least one mounting point positioned at any of the elements 382, 382', 374 and/or 378.

In an embodiment, the flexural joint 360 can be configured as a cartwheel hinge 370 (refer only to element 370 in FIG. 5A and FIG. 5B). The cartwheel hinge 370 can comprise two elastic elongated elements 372, which can also be referred to as leaves 372. The leaves 372 can be intersected with each other in the pivot point 375. In a preferred embodiment, the pivot point 375 can be in the middle of the leaves 372. The base 374, connecting the ends of the leaves 372 as depicted in FIG. 5A and FIG. 5B, can be left free, i.e. it cannot be connected to the first limiting wall 371 and/or second limiting wall 373. Such a structure can allow the base 374 to rotate with respect to the pivot point 375. Said rotation can be made possible by the bending of the leaves 372. This rotation can be limited by the first limiting walls 371 and/or by the second limiting wall 373. The distance between the first limiting wall 371 and/or second limiting wall 373 from the mounting base 374, can be chosen such that the maximum rotation of the mounting base 374, allowed by the first limiting wall 371 and/or second limiting wall 373, does not break the leaves 372. The more flexible the material of the leaves 372, the bigger the allowed rotation of the base 374, the more the flexibility offered by the cartwheel hinge 370.

In another embodiment, the flexural joint 360 can be configured as a parallelogram flexure 380 (refer only to element 380 in FIG. 5A and FIG. 5B). The parallelogram flexure 380 can comprise two vertical sides and two horizontal sides creating a parallelogram-like shape. In the depicted embodiment, the parallelogram flexure 380, comprises a first mounting side 382 and a second mounting side 384. The parallelogram flexure can further comprise a first elastic arm 386 and a second elastic arm 388. The second mounting side 384 and the first mounting side 382 can be connected by the first elastic arm 386 and or the second elastic arm 388 forming a parallelogram structure. In a preferred embodiment, the parallelogram flexure 380 can be configured to join at least two other elements, by mounting them on the first mounting side 382 and/or the second mounting side 384. In a situation, wherein a force is applied on the first mounting side 382, i.e. the force can be applied by the element mounted on first mounting side 382, and the second mounting side 384 is kept fixed, i.e. it is mounted to a fixed non-movable object, then the second elastic arm 388 and the first elastic arm 386 will bend on the direction of the applied force, allowing the first mounting side to move in the direction of the applied force. Similar situation can happen when a force is applied on the second mounting side 384 and the first mounting side 382 is kept fixed, or when both the first mounting side 382 and the second mounting side 384 are not fixed.

In a preferred embodiment, the first elastic arm 386 and the second elastic arm 388 are thinner than the second mounting side 384 and the first mounting side 384. In a preferred embodiment, the ratios between the thickness of the second mounting side 384, first mounting side 382, second elastic arm 388, first elastic arm 386 can be as follows:

$$\frac{\text{Thickness of the first mounting side 382}}{\text{Thickness of the second mounting side 381}}$$

can be in the range of 0.20 to 5.00, more preferably 0.80 to 1.25, such as 1.0.

$$\frac{\text{Thickness of the second elastic arm 388}}{\text{Thickness of the first elastic arm 386}}$$

can be in the range of 0.7 to 2, more preferably 0.80 to 1.25, such as 1.0.

$$\frac{\text{Thickness of the first mounting side 382}}{\text{Thickness of the second elastic arm 388}}$$

can be in the range of 1.0 to 10.0, more preferably 1.0 to 10.0, such as 3.0.

It should be noted the ratios given above relate to some preferred embodiments and are provided here for a deeper understanding of the structure of such embodiments of the parallelogram flexure 380. Such ratios and/or the sizes of the parallelogram flexure can be adapted based on the application of the parallelogram flexure. Such adaption is done based on the requirements of the application of the parallelogram flexure, i.e. for more flexibility but less supported weight the thickness of the second elastic arm 388 and/or the first elastic arm 386 can be reduced. For more supported weight but less flexibility the thickness of the of the second elastic arm 388 and/or the first elastic arm 386 can be increased. Furthermore, for more supported weight and/or stronger mounting points the thickness of the first mounting side 382 and/or the thickness of the second mounting side 384 can be increased and if less supported weight and/or weaker mounting points are required the thickness of the first mounting side 382 and/or the second mounting side 384 can be decreased. Such adaption means can be beneficial since they increase the range of application of such a flexure. This adaption can be facilitated further if 3D printing technology is used.

In a preferred embodiment, such as the one depicted in FIG. 5A and FIG. 5B, the flexural joint 360 is configured as a combination of cartwheel hinge 370 and parallelogram flexure 380. The flexure joint 360 can comprise at least one of the following elements: cartwheel hinge 370, parallelogram flexure 380. In the depicted embodiment in FIG. 5A and FIG. 5B, the flexural joint 360 comprises one cartwheel hinge 370 and two parallelogram flexures 380 the left parallelogram flexure 380 and the right parallelogram flexure 380'. The left parallelogram flexure 380 and the right parallelogram flexure 380' comprise similar structures. In an embodiment, the left parallelogram flexure 380 is attached to the cartwheel hinge 370 by mounting the second mounting side 384 of the left parallelogram flexure 380 with the first limiting wall 371 of the cartwheel hinge 370 and/or the right parallelogram flexure 380' is attached to the cartwheel hinge 370 by mounting the second mounting side 384' of the right parallelogram flexure 380' with the second limiting wall 373 of the cartwheel hinge 370. In another preferred embodiment, the second mounting side 384 of the left parallelogram flexure 380 and the first limiting wall 371 can be the same element and/or the second mounting side 384' of the right parallelogram flexure 380' and the second limiting wall 373 can be the same element. In such embodiment, the flexural joint 360 is manufactured as one element, with no distinct separation between the parallelogram flexures 380 and/or the cartwheel hinges 370.

The combination of the parallelogram flexure 380 and the cartwheel hinge 370, increases the flexibility of the flexural joint 360. The flexural joint 360 can support more degrees of freedom with respect to flexibility. Vertical motion, up and down, can be allowed by the parallelogram flexure 380, and rotation motion, with respect to the pivot joint 375, can be allowed by the cartwheel hinge 370.

In a preferred embodiment, the flexural joint 360 can be adapted for use by a grabber element, such as the battery grabber element 350A, 350 and/or 350B of the station 10 (refer to FIG. 4C). In the depicted embodiment, the flexural joint 360, can be adapted to join two grippers 355 with the grabber element 350A. The flexural joint 360 can be attached to the body of the grabber element 350A through the mounting base 374. One gripper 355 can be attached on one of the mounting sides 382, 384, for example on the first mounting side 382 and/or another gripper 355 can be attached on the other mounting side, for example on the second mounting side 384. When force can he applied to the grippers 355, the flexural joint 360 can bend in certain direction as described in the preceding paragraph.

Throughout the document, different embodiments for the elements of station 10 were provided. In the provided figures, these embodiments of the elements of the station 10 were combined in certain manner. This combination is done only for illustrative purposes. The embodiments of the elements of station 10 can also be combined in different manners. Thus, all the combinations of such embodiments should be taken in consideration unless stated differently.

Figure 6:
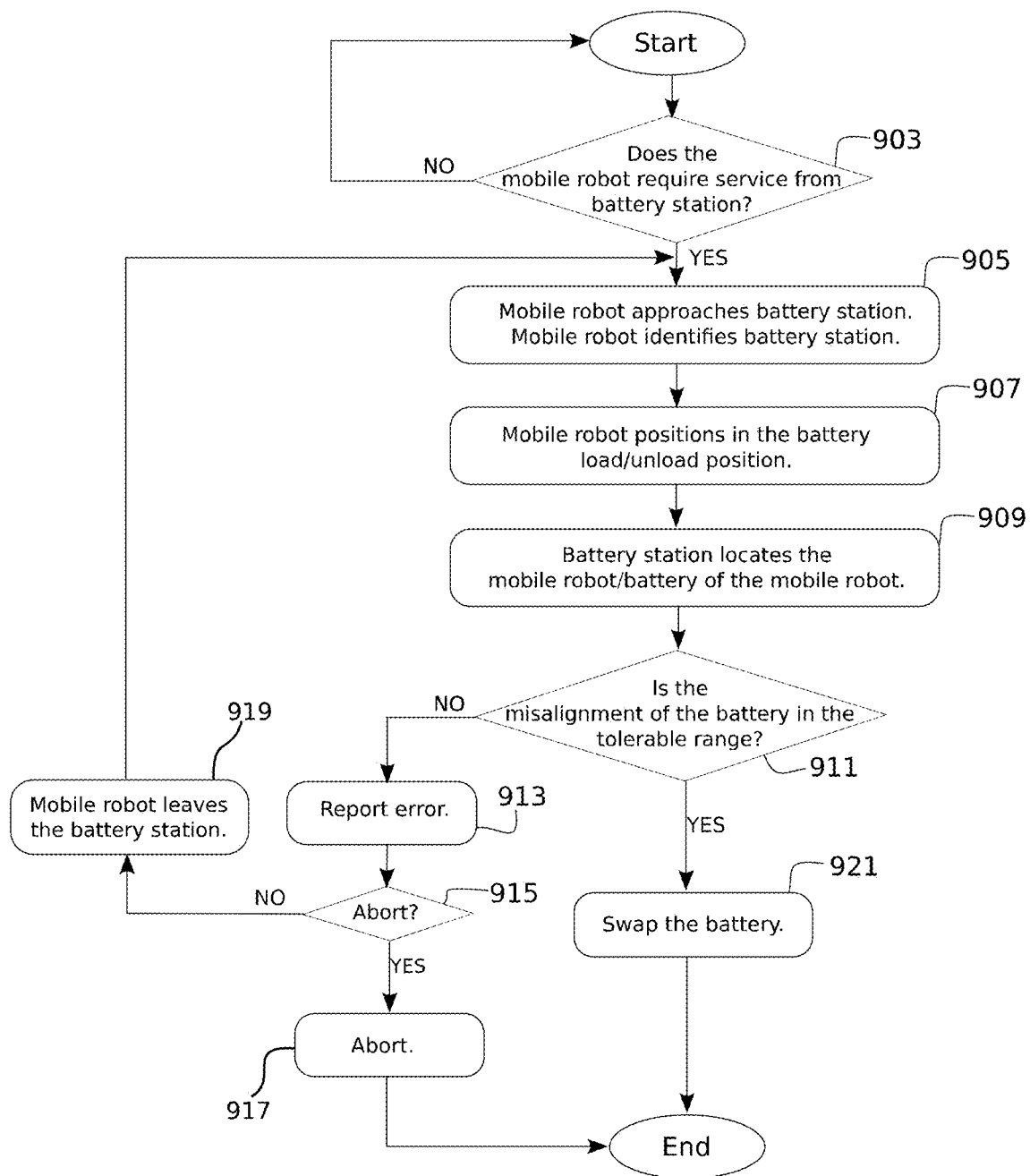
FIG. 6 shows a schematic description of a battery swapping method according to an embodiment.

Referring to FIG. 6, a flowchart of a procedure of battery swapping according to an embodiment is shown. The procedure can start with step 903, wherein a mobile robot 20 requires service of station 10. In some embodiments, the mobile robot 20 can be configured to seek service from the at least one battery station 10 when the energy level of the at least one batteries 400 of the mobile robot 20 is below a certain threshold level. The threshold level can preferably be programmable onto the at least one robot 20. That is, while operating the mobile robot 20 can consume the energy stored in at least one of its batteries 400. Thus, the energy level of at least one of its batteries 400 can decrease. When the energy level of at least one of its batteries 400 is smaller or equal to a threshold level, it can be desirable for the mobile robot 20 to require a battery 400 which is storing an energy bigger than the threshold level. Thus, it can be desirable for the mobile robot 20 to seek service from the battery station. It can also be advantageous for the threshold level to be programmable on the mobile robot 20, so that it can easier adapt to cases when a different type of battery 400 is used, or to other conditions that affect the battery consumption by the mobile robot 20. In some embodiments, the mobile robot 20 can be configured to seek service from the at least one battery station 10 when the service life of the battery 400 is over. For example, the mobile robot 20 can seek service from the battery station 10 when at least one of its batteries 400 can be malfunctioning, have reached a predefined loss of capacity, which can be a fraction of the original capacity of the battery 400 when the battery 400 is produced, or when the battery 400 have reached its end of life. In some embodiments, the mobile robot 20 can be configured to seek service from the at least one battery station 10 when the battery is malfunctioning. For example, the battery 400 of the mobile robot 20 does not work properly. That is, the battery 400 of the mobile robot 20 cannot supply the required energy, power, voltage and/or current. In another example, the battery's contact points can be damaged. Thus, it can be advantageous for the mobile robot to seek service from the battery station, as the battery station can comprise batteries that work in a proper way.

In a next step 905, the mobile robot 20 can approach the battery station 10 if it requires service from a station 10. In an embodiment, the robot 20 can be provided the coordinates of the station 10 and it can approach in an autonomous or semi-autonomous way the station 10. In another embodiment, the mobile robot 20 may have a database containing the positions of at least the stations 10 positioned in the area the robot 20 operates. In another embodiment, the mobile robot 20, can be remotely controlled to approach the station 10. In a preferred embodiment, the robot 20 can approach the station 10 that is nearest to it. The mobile robot 20 can read or detect the identification element 107 of the battery station 10 so that the robot 20 can know at which battery station 10 it can have approached. The mobile robot 20 can read or detect the identification element 107 of the station 10, using the optical sensors and/or cameras 812 that the mobile robot 20 can comprise.

Figure 7A:
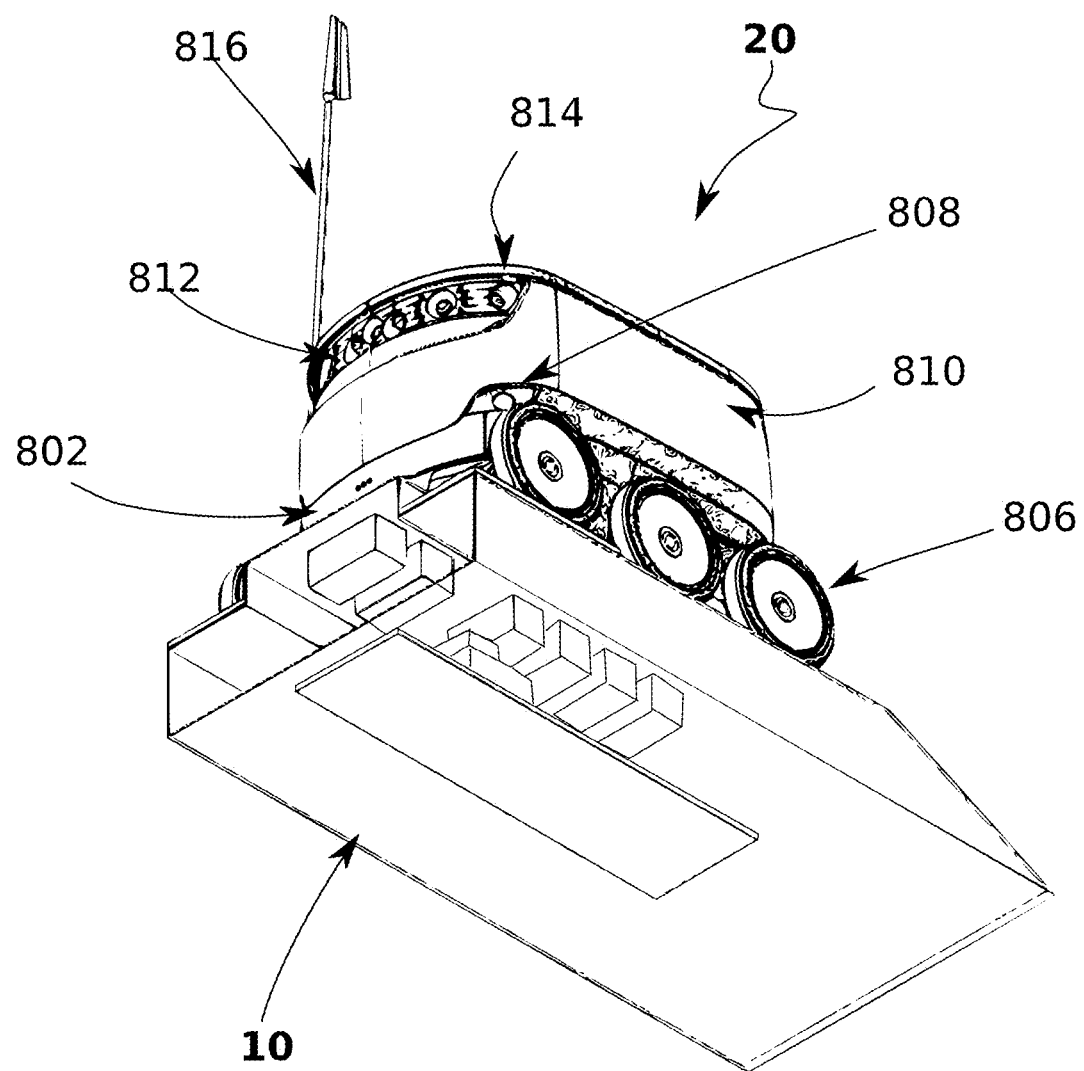
FIG. 7A shows a bottom view of a system comprising a mobile robot and a battery station.

In a next step 907, the robot 20 can position itself to the battery load/unload position 115 by sensing the horizontal lines 105 (see FIG. 1A), using the optical sensors and/or cameras 812 (see FIG. 7A). That is, the guiding element 105 of the battery station 10 can facilitate the positioning of the mobile robot 20 in the battery load/unload position 115. When the mobile robot 20 can be positioned in the battery load/unload position 115, the battery 400, of the mobile robot 20 is aligned with the surface opening 109, to facilitate the operation of the battery handling mechanism 300 on the battery 400.

In a next step 909, the sensors of station 10 may indicate to the controller unit of station 10 that a mobile robot 20 is waiting in the battery load/unload position 115 for a battery swapping. Or such information can be transmitted to the controllers of station 10 by the mobile robot 20. In another embodiment, a server 90 (refer to FIG. 6C) may communicate to the battery station 10 that a mobile robot 20 is positioned in its battery load/unload position 115 waiting for its service. The controller unit of station 10 signals the handling mechanism 300 to initiate the localization of the discharged battery 400 positioned in the robot battery holder 602 of the mobile robot 20. A discharged battery 400 can be any battery 400 with any energy level from empty to not full.

The handling mechanism 300 can start by positioning the battery grabber 350 in the surface opening 109 (see FIG. 1C). Since the surface opening 109 can be a fixed element, i.e. its exact position can be known by the controller unit of station 10, the handling mechanism 300 can position the grabber 350 to the surface opening 109 by simply taking the exact coordinates of the surface opening 109 from the controller unit of station 10. Next step 909 can be to localize the discharged battery 400 positioned in the mobile robot 20. Since the range of error of the positioning of robot 20 in the battery load/unload position 115 can be larger than the misalignment that the mechanical parts of the grabber element 350 can tolerate, extra localization elements 343 can be required for grabbing the battery 400.

To illustrate this concept better, the following example is provided. For simplicity, denote the battery load/unload position 115 as being a single point $P_{load}$. Such a point can for example correspond to the position of the center of the battery 400 of the mobile robot 20, when the mobile robot 20 is positioned in the battery load/unload position 115. Sensing the guiding elements 105, the mobile robot 20 can try to position itself at point $P_{load}$. This method of positioning by the guiding elements 105 comes with an error which can be distributed in the range 0 to $d_{MAX}$. Thus, in the worst case, the robot 20 can be positioned in the point $P_{load} \pm d_{MAX}$. In a preferred embodiment, the grabber element 350 (see FIG. 4A, 4B, 4C), may tolerate an error not larger than $e_{MAX}$, such as for example $e_{MAX}=10$ mm. On the other hand, $d_{MAX}$ may reach values of at least 1 cm in some circumstances. Thus, for a robust device, extra localization elements 343 can be required to deal with the said worst case or any cases where $d_{MAX} \geq e_{MAX}$.

Having localized the position of the battery 400 of the mobile robot 20, station 10 can calculate the misalignment of the battery 400. That is, station 10 can calculate the offset of the current position of the battery 400, from the perfectly aligned position.

Based on the mechanics and the configuration of station 10, it can comprise a tolerable misalignment. If the misalignment of the battery 400, is smaller than the tolerable misalignment, than station 10, particularly the grabber element 350, can grab the battery 400. If the misalignment of the battery 400, is bigger than the tolerable misalignment, than the grabber element 350 cannot grab the battery 400.

In a next step 911, station 10 compares the misalignment of the battery 400 with the tolerable misalignment. If the misalignment is bigger than the tolerable misalignment, the station 10 can report an error 913 to an operator, or to the server 90. The mobile robot 20 can proceed by making a decision 915 to abort or not the battery swapping process. In an embodiment, such a decision can be influenced by the type of error 913 that occurred. In another embodiment, the mobile robot 20 is configured to always abort the battery swapping process. In another embodiment, the mobile robot 20 is configured to always not abort the battery swapping process. In yet another embodiment, the mobile robot 20 is configured to make such a decision 915 by running a specific algorithm. In yet another embodiment, the decision 913 is made by the operator or by the server 90 and is communicated to the mobile robot 20. In case the decision 913 is made to abort the battery swapping process the mobile robot 20 proceeds to step 917 and aborts the battery swapping process. If the decision 913 is made to not abort the battery swapping process, then the mobile robot 20 proceeds to step 919 wherein the mobile robot 20 can leave the battery station 10 and loops back to step 905. Step 905 is followed by step 907, 909, 911 and so on as described in the preceding paragraphs and in the flowchart of FIG. 6.

However, in some instances, in step 919, the mobile robot may not leave the battery station 10, but may correct or try to correct its position, and the method can loop back to step 907 instead. That is, while in FIG. 6 the method comprises the mobile robot 10 leaving the battery station in step 919 after it is decided to abort the battery swapping process, and re-approach the battery station in step 905 (i.e. restart the battery swapping process), in some instances (not shown in FIG. 6), the method can comprise, in step 919, the mobile robot 10 correcting its position and the method continuing from step 919 to step 907.

Put differently, step 919 can comprise the mobile robot leave the battery station or the mobile robot correct its positioning on the battery station. Correcting the positioning can comprise performing relatively small translational and/or rotational movements. Step 919 can be followed by step 905 when the mobile robot leaves the battery station in step 919. Step 919 can be followed by step 907 when the mobile robot corrects its position instead of leaving the battery station in step 919. If the misalignment is smaller than the tolerable misalignment, in a next step 921 the battery station 10 can swap the battery 400 of the mobile robot 20. The grabber 350 can grab the discharged battery 400 from the mobile robot 20. It can accomplish this by first releasing the latches 610 (refer to FIG. 3A) that keep the battery 400 fixed to the robot battery holder 602 of the robot 20 and then it can use its grabbing grippers 355 to fix the battery 400 to its body. Then, the at least one controller unit of the station 10 can check the charging units 132 to find the unoccupied ones and then based on a specific algorithm it can decide which of the unoccupied charging units 132 to choose. The at least one controller can then provide the coordinates of the chosen unoccupied charging unit 132 to the handling mechanism 300. The handling mechanism 300 can position the grabber 350, loaded with the discharged battery 400, to the coordinates supplied by the controller unit, which refer to the free charging unit 132. The grabber 350, can attach the battery 400 to the latches 610 of the station battery holder 600 of the charging unit 132 and then release the battery 400. The battery 400 can stay attached to the station battery holder 600 of the charging unit 132 by means of latches 610. The controller can initiate the charging process in the charging unit 132 and also based on specific algorithms can find a charging unit 132 containing a charged battery 400 and provide its coordinates to the handling mechanism 300. A charged battery 400 can be any battery 400 with an energy level from fully charged to not empty. The handling mechanism 300 can take the charged battery 400, use the localization elements 343 to find the position of the robot battery holder 602 of the mobile robot 20, and load the charged battery 400 into the robot 20. The robot 20 can now continue performing its tasks with a charged battery 400.

FIG. 7A shows one exemplary embodiment of a mobile robot 20 being served by the station 10. The mobile robot 20 may be an electric vehicle, autonomous, semi-autonomous or non-autonomous mobile robot 20. In the embodiment of FIG. 7A, the mobile robot 20 can be a delivery robot 20. The mobile robot 20 can be adapted to deliver items to recipients. Said items can comprise packages, mail online and in-store purchases, grocery, meals, take-out, beverages, flowers and/or other items that can be desirable to have delivered. The robot 20 may comprise a robot frame 802 and wheels 806 mounted to the robot frame 802. In the depicted embodiment, there are provided a total of 6 wheels 806. The robot 20 also comprises a body or housing 810 comprising a compartment adapted to house or store the items to be delivered to the addressee or the delivery recipient (not shown). This compartment may also be called a delivery or item compartment. The body 810 may be mounted on the robot frame 802. The robot 20 also typically comprises a lid 814, also referred to as a cover, adapted to close the body or housing 810. That is, the cover 814 may assume a closed position depicted in FIG. 7A and an open position. In the closed position, there can be no access to the items in the delivery compartment of the body 810. In the open position of the cover 814 (not depicted), the delivery recipient may reach into delivery compartment of the body 810 and obtain the items from the inside of the body 810. The robot 20 may switch from the closed position to the open position in response to the addressee performing an opening procedure, such as the addressee entering a code or the addressee otherwise indicating that he/she is in a position to obtain the goods from the robot 20. For example, the addressee may access the delivery compartment by using a smartphone application or the lid 814 may be automatically opened once the delivery location can be reached by the robot 20. The robot 20 may also comprise one or a plurality of sensors 812, e.g., cameras, to obtain information about the surroundings of the robot 20. Further the plurality of sensors 812 comprise at least one optical sensor 812. The robot 20 may also comprise lights 808, such as LEDs 808. Furthermore, in the depicted embodiment, the robot 20 includes a signaling device 816, which may extend upwards.

Typical dimensions of the robot 20 may be as follows. Width: 20 to 100 cm, preferably 40 to 70 cm, such as about 55 cm. Height (excluding the signaling device 816): 20 to 100 cm, preferably 40 to 70 cm, such as about 60 cm. Length: 30 to 120 cm, preferably 50 to 80 cm, such as about 65 cm. The weight of the robot 20 including the transported items may be in the range of 2 to 50 kg, preferably in 5 to 40 kg, more preferably 7 to 25 kg, such as 10 to 20 kg. The signaling device 816 may extend to an overall height of between 100 and 250 cm, preferably between 110 and 200 cm, such as between 120 and 170 cm. Such a height may be particularly advantageous such that the signaling device 816 and thus the overall robot 20 can be easily seen by other traffic participants.

The robot 20 can assume requirement for service from station 10, when its battery 400 is discharged below a threshold level. Such a threshold level can be chosen based on the maximum time that is required for the robot 20 to rich the nearest station 10 from a point in its operation zone. For example, the robot 20 may operate in a certain area S comprising at least one station 10. In area S there exist at least one point d, for which a robot 20 positioned in point d requires energy to reach to the base station 10. In a worst-case scenario, the discharged threshold level of the battery 400 would be at least the energy that the robot 20 needs to travel from point d to station 10. In another scenario, the threshold may be the mean energy that the robot 20 needs to reach station 10 from different points of operation zone S. Threshold level may be programmed in the robot 20 and/or may be chosen by the operator of the system.

To detect whether the battery 400 of the mobile robot 20 has reached the threshold level, the mobile robot 20 needs to measure the voltage of the energy level of the battery periodically. The robot 20 can accomplish this by directly measuring the voltage of the battery 400 through the electrical pins 420 that electrically connect the battery 400 to the robot 20. However, this method of measuring the voltage of the battery 400 cannot be very robust. Since robot 20, preferably can be a mobile robot 20, it would constantly be in move. The movements of robot 20 can cause vibrations of battery 400, and thus vibrations of electrical pins 420. Due to these vibrations, the resistance between the electrical pins 420 and the contact points of the robot battery holder 602 of robot 20 changes, causing false measurements of the voltage of battery 400 of robot 20. Furthermore, the vibrations of electrical pins 420 can generate electromagnetic noise which can interfere the measurements of the voltage of the battery 400 through the electrical pins 420.

To overcome these problems related to battery voltage measurements in a mobile robot 20, in a preferred embodiment the battery 400 can be adapted to transmit energy level information to the robot 20. In a preferred embodiment, the battery 400 can comprise a battery status transmitter 426, such as an IR sensor 426. The IR sensor 426, can be adapted to transmit data related to its energy level, in the IR frequency band. The robot 20 can be adapted to receive the data sent by the IR sensors 426 of the battery 400 in the IR frequency band, i.e. the robot 20 can comprise a second IR sensor (not shown). The IR frequency band includes carries with a frequency in the range 300 GHz to 430 THz. Such frequencies clearly cannot be produced by the normal vibration of battery 400 produced while mobile robot 20 moves. Thus, the interference between the electromagnetic waves produced by the vibration of battery 400 and the IR band communication between battery 400 and robot 20 can be avoided. The IR sensors 426 of battery 400 can be programmed to periodically transmit the energy level of battery 400 to robot 20. Thus robot 20 can be continuously updated with precise data related to battery 400 level. Based on this data the robot 20 can decide if the battery 400 has reached the threshold level or not.

In FIG. 7A, the robot 20 can be positioned so as to be serviced via station 10. Thus, robot 20 can be positioned in the battery load/unload position 115. The robot 20 can drive to the top of station 10 by climbing the ramp 103 of station 10. The robot 20 can comprise a plurality of optical sensors 812 adapted to sense the horizontal lines 105 of station 10. Robot 20 can be programmed to stop after the optical sensors 812 cannot sense the horizontal lines 105. The robot 20 can align itself, using guiding elements 105, to the battery load/unload position 115.

The mobile robot 20 can comprise a robot battery holder 602 positioned in the base of the robot 20. The robot 20 can further comprise a battery 400 attached to the robot battery holder 602. The robot battery holder 602 can be adapted such that the battery 400 can be directly accessed from the base of the robot 20.

Station 10 can be adapted to access (i.e. load and/or unload) the battery of a mobile robot 20 positioned in its battery load/unload position 115. The battery load/unload position 115 is a battery load and/or unload position 115. The battery load/unload position 115 in the station 10, can be adapted such that the battery 400 of the robot 20 and the surface opening 109 can be aligned within some range of error E. Station 10 can be adapted to overcome the misalignment E, by using localization elements 343, and accessing the battery 400. Station 10 can be adapted to unload the battery 400 from the robot 20 and putting the battery in a charging unit 132 for charging. The station 10 can monitor the level of charge of battery 400 in the charging unit 132. Station 10 can be adapted to load a charged battery 400 in robot 20. Station 10 may indicate to the robot 20 that the battery swapping procedure is completed. Robot 20 can be adapted to receive such a message from station 10. Robot 20 can be adapted to descent from station 10 when the battery swapping process has completed.

Figure 7B:
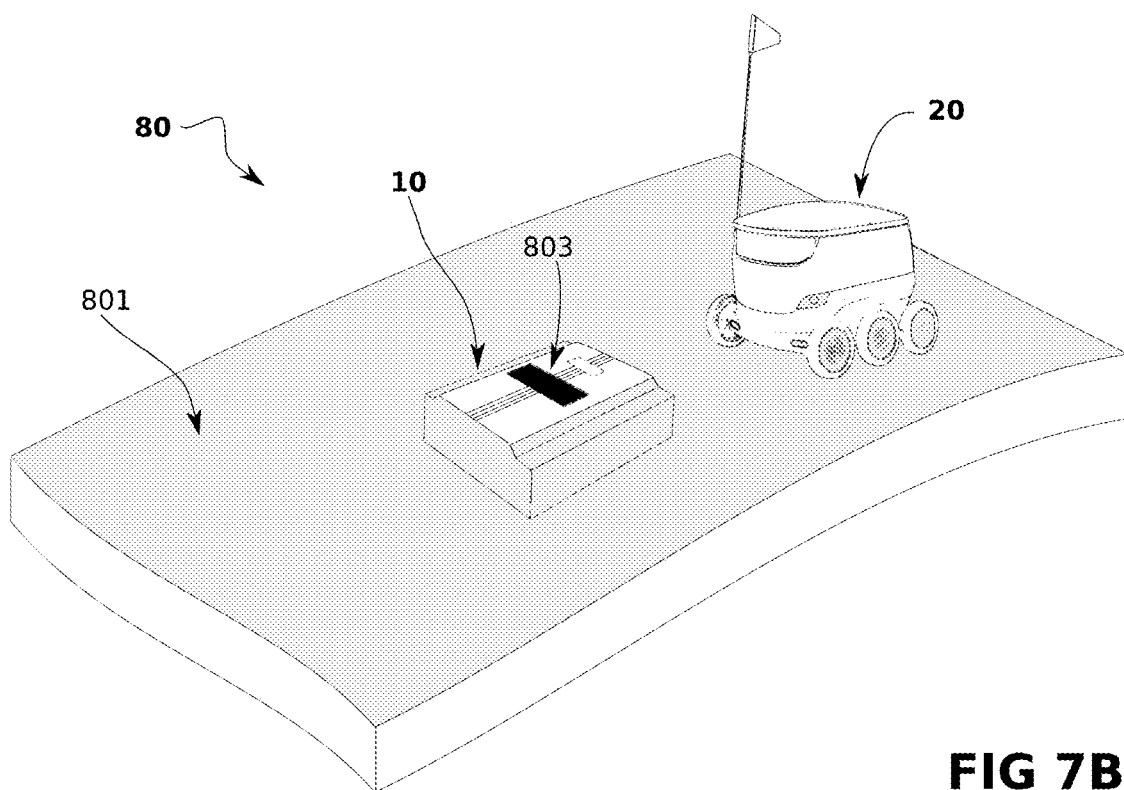
FIG. 7B shows an embodiment of a hub comprising a mobile robot and a battery station wherein said battery station is integrated in the floor of the hub.

Referring now to FIG. 7B, a system comprising a station 10 integrated in the floor 801 of a hub 80 is shown. The hub 80 may be a building 80 comprising at least one station 10, preferably a plurality of stations 10, and/or a mobile vehicle 80, comprising at least one station 10, preferably a plurality of stations 10. In some preferred embodiments, the hub 80 can comprise a warehouse and/or a micro warehouse. In other embodiments, the hub 80 can comprise part of a shop and/or a business reserved for servicing mobile robots 20. In yet other embodiments, the hub 80 can comprise a storage container such a standard transportation container that can be referred to as a hub 80 for mobile robots 20. Such a hub 80 can then serve to service, maintain, load with items to deliver and/or store one or more robots 20. In other embodiments, the hub 80 can comprise a vehicle such as a truck that can itself move around, and serve as a hub 80 for one or more mobile robots 20.

The floor 801 of such hub 80 comprises at least one hub floor opening 803 adapted to expose the top of the station 10, comprising the identification element 107, the surface opening 109 and the horizontal lines 105 of the station 10. In the system depicted in FIG. 7B the robot 20 does not need to comprise means of climbing the station 10. In the system depicted in FIG. 7B the station 10 does not need to comprise the ramp 103. This implementation of a system comprising at least one mobile robot 20 and at least one station 10 integrated in the floor 801 of the hub 80, results in a more practical implementation, by preserving space and by simplifying the process of battery swapping since the means for climbing and descending the station 10 are required. Further, in another embodiment of such a system, the battery load/unload position 115 may also be integrated in the floor 801 of the hub 80. This embodiment can further simplify the station 10, since the means for supporting the weight of robot 20 are not required for station 10. Since the battery load/unload position 115 can be integrated in the floor 801 of hub 80, robot 20 will not weight in the station 10 in any phase of the battery swapping process, but instead will be weighting on the floor 801. The floor 801 can be already adapted to support the weight of robot 20. In another embodiment of such a system a floor lid (not shown) can be integrated in the floor 801 of hub 80, in the positions where stations 10 can be located. The floor lid can assume a closed position and an open position. In a closed position the floor lid lies horizontally on the floor 801. In an open position the floor lid can allow an operator to access the station 10 in case of possible system hazards.

Figure 7C:
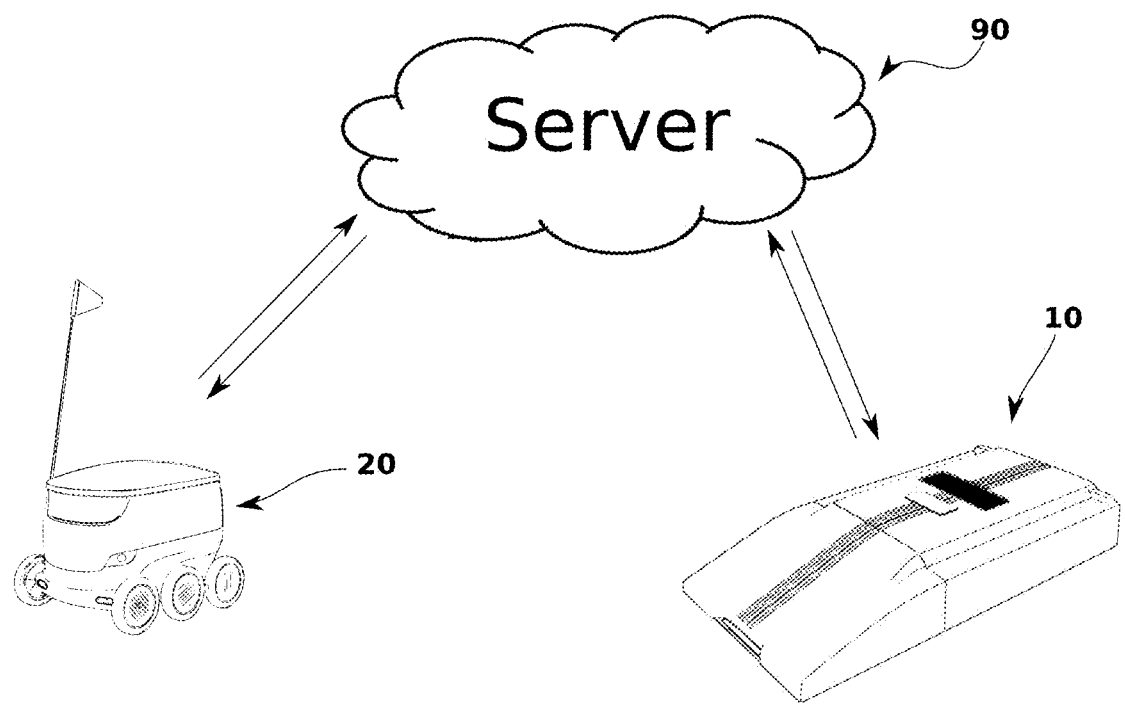
FIG. 7C shows an embodiment of a system comprising a mobile robot, a battery station and a server.

Referring now to FIG. 7C, an embodiment of a system comprising at least one mobile robot 20, at least one station 10 and at least one server 90 is shown. The mobile robot 20, station 10 and server 90 can be adapted to comprise communication means between each other. The server 90 can monitor the operation of mobile robot 20 and station 10. The server 90 may also assume control of the operation of robot 20 and station 10. Server 90 can comprise knowledge of the operation of robot 20 and station 10 such as: positions of robot 20 and station 10, battery level of battery 400 of robot 20, battery levels positioned in the charging units 132 of station 10, status of charging units 132 of station 10 if they can be free or not etc. In such an embodiment, the server 90 can communicate to robot 20 information related to the stations 10 comprised by the system, said information including: ID of nearest station 10, ID of the nearest station 10 that comprise free charging units 132, status of the chosen station 10 whether it is being used by another robot 20 or not, distance to the chosen station 10, directions to reach the chosen station 10, when to start the battery swapping procedure, when the battery charging procedure is completed etc. The robot 20 can read the identification element 107 of station 10, and can communicate to the station 10 ID to the server 90, indicating that station with that ID is being used by it. Station 10 may communicate to server 90 the status of the process of battery swapping procedure indicating when the procedure is completed. Station 10 can communicate to server 90 the status of its charging units 132, the charging level of the batteries contained in the charging units 132 etc. Thus server 90 can manage the operation of such a system by means of communication between server 90, robot 20 and station 10.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be accidental. That is, unless otherwise specified or unless clear to the skilled person, the order in which steps are recited may be accidental. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

We claim:

1. A battery station, for use by at least one mobile robot, the battery station comprising:
   (a) a battery charging unit configured to perform at least one of:
      (i) holding at least one battery, and/or
      (ii) charging at least one battery; and
   (b) a battery load/unload position configured to facilitate loading and unloading of a battery to and from a mobile robot; and
   (c) a battery handling mechanism configured to operate on a reaching range, said reaching range comprising:
      (i) the battery of the mobile robot positioned in the battery load/unload position, and
      (ii) the battery charging unit; and
   (d) a localization element configured to at least one of detect and locate at least one of the following:
      (i) at least one battery of the mobile robot, wherein the mobile robot is positioned in the battery load/unload position, and/or
      (ii) at least one battery positioned in the battery charging unit; and
   (e) a guiding element configured to indicate to the at least one mobile robot the battery load/unload position.

2. The battery station according to claim 1, wherein the localization element comprises at least one sensor device and wherein the sensor device comprises at least one of:
   (a) at least one inductive sensor, and/or
   (b) at least one capacitive sensor.

3. The battery station according to claim 1, wherein the localization element is configured to locate the at least one battery with a precision of at least 2 mm.

4. The battery station according to claim 1, wherein the battery station is configured to at least one of:
  (a) grab a battery from at least one of:
    (i) the mobile robot positioned in the battery load/unload position, and/or
    (ii) the charging unit; and/or
  (b) transport a battery from a mobile robot to the battery charging unit and/or from the battery charging unit to the mobile robot, said mobile robot positioned in the battery load/unload position, and/or from the charging unit to another charging unit.

5. The battery station according to claim 1, wherein the battery handling mechanism comprises a battery grabber element configured to grab the battery positioned within the reaching range of the battery handling mechanism.

6. The battery station according to claim 5, wherein the battery grabber element further comprises at least one flexural joint configured to increase a tolerable misalignment between the battery handling mechanism and the battery said tolerable misalignment comprising at least one of the following:
  (a) maximum incorrect positioning of the battery relative to the battery station such that the battery station is able to load and unload the battery, and/or
  (b) maximum incorrect positioning of the battery station relative to the battery such that the battery station is able to load and unload the battery.

7. The battery station according to claim 5, wherein the battery handling mechanism further comprises at least one actuator, configured to move the battery grabber element to any location within reaching range of the battery handling mechanism.

8. The battery station according to claim 1, wherein the battery station further comprises at least one wheel configured to facilitate movement of battery station.

9. A system for swapping and/or charging at least one battery comprising:
  at least one mobile robot comprising at least one battery; and
  at least one battery station, for use by the at least one mobile robot,
  wherein the at least one battery station comprises:
    (a) a battery charging unit configured to perform at least one of:
      (i) holding at least one battery, and/or
      (ii) charging at least one battery; and
    (b) a battery load/unload position configured to facilitate loading and unloading of a battery to and from the at least one mobile robot; and
    (c) a battery handling mechanism configured to operate on a reaching range, said reaching range comprising:
      (i) at least one battery of a mobile robot positioned in the battery load/unload position, and
      (ii) the battery charging unit;
    (d) a localization element configured to at least one of detect and locate at least one of:
      (i) at least one battery of a mobile robot positioned in the battery load/unload position, and/or
      (ii) at least one battery positioned in the battery charging unit; and
    (e) a guiding element configured to indicate to the at least one mobile robot the battery load/unload position.

10. The system according to claim 9, wherein the at least one mobile robot is configured to seek service from the at least one battery station when at least one of the following occurs:
  (a) an energy level of the at least one battery of the at least one mobile robot is below a threshold level, said threshold level being programmable on the at least one mobile robot, and/or
  (b) a service life of the at least one battery of the at least one mobile robot is over as it has reached a predefined number of charge-discharge cycles, and/or
  (c) the at least one battery of the at least one mobile robot is malfunctioning.

11. The system according to claim 9, wherein the at least one mobile robot further comprises at least one of optical sensor and camera, configured to sense the at least one guiding element of the battery station.

12. The system according to claim 9, wherein the at least one mobile robot and the at least one battery station are configured to communicate with each other so as to facilitate the battery swapping and/or charging process of the at least one battery of the at least one mobile robot by the at least one battery station.

13. The system according to claim 9, wherein the system further comprises a server and wherein:
  (a) the at least one mobile robot is configured to communicate with the server so as to facilitate the battery swapping and/or charging process of the at least one battery of the at least one mobile robot by the at least one battery station, and
  (b) the at least one battery station is configured to communicate with the server so as to facilitate the battery swapping and/or charging process of the at least one battery of the at least one mobile robot by the at least one battery station.

14. The system according to claim 9, wherein the system further comprises a hub and wherein the hub comprises at least one of the at least one battery station and the hub is configured to serve, house, and/or maintain at least one of the at least one mobile robot.

15. A method for swapping and/or charging at least one battery of a mobile robot, the method comprising:
  (a) providing at least one battery station comprising at least one station battery holder, and
    providing at least one mobile robot comprising at least one battery and at least one robot battery holder;
  (b) positioning the at least one mobile robot in a battery load/unload position, wherein the at least one battery station comprises a guiding element configured to indicate to the at least one mobile robot the battery load/unload position;
  (c) locating the at least one battery of the at least one mobile robot;
  (d) unloading a discharged battery from the at least one robot battery holder of the at least one mobile robot;
  (e) transporting and loading the discharged battery to an unoccupied station battery holder of the at least one battery station;
  (f) unloading a charged battery from at least one occupied station battery holder of the at least one battery station; and
  (g) transporting and loading the charged battery to the at least one robot battery holder of the at least one mobile robot.

16. The method according to claim 15, wherein the at least one battery station comprises a localization element configured to at least one of detect and locate a localization target, the localization target comprising at least one of:
  (h1) the at least one mobile robot positioned in the battery load/unload position, and/or (h2) the at least one battery of the at least one mobile robot positioned in the battery load/unload position.

17. A method for swapping and/or charging at least one battery of a mobile robot, the method comprising:
(a) providing at least one battery station comprising at least one station battery holder, and
providing at least one mobile robot comprising at least one battery and at least one robot battery holder;
(b) positioning the at least one mobile robot in a battery load/unload position;
(c) locating the at least one battery of the at least one mobile robot;
(d) unloading a discharged battery from the at least one robot battery holder of the at least one mobile robot;
(e) transporting and loading the discharged battery to an unoccupied station battery holder of the at least one battery station;
(f) unloading a charged battery from at least one occupied station battery holder of the battery station; and
(g) transporting and loading the charged battery to the at least one robot battery holder of the at least one mobile robot;
wherein the at least one battery station comprises a localization element configured to at least one of detect and locate a localization target, the localization target comprising at least one of:
the at least one mobile robot positioned in the battery load/unload position, and/or the at least one battery of the at least one mobile robot positioned in the battery load/unload position,
wherein the process of locating the localization target comprises:
(x1) the localization element scanning a part of the at least one mobile robot surrounding the at least one battery attached to the at least one mobile robot by emitting electromagnetic waves,
(x2) the localization element continuously measuring changes in the emitted electromagnetic waves,
(x3) the localization element detecting the changes of the emitted electromagnetic waves caused by presence of the localization target within a sensing range, and
(x4) the localization element calculating the position of the localization target with a precision of at least 2 mm.

18. The method according to claim 15, wherein the battery handling mechanism comprises a battery grabber element and wherein acts (d) and/or (f) respectively comprise:
(a) the battery handling mechanism positioning the battery grabber element in a battery holder, wherein the battery holder refers to the at least one robot battery holder and/or to the at least one occupied station battery holder,
(b) the battery grabber element grabbing the battery positioned in the battery holder,
(c) the battery grabber element unlatching the battery from a fixing element of the battery holder, and
(d) the battery handling mechanism moving the battery grabber element holding the battery away from the battery holder.

19. The method according to claim 15, wherein the battery handling mechanism comprises a battery grabber element and wherein acts (e) and/or (g) comprises:
(a) the battery handling mechanism positioning the battery grabber element holding a battery in a battery holder, wherein the battery holder refers to the at least one unoccupied station battery holder and/or to the at least one robot battery holder,
(b) the battery grabber element latching the battery in a fixing element of the battery holder,
(c) the battery grabber element releasing the battery, and
(d) the battery handling mechanism moving the battery grabber element away from the battery holder.

20. The method according to claim 15, further comprising the battery station initiating a charging process of at least one discharged battery in a charging unit of the at least one battery station.

21. The battery station according to claim 1, wherein the guiding element comprises at least one optical marker on a surface of the battery station.

22. The battery station according to claim 21, wherein the guiding element comprises at least one straight line, each straight line configured to direct the mobile robot towards the battery load/unload position.

23. The system according to claim 9, wherein the guiding element comprises at least one optical marker on a surface of the at least one battery station.

24. The system according to claim 23, wherein the guiding element comprises at least one straight line, each straight line configured to direct the mobile robot towards the battery load/unload position.

25. A battery station, for use by at least one mobile robot, the battery station comprising:
(a) a plurality of battery charging units, each configured to hold and/or charge at least one battery;
(b) a battery load/unload position configured to facilitate loading and unloading of a battery to and from a mobile robot; and
(c) a battery handling mechanism configured to operate on a reaching range, said reaching range comprising:
(i) the battery of the mobile robot positioned in the battery load/unload position, and
(ii) the plurality of battery charging units; and
(d) a localization element configured to at least one of detect and locate at least one of the following:
(i) at least one battery of the mobile robot, wherein the mobile robot is positioned in the battery load/unload position, and/or
(ii) at least one battery positioned in a particular charging unit of the plurality of battery charging units; and
(e) wherein the battery handling mechanism comprises a battery grabber element configured to grab a battery positioned within the reaching range of the battery handling mechanism, and
wherein the battery handling mechanism further comprises at least one actuator, configured to move the battery grabber element to any location within reaching range of the battery handling mechanism.

26. A system for swapping and/or charging at least one battery comprising:
at least one mobile robot comprising at least one battery; and
at least one battery station, for use by the at least one mobile robot, the at least one battery station comprising:
(a) a plurality of battery charging units, each configured to hold and/or charge at least one battery; and
(b) a battery load/unload position configured to facilitate loading and unloading of a battery to and from the at least one mobile robot;
(c) a battery handling mechanism configured to operate on a reaching range, said reaching range comprising:

(i) at least one battery of the mobile robot positioned in the battery load/unload position, and
(ii) the plurality of battery charging units;
(d) a localization element configured to at least one of detect and locate at least one of the following:
(i) at least one battery of the mobile robot positioned in the battery load/unload position, and/or
(ii) at least one battery positioned in a particular charging unit of the plurality of battery charging units; and
(e) wherein the battery handling mechanism comprises a battery grabber element configured to grab a battery positioned within the reaching range of the battery handling mechanism and
wherein the battery handling mechanism further comprises at least one actuator, configured to move the battery grabber element to any location within reaching range of the battery handling mechanism.

* * * * *